(12) United States Patent
Yoneda

(10) Patent No.: US 10,204,925 B2
(45) Date of Patent: Feb. 12, 2019

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Seiichi Yoneda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/868,821

(22) Filed: Sep. 29, 2015

(65) Prior Publication Data
US 2016/0099258 A1    Apr. 7, 2016

(30) Foreign Application Priority Data

Oct. 6, 2014 (JP) .................................. 2014-205643

(51) Int. Cl.
| | | |
|---|---|---|
| *H01L 29/10* | (2006.01) | |
| *H01L 27/12* | (2006.01) | |
| *H01L 29/786* | (2006.01) | |

(52) U.S. Cl.
CPC ........ *H01L 27/124* (2013.01); *H01L 27/1225* (2013.01); *H01L 27/1255* (2013.01); *H01L 29/78648* (2013.01)

(58) Field of Classification Search
CPC ......................... H01L 27/124; H01L 27/1255; H01L 27/1225
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| | | |
|---|---|---|
| CN | 001574079 A | 2/2005 |
| CN | 102693755 A | 9/2012 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Nishath Yasmeen
(74) *Attorney, Agent, or Firm* — Fish & Richardson P.C.

(57) ABSTRACT

To provide a novel semiconductor device or a semiconductor device capable of operating at high speed. The semiconductor device includes a plurality of circuits each having a function of storing data and a wiring EL. The plurality of circuits each include a first transistor, a second transistor, and a capacitor. One of a source and a drain of the first transistor is electrically connected to a gate of the second transistor and the capacitor. The first transistor includes an oxide semiconductor in a channel formation region. The wiring EL has a function of a back-gate of the first transistor. A potential for selecting the plurality of circuits is supplied to the wiring EL. Thus, data stored in the plurality of circuits is erased.

16 Claims, 26 Drawing Sheets

(56) References Cited

U.S. PATENT DOCUMENTS

| | | | |
|---|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,358,530 B2 | 1/2013 | Kamata |
| 8,421,081 B2 | 4/2013 | Kato et al. |
| 8,441,009 B2 | 5/2013 | Ieda |
| 8,541,846 B2 | 9/2013 | Saito |
| 8,604,476 B2 | 12/2013 | Kato et al. |
| 8,614,916 B2 | 12/2013 | Nagatsuka et al. |
| 8,659,941 B2 | 2/2014 | Kamata et al. |
| 8,709,889 B2 | 4/2014 | Saito |
| 8,878,174 B2 | 11/2014 | Sakata |
| 8,891,285 B2 | 11/2014 | Takemura |
| 9,029,929 B2 | 5/2015 | Saito |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0240305 A1 | 12/2004 | Kato |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0055896 A1* | 3/2010 | Abe ............... B82Y 10/00 438/623 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0165772 A1* | 7/2010 | Avci ............... G11C 11/404 365/218 |
| 2011/0122673 A1 | 5/2011 | Kamata et al. |
| 2011/0156025 A1* | 6/2011 | Shionoiri ......... H01L 27/115 257/43 |
| 2011/0273419 A1* | 11/2011 | Park ............... G09G 3/30 345/211 |
| 2012/0051118 A1 | 3/2012 | Yamazaki et al. |
| 2012/0112191 A1* | 5/2012 | Kato ............... H01L 21/84 257/57 |
| 2012/0236634 A1 | 9/2012 | Matsubayashi |
| 2012/0313923 A1* | 12/2012 | Minami ............ G09G 3/3233 345/212 |
| 2014/0014955 A1 | 1/2014 | Saito |
| 2014/0374747 A1 | 12/2014 | Kurokawa |
| 2015/0063005 A1 | 3/2015 | Takemura |

FOREIGN PATENT DOCUMENTS

| | | |
|---|---|---|
| CN | 103081092 A | 5/2013 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-011492 A | 1/2005 |
| JP | 2011-135055 A | 7/2011 |
| JP | 2012-069932 A | 4/2012 |
| JP | 2012-212499 A | 11/2012 |
| JP | 2012-256400 A | 12/2012 |

(56) References Cited

FOREIGN PATENT DOCUMENTS

| JP | 2014-197444 A | 10/2014 |
|---|---|---|
| KR | 2012-0106642 A | 9/2012 |
| KR | 2012-0123266 A | 11/2012 |
| KR | 2013-0107285 A | 10/2013 |
| WO | WO-2004/114391 | 12/2004 |
| WO | WO-2011/065183 | 6/2011 |
| WO | WO-2012/026503 | 3/2012 |

OTHER PUBLICATIONS

Asaoka.Y et al., "29.1:Polarizer-Free Reflective LCD Combined With Ultra Low-Power Driving Technglogy", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No.2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 13, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "SPINEL,YbFe2O4, and Yb2Fe3O7 Types of Structures for Compounds in The In2O3 and Sc2Os—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

(56) References Cited

OTHER PUBLICATIONS

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT—LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2015/057372) dated Dec. 28, 2015.
Written Opinion (Application No. PCT/IB2015/057372) dated Dec. 28, 2015.

* cited by examiner

FIG. 11
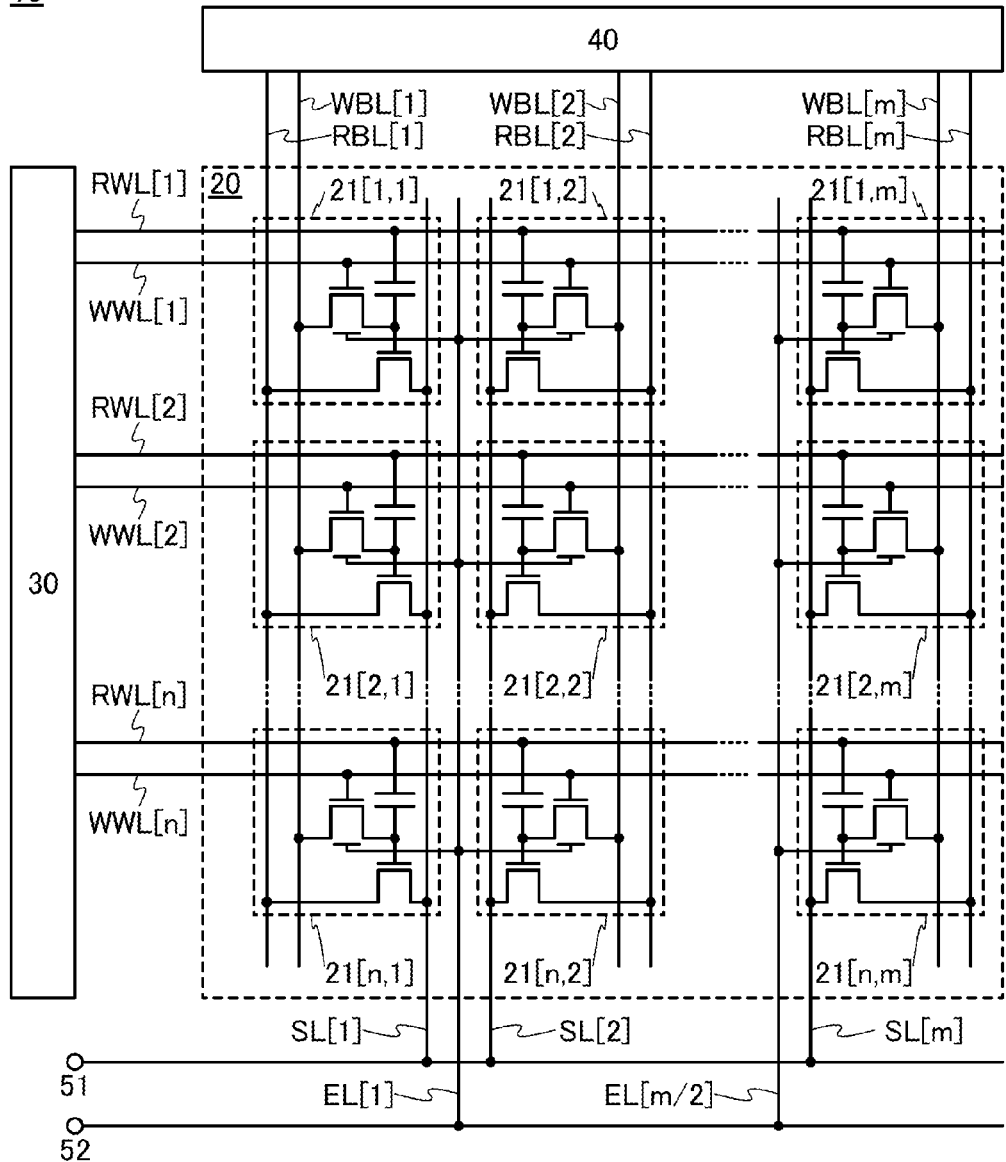
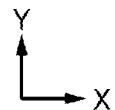

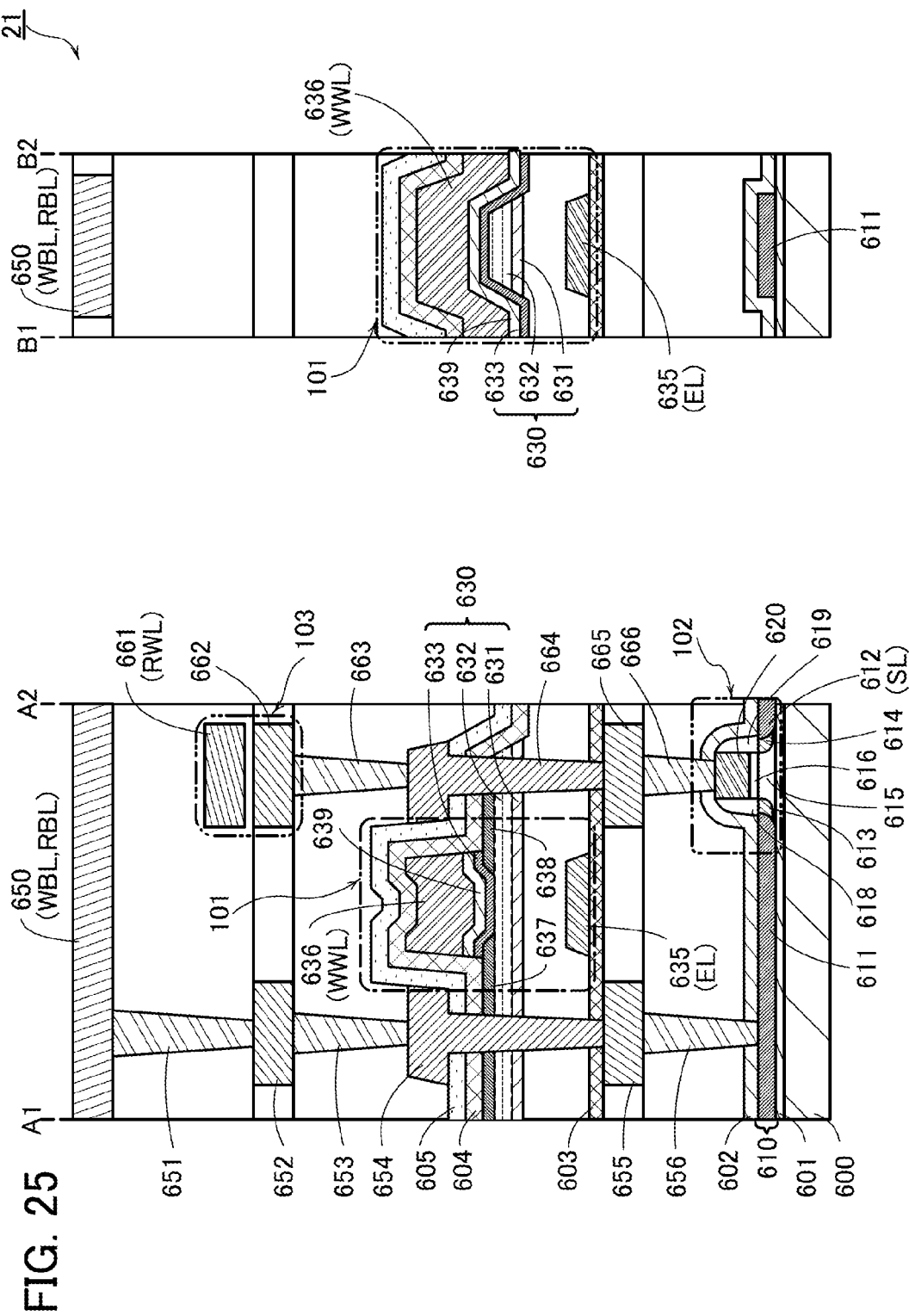

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Another embodiment of the present invention relates to a semiconductor device, a display device, a light-emitting device, a power storage device, a memory device, or a driving method or manufacturing method thereof.

BACKGROUND ART

Patent Document 1 describes a semiconductor device that includes a transistor using an oxide semiconductor film and a transistor using single crystal silicon. According to Patent Document 1, the transistor using an oxide semiconductor film has an extremely low off-state current.

REFERENCE

Patent Document

[Patent Document 1] Japanese Published Patent Application No. 2012-256400

DISCLOSURE OF INVENTION

An object of one embodiment of the present invention is to provide a novel semiconductor device. Another object of one embodiment of the present invention is to provide a semiconductor device capable of operating at high speed. Another object of one embodiment of the present invention is to provide a semiconductor device with low power consumption. Another object of one embodiment of the present invention is to provide a highly reliable semiconductor device. Another object of one embodiment of the present invention is to provide a versatile semiconductor device. Another object of one embodiment of the present invention is to provide a memory device capable of erasing data at high speed.

One embodiment of the present invention does not necessarily achieve all the objects listed above and only needs to achieve at least one of the objects. The description of the above objects does not preclude the existence of other objects. Other objects will be apparent from and can be derived from the description of the specification, the drawings, the claims, and the like.

A semiconductor device of one embodiment of the present invention includes a plurality of circuits having a function of storing data and a wiring. The plurality of circuits each include a first transistor, a second transistor, and a capacitor. One of a source and a drain of the first transistor is electrically connected to a gate of the second transistor and a capacitor. The first transistor includes an oxide semiconductor in a channel formation region. The wiring has a function of a back-gate of the first transistor. A potential for selecting the plurality of circuits is supplied to the wiring so that data stored in the plurality of circuits is erased.

Furthermore, in the semiconductor device of one embodiment of the present invention, data may be erased by supplying a potential to the wiring in a period in which the potential of the other of the source and the drain of the first transistor is at a high level or a low level.

Furthermore, the semiconductor device of one embodiment of the present invention may include an inverter and a resistor. The wiring may be electrically connected to the inverter and the resistor.

Furthermore, in the semiconductor device of one embodiment of the present invention, the wiring may include a portion overlapping with a wiring having a function of the gate of the first transistor.

Furthermore, in the semiconductor device of one embodiment of the present invention, the plurality of circuits may be memory cells of an auxiliary memory device.

Furthermore, in the semiconductor device of one embodiment of the present invention, the plurality of circuits may be pixel circuits of a display device.

An electronic device of one embodiment of the present invention includes the semiconductor device and a display portion, a microphone, a speaker, or an operation key.

According to one embodiment of the present invention, a novel semiconductor device can be provided. According to one embodiment of the present invention, a semiconductor device capable of operating at high speed can be provided. According to one embodiment of the present invention, a semiconductor device with low power consumption can be provided. According to one embodiment of the present invention, a highly reliable semiconductor device can be provided. According to one embodiment of the present invention, a versatile semiconductor device can be provided. According to one embodiment of the present invention, a memory device capable of erasing data at high speed can be provided.

Note that the description of these effects does not preclude the existence of other effects. In one embodiment of the present invention, there is no need to achieve all the effects. Other effects will be apparent from and can be derived from the description of the specification, the drawings, the claims, and the like.

BRIEF DESCRIPTION OF DRAWINGS

In the accompanying drawings:

FIG. 11 illustrates a structure example of a semiconductor device;

FIG. 25 illustrates a structure example of a semiconductor device; and

BEST MODE FOR CARRYING OUT THE INVENTION

Figure 1A:
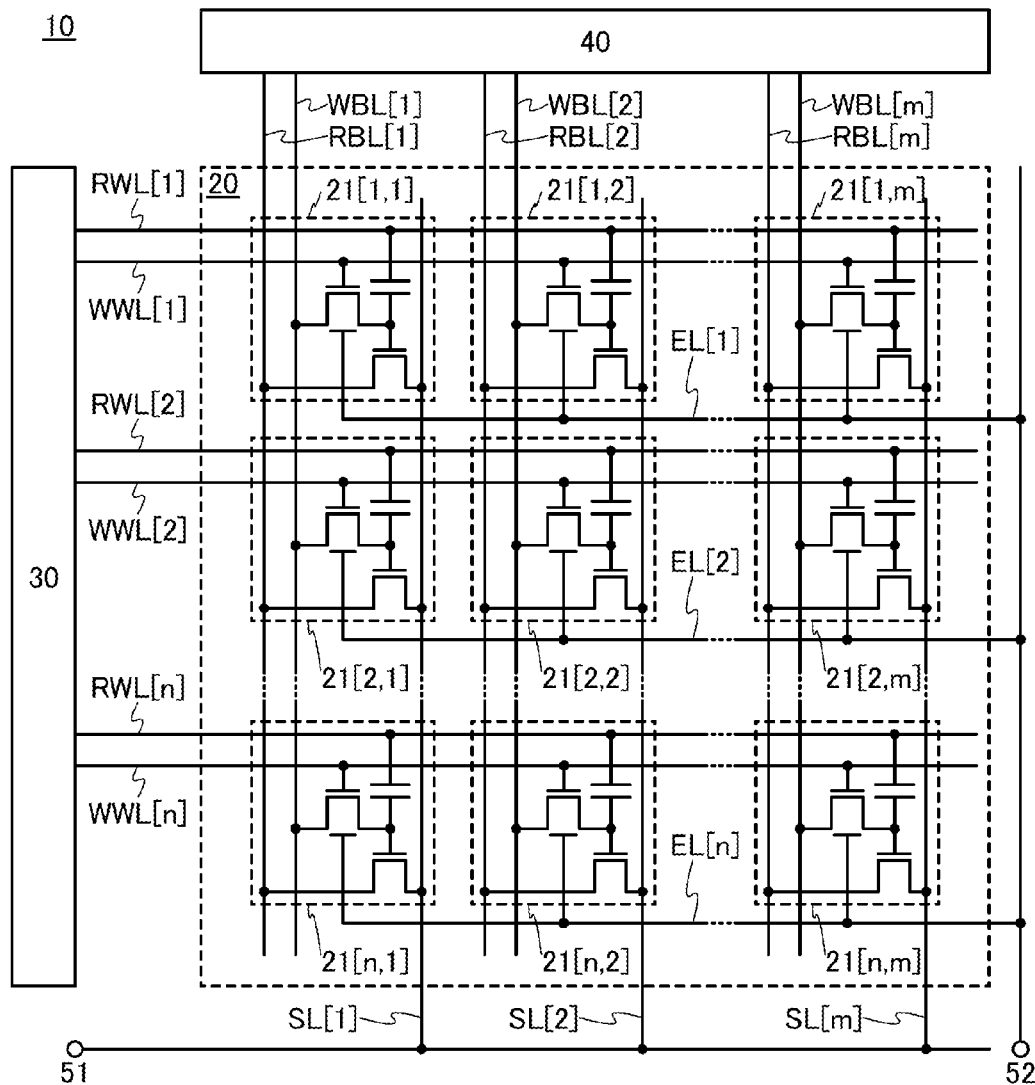
FIGS. 1A and 1B each illustrate a structure example of a semiconductor device.

Embodiments of the present invention will be described below in detail with reference to the accompanying drawings. Note that the present invention is not limited to the following description and it is easily understood by those skilled in the art that the mode and details can be variously changed without departing from the scope and spirit of the present invention. Thus, the present invention should not be construed as being limited to the description in the following embodiments.

One embodiment of the present invention includes, in its category, devices including an integrated circuit, such as a radio frequency (RF) tag and a display device. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, common reference numerals are used for the same portions in different drawings in some cases.

For example, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, that is, the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. In the case where a signal output from X is transmitted to Y even when another circuit is interposed between X and Y, for example, X and Y are functionally connected. Note that the case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another element or another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Even when independent components are electrically connected to each other in the drawing, one component has functions of a plurality of components in some cases. For example, when part of a wiring also functions as an electrode, one conductive film has functions of the wiring and the electrode. Thus, "electrical connection" in this specification includes in its category such a case where one conductive film has functions of a plurality of components.

Embodiment 1

In this embodiment, structure examples of a semiconductor device of one embodiment of the present invention are described.

Structure Example

FIG. 1A illustrates a structure example of a semiconductor device 10 of one embodiment of the present invention. The semiconductor device 10 can also be used as a memory device. The semiconductor device 10 includes a circuit 20, a circuit 30, and a circuit 40.

The circuit 20 includes a plurality of circuits 21. The circuit 21 has a function of storing predetermined data. Here, the circuit 20 includes the circuits 21 (the circuits 21[1,1] to 21[n,m]) arranged in a matrix of n rows and m columns (n and m are natural numbers). Note that the circuits 21 can be used as memory cells, and the circuit 20 can be used as a cell array including a plurality of memory cells.

The circuit 30 is connected to a plurality of wirings WWL (wirings WWL[1] to WWL[n]) and a plurality of wirings RWL (wirings RWL[1] to RWL[n]). The wiring WWL[i] (i is a natural number satisfying 1≤i≤n) is connected to the circuits 21[i,1] to 21[i,m]. The wiring RWL[i] is connected to the circuits 21[i,1] to 21[i,m].

The circuit 30 is a driver circuit having a function of supplying a signal for selecting a predetermined circuit 21. Specifically, the circuit 30 has a function of supplying a signal (a write word signal) for selecting the circuit 21 to which data is to be written, to a predetermined wiring WWL. The circuit 30 also has a function of supplying a signal (a read word signal) for selecting the circuit 21 from which data is read, to a predetermined wiring RWL. As described above, the circuit 30 functions as a row selection driver circuit.

The circuit 40 is connected to a plurality of wirings WBL (wirings WBL[1] to WBL[m]) and a plurality of wirings RBL (wirings RBL[1] to RBL[m]). The wiring WBL[j] (j is a natural number satisfying 1≤j≤m) is connected to the circuits 21[1,j] to 21[n,j]. The wiring RBL[j] is connected to the circuits 21[1,j] to 21[n,j].

The circuit 40 is a driver circuit which has functions of controlling writing data to the circuits 21 and reading data stored in the circuits 21. Specifically, the circuit 40 has a function of supplying a potential (a write potential) corresponding to data written to the circuit 21, to the wiring WBL. The circuit 40 has a function of reading data which is stored in the circuit 21 from a potential (a read potential) of the wiring RBL, which corresponds to data stored in the circuit 21. The circuit 40 has a function of precharging the wiring RBL to a predetermined potential. As described above, the circuit 30 functions as a column selection driver circuit.

The circuits 21 are each connected to any one of the plurality of wirings SL (the wirings SL[1] to SL[m]). Specifically, the circuits 21[j,1] to 21[j,m] are connected to the wiring SL[j]. As illustrated in FIG. 1A, all of the wirings SL are connected to a terminal 51, and a predetermined potential is supplied from the terminal 51 to all of the wirings SL. Note that the plurality of wirings SL may be formed using one wiring connected to the terminal 51, or each of the plurality of wirings SL may be connected to a different wiring connected to the terminal 51.

According to one embodiment of the present invention, each of the circuits 21[1,1] to 21[n,m] is connected to a terminal 52 through any one of the plurality of wirings EL (the wirings EL[1] to EL[n]). Here, the circuits 21[i,1] to 21[i,n] are connected to the wiring EL[i]. The wirings EL are supplied with a signal (an erase signal) for erasing data stored in the circuits 21 from the terminal 52. When an erase signal is supplied to the wirings EL, data stored in all of the plurality of circuits 21 connected to the wirings EL is erased. Thus, all data stored in the circuits 21[1,1] to 21[n,m] can be erased at one time in a short period without an operation in which the circuit 30 is driven and data is written to the circuits 21 sequentially.

Note that the plurality of wirings EL may be formed using one wiring connected to the terminal 52, or each of the plurality of wirings EL may be connected to a different wiring connected to the terminal 52.

Figure 1B:
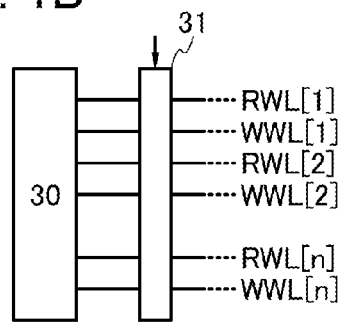

Note that instead of supplying an erase signal to the wirings EL, a write word signal for selecting the circuits 21 may be supplied to all of the wirings WWL[1] to WWL[n]. In that case, as illustrated in FIG. 1B, between the circuit 30 and the wirings WWL[1] to WWL[n], a circuit 31 having a function of controlling a signal output from the circuit 30 to the wirings WWL and the wirings RWL is provided, for example. When a control signal is input to the circuit 31, a write word signal is supplied to the wirings WWL[1] to WWL[n] regardless of the output of the circuit 30, so that all of the circuits 21 are selected. Thus, data stored in the plurality of circuits 21 can be erased. Note that the circuit 31 can be formed using an OR circuit including an input terminal to which the above control signal is input and an input terminal to which a signal from the circuit 30 is input, or the like. With such a structure, the wirings EL can be omitted.

Figure 2A:
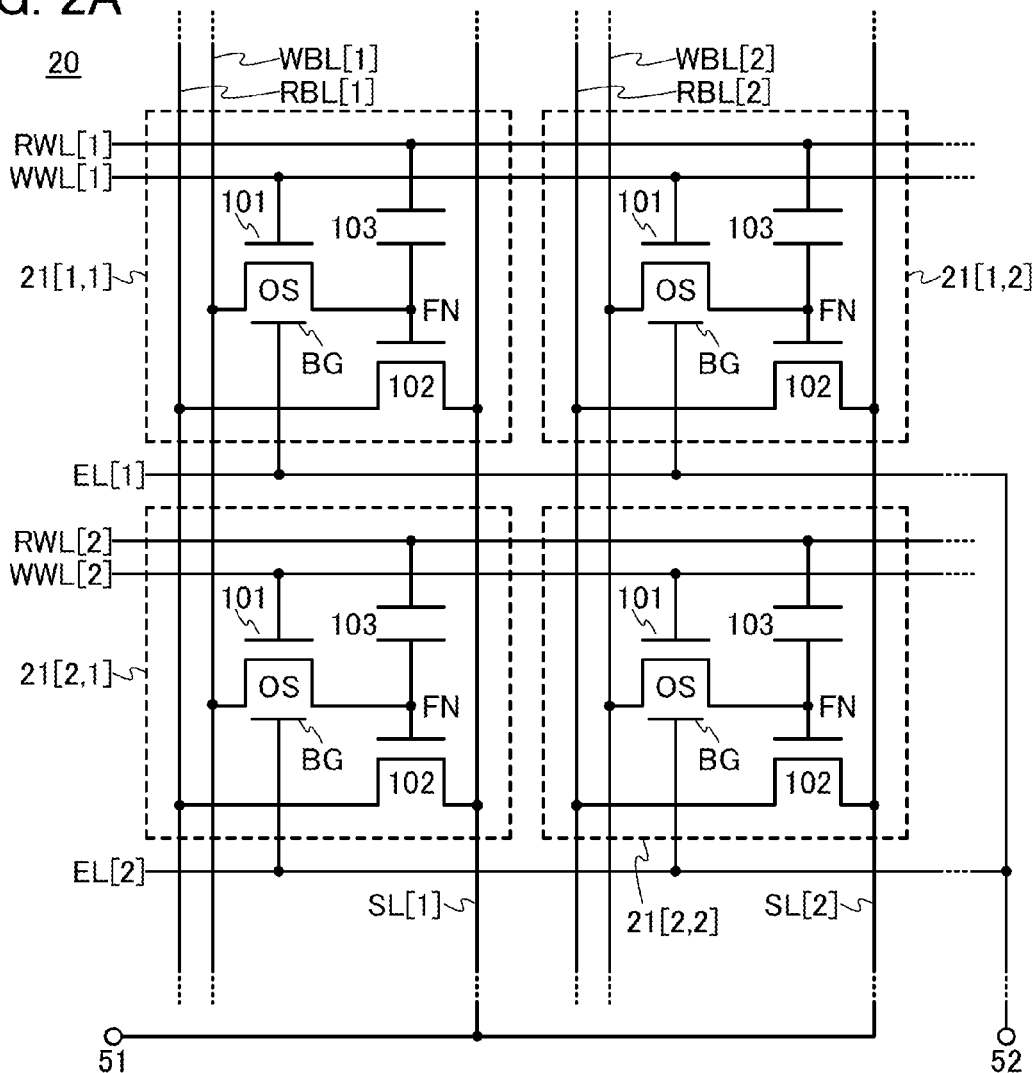
FIGS. 2A and 2B are circuit diagrams each illustrating a configuration example of a circuit.

A configuration example of the circuit 21 is shown in FIG. 2A. Although an example where the circuits 21[1,1], 21[1,2], 21[2,1], and 21[2,2] are provided is described here, a similar structure can be applied to the other circuits 21.

First, a circuit configuration of the circuits 21 is described. The circuits 21 each include a transistor 101, a transistor 102, and a capacitor 103. A gate of the transistor 101 is connected to the wiring WWL, one of a source and a drain of the transistor 101 is connected to a gate of the transistor 102, and the other of the source and the drain of the transistor 101 is connected to the wiring WBL. One of a source and a drain of the transistor 102 is connected to the wiring RBL, and the other of the source and the drain of the transistor 102 is connected to the wiring SL. One electrode of the capacitor 103 is connected to the gate of the transistor 102, and the other electrode of the capacitor 103 is connected to the wiring RWL. Here, a node where the one of the source and the drain of the transistor 101, the gate of the transistor 102, and the one electrode of the capacitor 103 are connected to one another is referred to as a node FN. Although an example where the transistors 101 and 102 are n-channel transistors is described here, each of the transistors 101 and 102 may be an n-channel transistor or a p-channel transistor. As the capacitor 103, a capacitive element may be used or parasitic capacitance between the wiring RWL and the node FN may be used. Other configuration examples of the circuit 21 will be described in Embodiment 3 (FIGS. 16A to 16E and the like).

Note that a "source" of a transistor in this specification and the like means a source region that is part of a semiconductor functioning as an active layer or a source electrode connected to the semiconductor. Similarly, a "drain" of the transistor means a drain region that is part of the semiconductor or a drain electrode connected to the semiconductor. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Next, writing and holding of data in the circuit 21 will be described. First, the potential of the wiring WWL is set to a potential at which the transistor 101 is turned on, so that the transistor 101 is turned on. Thus, a potential of the wiring WBL (a write potential) is supplied to the node FN, and a predetermined charge is applied to the node FN (data writing). Here, the node FN is supplied with a high-level or low-level potential. After that, the potential of the wiring WWL is set to a potential at which the transistor 101 is turned off, so that the transistor 101 is turned off. This makes the node FN floating, and the potential of the node FN is held (data holding). Note that the node FN can be supplied with a potential of three or more values. In other words, the circuit 21 can store multi-level data of three or more values.

Here, the transistor 101 has a function of holding a charge held in the node FN by being turned off. Therefore, it is preferable that the off-state current of the transistor 101 be low. The low off-state current of the transistor 101 enables a reduction in leakage of the charge held in the node FN through the transistor 101. Thus, data stored in the circuit 21 can be held for a long time.

A transistor in which a channel formation region includes a semiconductor with a wider bandgap and lower intrinsic carrier density than silicon or the like can have an extremely low off-state current and thus is preferably used as the transistor 101. Examples of such a semiconductor material include an oxide semiconductor having a band gap greater than or equal to twice the band gap of silicon. The off-state current of the transistor including an oxide semiconductor in a channel formation region (hereinafter also referred to as an OS transistor) can be extremely lower than that of a transistor formed using a material other than an oxide semiconductor, such as silicon. The use of the OS transistor as the transistor 101 allows data written to the circuit 21 to be held for an extremely long time without any refresh operation. Therefore, the circuit 21 can be used for a memory cell in an auxiliary memory device, in addition to a memory cell in a main memory device. In the drawing, a transistor indicated by "OS" is an OS transistor. The OS transistor will be described in detail in Embodiment 5.

Next, reading of data from the circuit 20 is described. When a predetermined potential is applied to the wiring RWL in a state where a predetermined potential (a constant potential) is applied to the wiring SL, the potential of the wiring RBL becomes a potential varied depending on the potential held in the node FN. This is because, for example, in the case where the transistor 102 is an n-channel transistor, an apparent threshold voltage $V_{th\_H}$ when the potential of the gate of the transistor 102 is at a high level is lower than an apparent threshold voltage $V_{th\_L}$ when the potential of the gate of the transistor 102 is at a low level. Here, an apparent threshold voltage refers to the potential of the wiring RWL that is needed to turn on the transistor 102.

Thus, by setting the potential of the wiring RWL to a potential $V_0$ which is between $V_{th\_H}$ and $V_{th\_L}$, the potential of the node FN can be determined. For example, in the case where the potential of the node FN is at a high level, the transistor 102 is turned on when the potential of the wiring RWL becomes $V_0$ ($>V_{th\_H}$). In the case where the potential of the node FN is at a low level, the transistor 102 remains off even when the potential of the wiring RWL becomes $V_0$ ($<V_{th\_L}$). Therefore, the data held in the node FN can be read by determining the potential of the wiring RBL.

Through the above operation, writing, holding, and reading of data can be performed.

There is no particular limitation on the material of the transistor 102. Like the transistor 101, an OS transistor or a transistor other than an OS transistor may be used. For example, they can be transistors each of whose channel formation region is formed in part of a substrate including a single crystal semiconductor. As the substrate including a single crystal semiconductor, a single crystal silicon substrate, a single crystal germanium substrate, or the like can be used. Since a transistor including a single crystal semiconductor in the channel formation region has a high current supply capability, the read speed of the circuit 21 can be increased by the use of such a transistor as the transistor 102.

Furthermore, the transistor 102 can be formed using a transistor whose channel formation region is formed in a semiconductor film. For example, the transistor can be a transistor including a non-single-crystal semiconductor in a channel formation region. As the non-single-crystal semiconductor, non-single-crystal silicon such as amorphous silicon, microcrystalline silicon, or polycrystalline silicon, non-single-crystal germanium such as amorphous germanium, microcrystalline germanium, or polycrystalline germanium, or the like can be used. In particular, when a crystalline semiconductor film is used, the read speed of the circuit 21 can be increased.

Furthermore, a p-channel transistor formed using a material other than an oxide semiconductor (e.g., silicon) can be formed easier than a p-channel OS transistor. Thus, in the case where the transistor 101 is a p-channel transistor, a material other than an oxide semiconductor is preferably used. Consequently, yield in the manufacturing process of the semiconductor device 10 can be increased.

Furthermore, the transistor 101 is not limited to an OS transistor, and a transistor formed using a material similar to that of the transistor 102 can be used.

According to one embodiment of the present invention, a back-gate BG is provided in the transistor 101, and the back-gate BG is connected to the terminal 52 through the wiring EL. Specifically, the back-gates BG of the transistors 101 included in the circuits 21[1,1] and 21[1,2] are connected to the wiring EL[1], the back-gates BG of the transistors 101 included in the circuits 21[2,1] and 21[2,2] are connected to the wiring EL[2], and the wirings EL[1] and EL[2] are connected to the terminal 52. Then, a potential at which the transistors 101 are turned on is supplied from the terminal 52 to the wirings EL, so that all of the transistors 101 of the circuits 21 are turned on. Thus, data stored in the plurality of circuits 21 can be erased at one time.

For example, in FIG. 2A, the potentials of the wirings WBL[1] and WBL[2] are set low, and a high-level potential is supplied from the terminal 52 to the wirings EL[1] and EL[2]. The potential supplied from the terminal 52 is a potential that can make the state in which the voltage $V_{bgs}$ between the back-gate BG of the transistor 101 and the one of the source and the drain of the transistor 101 is higher than the threshold voltage $V_{th}$ of the transistor 101. Thus, the transistor 101 is turned on regardless of the potential of the wiring WWL, and the potentials (low-level potentials) of the wirings WBL[1] and WBL[2] are written at one time to the nodes FN in the circuits 21[1,1], 21[1,2], 21[2,1], and 21[2,2]. Consequently, data stored in the circuits 21[1,1], 21[1,2], 21[2,1], and 21[2,2] can be erased at one time.

Note that in this specification and the like, "erasing data" means an operation in which data is overwritten by supplying the same potentials to the nodes FN in the plurality of circuits 21 to delete data which has been written. Examples of the data erasing operation are an operation in which the nodes FN of all of the circuits 21 are set at a high or low level and an operation in which the nodes FN in the plurality of circuits 21 in the same row or the same column are set at a high or low level. When data is erased in such an operation, it is extremely difficult to recover data which has been stored previously. Therefore, high security can be obtained, and the reliability of the semiconductor device can be improved.

Furthermore, the above operation does not need an operation in which the wirings WWL[1] to WWL[n] are sequentially selected by the circuit 30 and data is erased row by row. Therefore, time required for erasing data of all of the circuits 21 can be significantly shortened, and all data can be erased in a short time. Since data can be erased without driving the circuit 30, the configuration of the circuit 30 can be simplified and power consumption of the circuit 30 can be reduced.

Owing to the above operation, a high-speed erasing operation and low power consumption can be realized. For example, for an erasing operation in a flash memory, a high voltage is necessarily applied to a gate electrode to extract a charge accumulated in a floating gate to a source or a drain through a tunnel insulating film. Therefore, the erasing operation takes a long time and power consumption is high. However, in the present invention, data can be erased by just turning on the transistor 101; thus, data can be erased at high speed with low power consumption.

The OS transistor can operate at high speed when miniaturized. Therefore, when the OS transistor is used as the transistor 101, the write speed and the read speed of data can be reduced to shorter than or equal to 10 ns, preferably shorter than or equal to 5 ns. Accordingly, the erasing operation can be performed at high speed. Note that the channel length of the OS transistor used as the transistor 101 can be less than or equal to 100 nm, preferably less than or equal to 60 nm, further preferably less than or equal to 40 nm, still further preferably less than or equal to 30 nm.

The above erasing operation can be performed by just supplying a high-level or low-level potential to the terminal 52. Thus, when the semiconductor device 10 is used as a memory device in a device, software dedicated to the erasing operation does not need to be prepared, and the erasing operation can be performed by controlling the device. Accordingly, the semiconductor device 10 can be used as a memory device with high versatility.

Figure 2B:
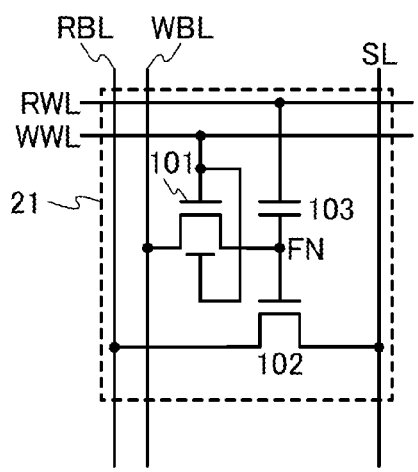

In the case where a write word signal for selecting all of the circuits 21 is supplied from the circuit 31 as illustrated in FIG. 1B, the gate of the transistor 101 may be connected to the back-gate of the transistor 101 (see FIG. 2B).

The wiring EL may be directly supplied with a potential from the outside of the circuit 20 or can be supplied with a potential through another circuit (a connection circuit 110). Configuration examples of the connection circuit 110 are shown in FIGS. 3A to 3E.

Figure 3A:
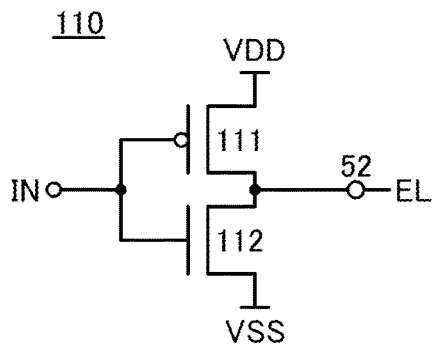
FIGS. 3A to 3E are circuit diagrams each illustrating a configuration example of a circuit.

FIG. 3A shows a configuration example where an inverter is used as the connection circuit 110. The inverter includes a transistor 111 and a transistor 112. A gate of the transistor 111 and a gate of the transistor 112 are connected to a terminal IN. One of a source and a drain of the transistor 111 is connected to one of a source and a drain of the transistor 112. The other of the source and the drain of the transistor 111 is connected to a high potential power supply potential line VDD. The other of the source and the drain of the transistor 112 is connected to a low potential power supply line VSS.

By supplying an erase signal from the terminal IN to the wiring EL through the connection circuit 110 in such a manner, the signal input to the terminal IN can be amplified and supplied to the wiring EL. Note that the connection circuit 110 can be formed of a plurality of inverters connected in series.

Figure 3B:
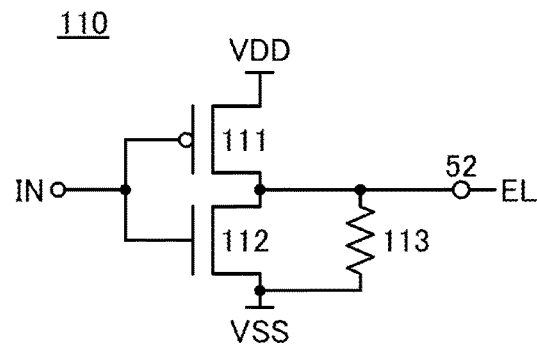

Alternatively, as illustrated in FIG. 3B, a resistor 113 connected to the wiring EL may be provided. One terminal of the resistor 113 is connected to the wiring EL, and the other terminal of the resistor 113 is connected to the low potential power supply line VSS. Such a configuration enables a reduction in a noise generated in the wiring EL in a period during which an erase signal is not supplied to the wiring EL. As the resistor 113, a resistive element may be used or wiring resistance between the wiring EL and the low potential power supply line VSS may be used.

Each of the transistors 111 and 112 can be formed using the same material as the transistor 101 or 102. In the case where the OS transistor is used as the transistor 112, the transistor 101 and the transistor 112 can be manufactured in the same process. The transistor 111 and the transistor 112 can be stacked as described in Embodiment 2 and the like.

The resistor 113 may be formed by connecting the wiring EL and the low potential power supply line VSS through an oxide semiconductor layer. In that case, the oxide semiconductor layer of the transistor 101 and the resistor 113 can be formed in the same process.

Figure 3C:
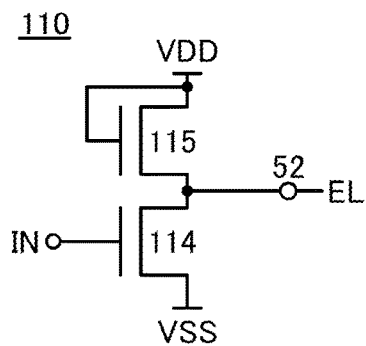
Figure 3D:
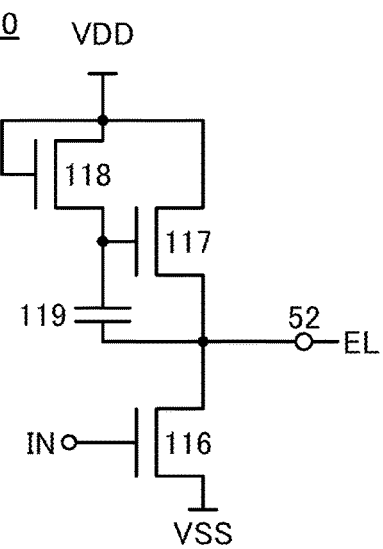
Figure 3E:
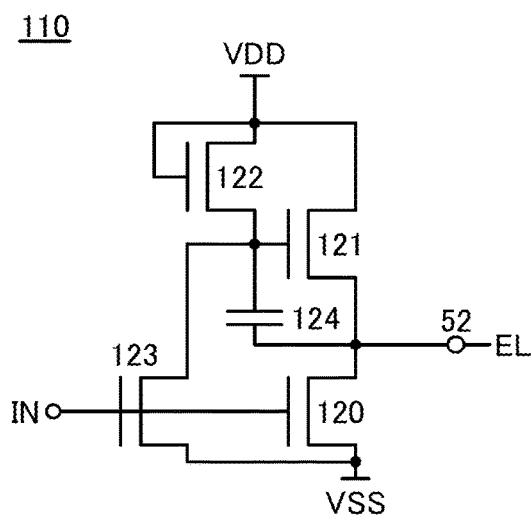

Transistors in the connection circuit 110 can be transistors having the same polarity. FIGS. 3C to 3E show examples where the connection circuit 110 is formed using n-channel transistors.

The circuit 110 illustrated in FIG. 3C includes transistors 114 and 115. A gate of the transistor 114 is connected to the terminal IN, one of a source and a drain of the transistor 114 is connected to one of a source and a drain of the transistor 115, and the other of the source and the drain of the transistor 114 is connected to the low potential power supply line VSS. The other of the source and the drain of the transistor 115 is connected to a gate of the transistor 115 and the high potential power supply line VDD. Here, the transistors 114 and 115 are n-channel transistors.

The circuit 110 illustrated in FIG. 3D includes transistors 116, 117, and 118 and a capacitor 119. A gate of the transistor 116 is connected to the terminal IN, one of a source and a drain of the transistor 116 is connected to one of a source and a drain of the transistor 117 and one electrode of the capacitor 119, and the other of the source and the drain of the transistor 116 is connected to the low potential power supply line VSS. A gate of the transistor 117 is connected to one of a source and a drain of the transistor 118 and the other electrode of the capacitor 119, and the other of the source and the drain of the transistor 117 is connected to the high potential power supply line VDD. The other of the source and the drain of the transistor 118 is connected to a gate of the transistor 118 and the high potential power supply line VDD. As the capacitor 119, a capacitive element may be used or parasitic capacitance may be used. The transistors 116, 117, and 118 are n-channel transistors.

The circuit 110 illustrated in FIG. 3E includes transistors 120, 121, 122, and 123 and a capacitor 124. A gate of the transistor 120 is connected to the terminal IN, one of a source and a drain of the transistor 120 is connected to one of a source and a drain of the transistor 121 and one electrode of the capacitor 124, and the other of the source and the drain of the transistor 120 is connected to the low potential power supply line VSS. A gate of the transistor 121 is connected to one of a source and a drain of the transistor 122, one of a source and a drain of the transistor 123, and the other electrode of the capacitor 124, and the other of the source and the drain of the transistor 121 is connected to the high potential power supply line VDD. The other of the source and the drain of the transistor 122 is connected to a gate of the transistor 122 and the high potential power supply line VDD. A gate of the transistor 123 is connected to the terminal IN, and the other of the source and the drain of the transistor 123 is connected to the low potential power supply line VSS. As the capacitor 124, a capacitive element may be used or parasitic capacitance may be used. The transistors 120, 121, 122, and 123 are n-channel transistors.

When the transistors in the connection circuit 110 and the transistors 101 and 102 in the circuit 21 have the same polarity, the circuit 21 and the connection circuit 110 can be manufactured in the same simple process. In that case, the above transistors are preferably OS transistors.

In FIGS. 3C to 3E, the resistor 113 illustrated in FIG. 3B can be provided as well.

Operation Example

Operation examples of the circuit 20 shown in FIGS. 2A and 2B are described.

Figure 4:
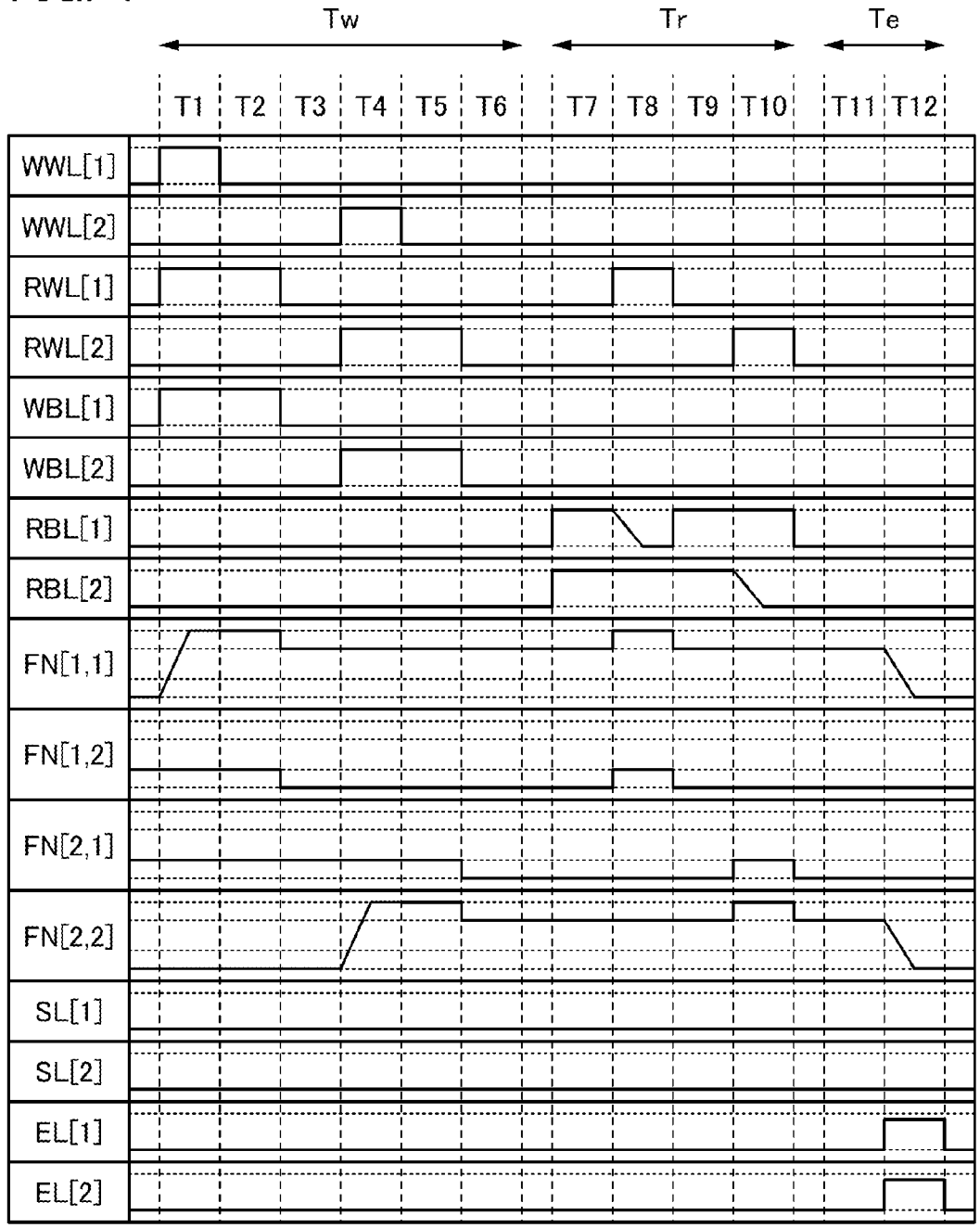
FIG. 4 is a timing chart.

FIG. 4 is a timing chart of the circuits 21 illustrated in FIG. 2A. Note that the nodes FN in the circuit 21[1,1], the circuit 21[1,2], the circuit 21[2,1], and the circuit 21[2,2] are referred to as FN[1,1], FN[1,2], FN[2,1], and FN[2,2], respectively.

First, periods T1 to T6 which correspond to a data write period Tw will be described. Although the case where high-level data, low-level data, low-level data, and high-level data are written to the circuit 21[1,1], the circuit 21[1,2], the circuit 21[2,1], and the circuit 21[2,2], respectively, is described here, data can be written to the other circuits 21 in a similar operation.

First, in the period T1, the potential of the wiring WBL[1] is set high and the potential of the wiring WBL[2] is set low. The potential of the wiring RWL[1] is also set high. Then, the potential of the wiring WWL[1] is set high, so that the transistors 101 are turned on. Thus, the potential (high-level potential) of the wiring WBL[1] is supplied to the node FN[1,1], and the potential (low-level potential) of the wiring WBL[2] is supplied to the node FN[1,2].

Next, in the period T2, the potential of the wiring WWL[1] is set low, so that the transistors 101 are turned off. Thus, the potentials of the nodes FN[1,1] and FN[1,2] are held.

Next, in the period T3, the potentials of the wirings WBL[1] and WBL[2] are set low. Furthermore, the potential of the wiring RWL[1] is set low. Since the transistors 101 remain off in the period T3, the nodes FN[1,1] and FN[1,2] are in a floating state. Therefore, the change in the potential of the wiring RWL[1] from a high level to a low level decreases the potentials of the nodes FN[1,1] and FN[1,2]. Thus, the transistors 102 in the circuits 21[1,1] and 21[1,2] are turned off.

Next, in the period T4, the potential of the wiring WBL[1] is set low and the potential of the wiring WBL[2] is set high.

The potential of the wiring RWL[2] is also set high. Then, the potential of the wiring WWL[2] is set high, so that the transistors 101 are turned on. Thus, the potential (low-level potential) of the wiring WBL[1] is supplied to the node FN[2,1], and the potential (high-level potential) of the wiring WBL[2] is supplied to the node FN[2,2].

Next, in the period T5, the potential of the wiring WWL[2] is set low, so that the transistors 101 are turned off. Thus, the potentials of the nodes FN[2,1] and FN[2,2] are held.

Next, in the period T6, the potentials of the wirings WBL[1] and WBL[2] are set low. Furthermore, the potential of the wiring RWL[2] is set low. Since the transistors 101 remain off in the period T6, the nodes FN[2,1] and FN[2,2] are in a floating state. Therefore, the change in the potential of the wiring RWL[2] from a high level to a low level decreases the potentials of the nodes FN[2,1] and FN[2,2]. Thus, the transistors 102 in the circuits 21[2,1] and 21[2,2] are turned off.

Through the above operation, data can be written to the circuits 21.

When the OS transistors are used as the transistors 101, the off-state current of each of the transistors 101 can be extremely low; thus, the potentials of the nodes FN[1,1], FN[1,2], FN[2,1], and FN[2,2] can be held for an extremely long period.

Next, periods T7 to T10 which correspond to a data read period Tr will be described.

First, in the period T7, the potentials of the wirings RBL[1] and RBL[2] are precharged to a high level.

Next, in the period T8, the potential of the wiring RWL[1] is set high. The potentials of the nodes FN[1,1] and FN[1,2] are increased because of capacitive coupling by the capacitor 103.

The transistor 102 whose gate is connected to the node FN[1,1] with an increased potential is turned on. Thus, the wiring RBL[1] and the wiring SL[1] are brought into electrical contact, so that the potential of the wiring RBL[1] precharged to a high level is decreased.

Meanwhile, the transistor 102 whose gate is connected to the node FN[1,2] with an increased potential remains off. Thus, the wiring RBL[2] and the wiring SL[2] are kept not to be electrically connected to each other, and the potential of the wiring RBL[2] precharged to a high level remains high.

As described above, the potentials of the wirings RBL[1] and RBL[2] vary depending on data stored in the nodes FN[1,1] and FN[1,2]. Thus, by detecting the potentials of the wirings RBL[1] and RBL[2], data stored in the circuits 21[1,1] and 21[1,2] can be read.

Next, in the period T9, the wiring RWL[1] is set low, and the potentials of the wirings RBL[1] and RBL[2] are precharged to a high level.

Next, in the period T10, the potential of the wiring RWL[2] is set high. Here, the potentials of the nodes FN[2,1] and FN[2,2] are increased because of capacitive coupling by the capacitor 103. Then, the transistor 102 whose gate is connected to the node FN[2,1] remains off, and the potential of the wiring RBL[1] remains high. The transistor 102 whose gate is connected to the node FN[2,2] is turned on, and the potential of the wiring RBL[2] is decreased. By reading the potentials of the wirings RBL[1] and RBL[2], data stored in the circuits 21[2,1] and 21[2,2] is read.

In the case where the transistors 102 are n-channel transistors, the potentials of the wirings SL[1] and SL[2] are preferably fixed at a low level in the periods T8 and T10. This prevents variation in the voltage between the gate and the source of each of the transistors 102. In the case where the transistors 102 are p-channel transistors, the potentials of the wirings SL[1] and SL[2] are preferably fixed at a high level.

Through the above operation, reading of the data stored in the circuits 21 can be performed.

Next, periods T11 and T12 which correspond to a data erase period Te will be described.

First, in the period T11, a low-level potential is supplied to the wirings WBL[1] and WBL[2].

Next, in the period T12, a high-level potential is supplied from the terminal 52 to the wirings EL[1] and EL[2], so that the transistors 101 in all of the circuits 21[1,1], 21[1,2], 21[2,1], and 21[2,2] are turned on. Thus, a low-level potential is supplied from the wirings WBL to all of the nodes FN, so that low-level data is written to all of the circuits 21[1,1], 21[1,2], 21[2,1], and 21[2,2]. Accordingly, data can be erased in all of the circuits 21 at one time.

Through the above operation, erasing of the data stored in the circuits 21 can be performed.

Although erasing of the data is performed by writing low-level data to all of the circuits 21 in FIG. 4, the method for erasing data is not limited thereto. For example, a high-level potential may be supplied to the wirings WBL[1] and WBL[2] in the periods T11 and T12. In that case, a high-level potential is supplied to all of the nodes FN and data erasing is accomplished by writing high-level data to all of the circuits 21.

Alternatively, the wirings WBL[1] and WBL[2] may be in a floating state in the periods T11 and T12. In that case, the nodes FN in all of the circuits 21 connected to the same wiring WBL are brought into electrical contact in the period T12; thus, all of the nodes FN in the circuits 21 in the same column have the same potential. Accordingly, data can be erased column by column. In the case where the wirings WBL[1] and WBL[2] are in a floating state, a predetermined potential does not need to be supplied from the circuit 40 to the wirings WBL[1] and WBL[2]; thus, power consumption of the circuit 40 can be reduced.

In the period Tw and the period Tr, the potential of the wirings EL is preferably fixed. This can suppress variation in the threshold voltage $V_{th}$ of the transistors 101 in the write period and the read period. For example, the potential of the wirings EL can be a low power supply potential (e.g., a ground potential).

The potential of the wirings EL in the period Tw and the period Tr is not limited to a low power supply potential. Here, when the potential of the wirings EL is at a low level, the threshold voltage $V_{th}$ of the transistors 101 can be increased in some cases. For example, the potential of the wirings EL may be set to be lower than the low power supply potential. As a result, a drain current generated when a gate-source voltage Vgs of the transistor 101 is 0 V can be reduced and a leakage current of the transistor 101 can be reduced in some cases. When the potential of the wirings EL is set high, the threshold voltage $V_{th}$ of the transistors 101 can be reduced in some cases. For example, the potential of the wirings EL may be set to be higher than the low power supply potential. As a result, a drain current generated when the gate-source voltage Vgs is VDD can be increased and operation speed of the circuit 21 including the transistor 101 can be improved in some cases. Accordingly, when the potential of the wirings EL is set to be higher than the low power supply potential in the period Tw, data writing can be easily performed. Furthermore, when the potential of the wirings EL is set to be lower than the low power supply potential in the period Tr, the off-state current of the transistors 101 can be reduced and data can be held accurately.

As described above, according to one embodiment of the present invention, when an erase signal is supplied to the wirings EL connected to the back-gates BG of the transistors 101, data stored in the plurality of circuits 21 can be erased at one time without sequentially selecting the circuits 21 row by row. Thus, a semiconductor device in which data of the plurality of circuits 21 can be erased in a short time and which can operate at high speed can be provided. Furthermore, according to one embodiment of the present invention, data of the circuits 21 can be erased without operating the circuit 30; thus, power consumption of a driver circuit can be reduced. Moreover, according to one embodiment of the present invention, by use of an OS transistor, data stored in the circuits 21 can be held for a long time without any refresh operation. Thus, power consumption of the circuits 21 can be reduced and the circuits 21 can be used as memory cells of an auxiliary memory device.

In Embodiment 1, one embodiment of the present invention has been described. Other embodiments of the present invention are described in Embodiments 2 to 7. Note that one embodiment of the present invention is not limited to the embodiments. In other words, various embodiments of the invention are described in this embodiment and the other embodiments, and one embodiment of the present invention is not limited to a particular embodiment. The example in which data is erased at one time is described as one embodiment of the present invention; however, one embodiment of the present invention is not limited thereto. Depending on the case or the situation, only part of the data may be erased in one embodiment of the present invention. Alternatively, data is not necessarily erased at one time in one embodiment of the present invention. Furthermore, the case where data is erased using a back-gate of a transistor is described as one embodiment of the present invention; however, one embodiment of the present invention is not limited thereto. Depending on the case or the situation, data may be erased by another method in one embodiment of the present invention. Alternatively, data may be erased without using a back-gate of a transistor in one embodiment of the present invention.

The structure and method described in this embodiment can be implemented by being combined as appropriate with any of the other structures and methods described in the other embodiments. Note that content (or may be part of the content) described in this embodiment may be applied to, combined with, or replaced by different content (or may be part of the different content) described in the embodiment and/or content (or may be part of the content) described in one or more different embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed. This applies also to other embodiments.

Embodiment 2

In this embodiment, a specific structure example of the semiconductor device 10 will be described.

Figure 5A:
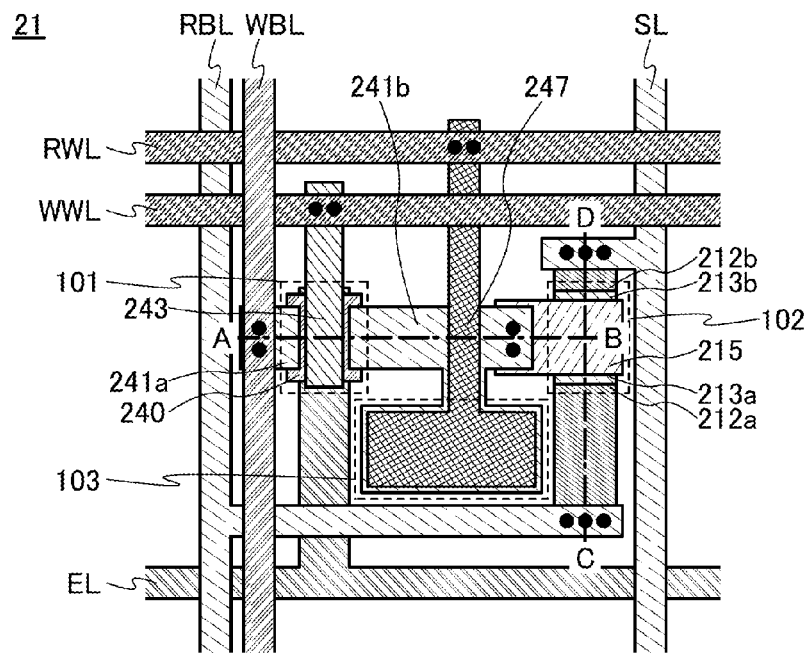
FIGS. 5A and 5B illustrate an example of a structure example of a semiconductor device.
Figure 5B:
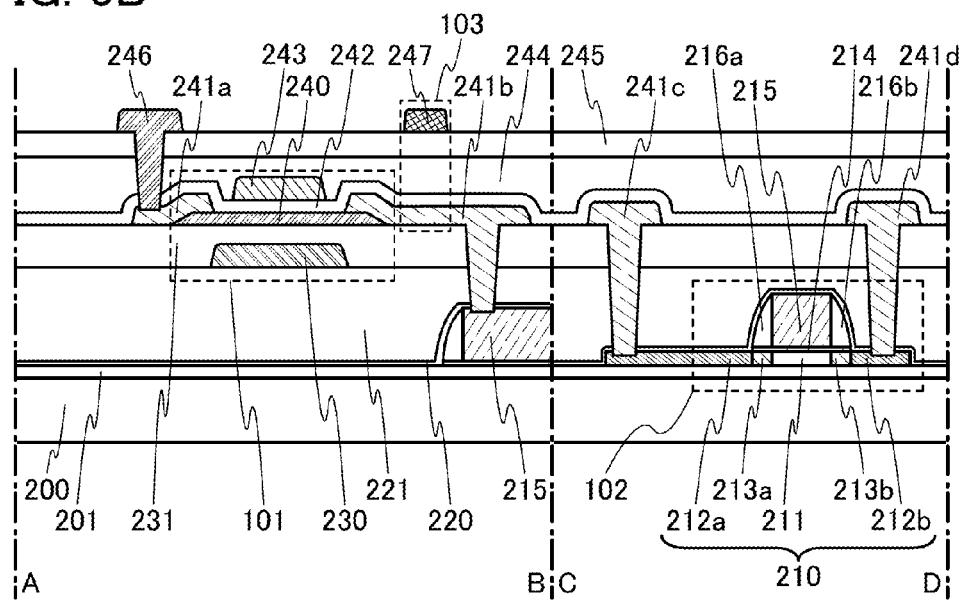

FIGS. 5A and 5B show a specific example of a layout of the semiconductor device 10. FIG. 5A is a top view illustrating a specific example of the layout of the circuit 21 in FIGS. 2A and 2B. FIG. 5B is a cross-sectional view taken along a line A-B and a line C-D in FIG. 5A. A black circle in FIG. 5A represents a contact hole.

The circuit 21 in FIGS. 5A and 5B includes the transistor 102 whose channel region is formed using a single crystal semiconductor (e.g., single crystal silicon) over a substrate 200 with an insulating layer 201 provided therebetween, the OS transistor 101 over an insulating layer 221 covering the transistor 102, and the capacitor 103.

Specifically, the transistor 102 includes a semiconductor layer 210 over the insulating layer 201, an insulating layer 214 over the semiconductor layer 210, a conductive layer 215 over the insulating layer 214, an insulating layer 216a, and an insulating layer 216b. Over the conductive layer 215, the insulating layer 216a, and the insulating layer 216b, an insulating layer 220, the insulating layer 221 over the insulating layer 220, and an insulating layer 231 over the insulating layer 221 are provided.

The semiconductor layer 210 includes a channel formation region 211, high-concentration impurity regions 212a and 212b, and low-concentration impurity regions 213a and 213b. The conductive layer 215 includes a region overlapping with the channel formation region 211 with the insulating layer 214 provided therebetween, and the insulating layers 216a and 216b include regions overlapping with the low-concentration impurity regions 213a and 213b, respectively, with the insulating layer 214 provided therebetween. The high-concentration impurity region 212a is connected to a conductive layer 241c over the insulating layer 231 through a contact hole provided in the insulating layers 220, 221, and 231. The high-concentration impurity region 212b is connected to a conductive layer 241d over the insulating layer 231 through a contact hole provided in the insulating layers 220, 221, and 231. The conductive layer 215 has a function of a gate of the transistor 102, and the insulating layer 214 has a function of a gate insulating layer of the transistor 102. The conductive layers 241c and 241d correspond to the wiring RBL and the wiring SL, respectively, and have functions of a source and a drain of the transistor 102.

For the semiconductor layer 210, any of the materials described in Embodiment 1 can be used. In the case where a single crystal semiconductor layer is used as the semiconductor layer 210, the single crystal semiconductor layer can be formed by UNIBOND (registered trademark) typified by Smart Cut (registered trademark), epitaxial layer transfer (ELTRAN) (registered trademark), a dielectric separation method, a plasma assisted chemical etching (PACE) method, or the like. The substrate 200 may be a single crystal semiconductor, and a channel formation region may be formed in part of the substrate.

The transistor 101 includes an oxide semiconductor layer 240 over the insulating layer 231, conductive layers 241a and 241b over the oxide semiconductor layer 240, an insulating layer 242 over the oxide semiconductor layer 240 and the conductive layers 241a and 241b, and a conductive layer 243 over the insulating layer 242. Over the conductive layer 243, an insulating layer 244, an insulating layer 245 over the insulating layer 244, and conductive layers 246 and 247 over the insulating layer 245 are provided. The conductive layer 241b is connected to the conductive layer 215 through a contact hole provided in the insulating layers 220, 221, and 231. The conductive layer 243 is connected to the wiring WWL through a contact hole. The conductive layer 246 is connected to the conductive layer 241a through a contact hole provided in the insulating layers 244 and 245.

The conductive layer 243 has a function of a gate of the transistor 101, and the insulating layer 242 has a function of a gate insulating layer of the transistor 101. The conductive layers 241a and 241b have functions of a source and a drain of the transistor 101. The conductive layer 246 corresponds to the wiring WBL. The conductive layer 243 may be formed using part of the wiring WWL.

Over the insulating layer 221, a conductive layer 230 including a region overlapping with the oxide semiconductor layer 240 with the insulating layer 231 provided therebetween is provided. The conductive layer 230 has a function of a gate electrode of the transistor 101, and the insulating layer 231 has a function of a gate insulating layer of the transistor 101. Hereinafter, the conductive layer 243, the insulating layer 242, the conductive layer 230, and the insulating layer 231 are also referred to as a first gate electrode, a first gate insulating layer, a second gate electrode or a back-gate, and a second gate insulating layer, respectively. In other words, the transistor 101 is a dual-gate transistor in which gate electrodes are provided under and over the oxide semiconductor layer 240. Note that the conductive layer 230 corresponds to the wiring EL, and the conductive layer 230 included in all of the circuits 21 is connected to the same terminal 52 (see FIGS. 1A and 1B).

The capacitor 103 includes the conductive layer 241b, the insulating layer 242 over the conductive layer 241b, the insulating layer 244, and the conductive layer 247 over the insulating layer 244. The conductive layer 241b has a function of one electrode of the capacitor 103, the insulating layer 242 and the insulating layer 244 have a function of a dielectric of the capacitor 103, and the conductive layer 247 has a function of the other electrode of the capacitor 103. The conductive layer 247 is connected to the wiring RWL through a contact hole.

As illustrated in FIG. 5A, the wiring EL is provided to be along the wiring RWL and the wiring WWL and intersect with the wiring WBL, the wiring RBL, and the wiring SL. Specifically, the wiring EL is parallel or substantially parallel to the wiring RWL and the wiring WWL and perpendicular or substantially perpendicular to the wiring WBL, the wiring RBL, and the wiring SL. Note that the wiring EL may be provided between the wiring RWL and the wiring WWL.

In this specification, the term "parallel" indicates that the angle formed between two straight lines is greater than or equal to −10° and less than or equal to 10°, and accordingly includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 800 and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

When the transistor 101 is turned off in the semiconductor device having the above structure, a charge corresponding to data written to the circuit 21 is held in the conductive layer 241b which corresponds to one of the source and the drain of the transistor 101. A predetermined potential is applied to the conductive layer 230 corresponding to the wiring EL, so that the transistors 101 in all of the circuits 21 are turned off; thus, data can be erased.

According to one embodiment of the present invention, the transistor 101 and the transistor 102 can be stacked as illustrated in FIG. 5B. Thus, the area of the circuit 21 can be reduced.

The structure and method described in this embodiment can be implemented by being combined as appropriate with any of the other structures and methods described in the other embodiments.

Embodiment 3

In this embodiment, modification examples of the structure of the semiconductor device 10 are described.

Modification Example 1

Figure 6A:
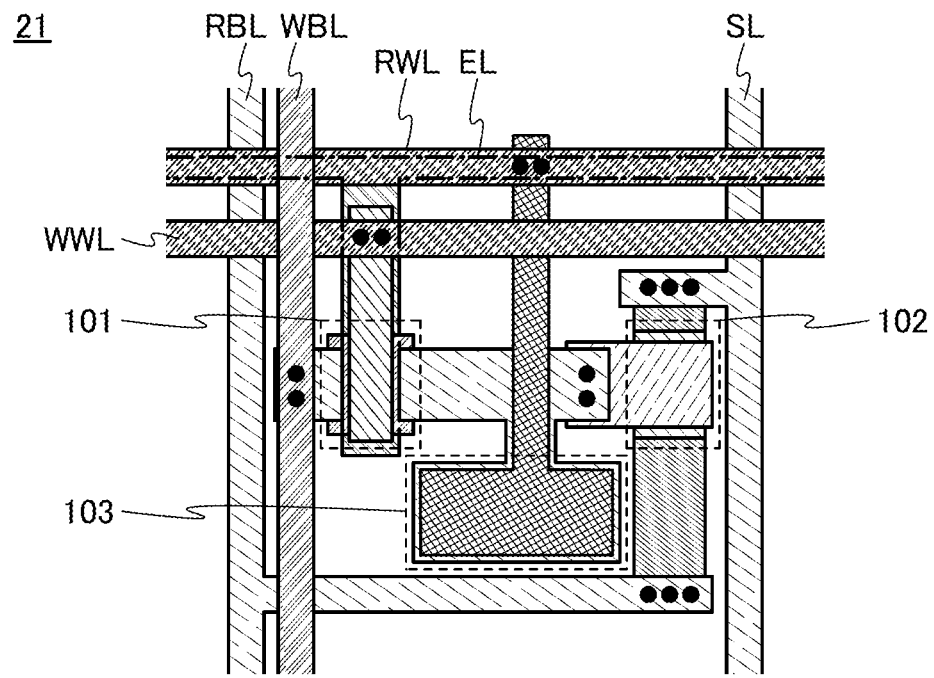
FIGS. 6A and 6B each illustrate an example of a structure example of a semiconductor device.
Figure 6B:
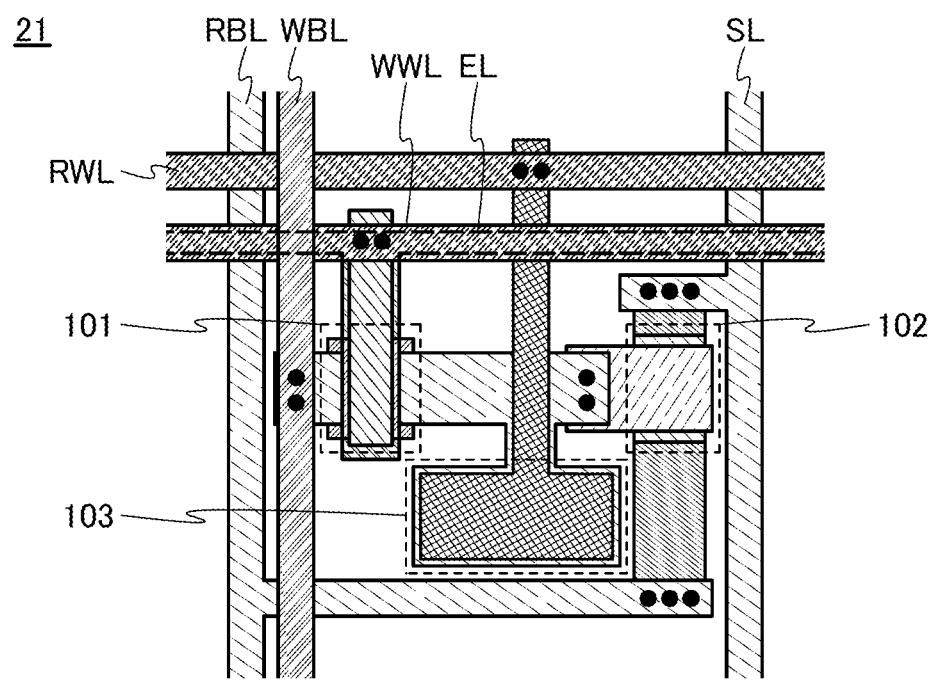

FIGS. 6A and 6B show structure examples of the circuit 21. The circuits 21 illustrated in FIGS. 6A and 6B are different from that in FIG. 5A in the position of the wiring EL.

As illustrated in FIG. 5B, the conductive layer 230 (corresponding to the wiring EL) is provided in a layer different from the other wirings. Accordingly, the wiring EL can be provided to overlap with the other wirings, so that the area of the circuit 21 can be reduced.

FIG. 6A illustrates a structure where the wiring EL is provided to include a region overlapping with the wiring RWL. A region denoted by a dashed-dotted line in the drawing is a region where the wiring EL is provided. With such a structure, the area of the circuit 21 can be reduced. As illustrated in FIG. 6A, the width of the wiring EL is preferably smaller than or equal to the width of the wiring RWL. Consequently, the area of the circuit 21 can be further reduced.

FIG. 6B illustrates a structure where the wiring EL is provided to include a region overlapping with the wiring WWL. With such a structure, the area of the circuit 21 can be reduced. As illustrated in FIG. 6B, the width of the wiring EL is preferably smaller than or equal to the width of the wiring WWL. Consequently, the area of the circuit 21 can be further reduced.

Modification Example 2

Figure 7:
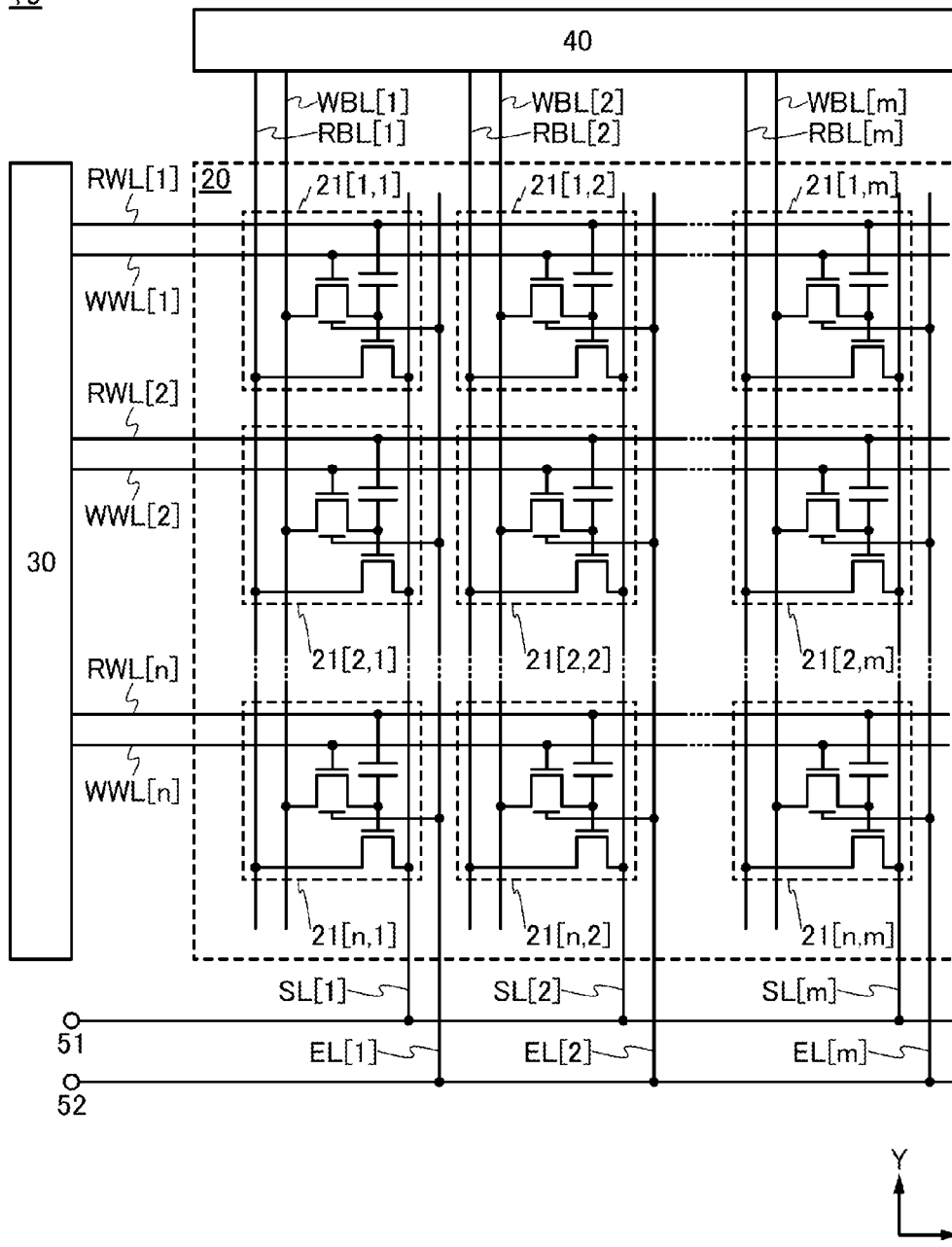
FIG. 7 illustrates a structure example of a semiconductor device.

FIG. 7 shows another structure example of the circuit 21. In FIG. 1A, the wiring EL is provided to intersect with the wiring SL; however, in a semiconductor device illustrated in FIG. 7, the wiring EL is provided along the wiring SL. Specifically, in FIG. 7, the wiring EL is provided to be parallel or substantially parallel to the wiring SL.

When the wiring EL is provided along the wiring SL, the length of the circuit 21 in the Y direction (the vertical direction in the drawing) can be shortened. Thus, for example, even when the width of the circuit 40 is larger than the width of the circuit 30 and a space of the circuit 20 in the Y direction is difficult to sufficiently secure, a plurality of circuits 21 can be efficiently arranged. On the other hand, when the width of the circuit 30 is larger than the width of the circuit 40, the wiring EL is preferably provided to intersect with the wiring SL (see FIG. 1A).

Figure 8A:
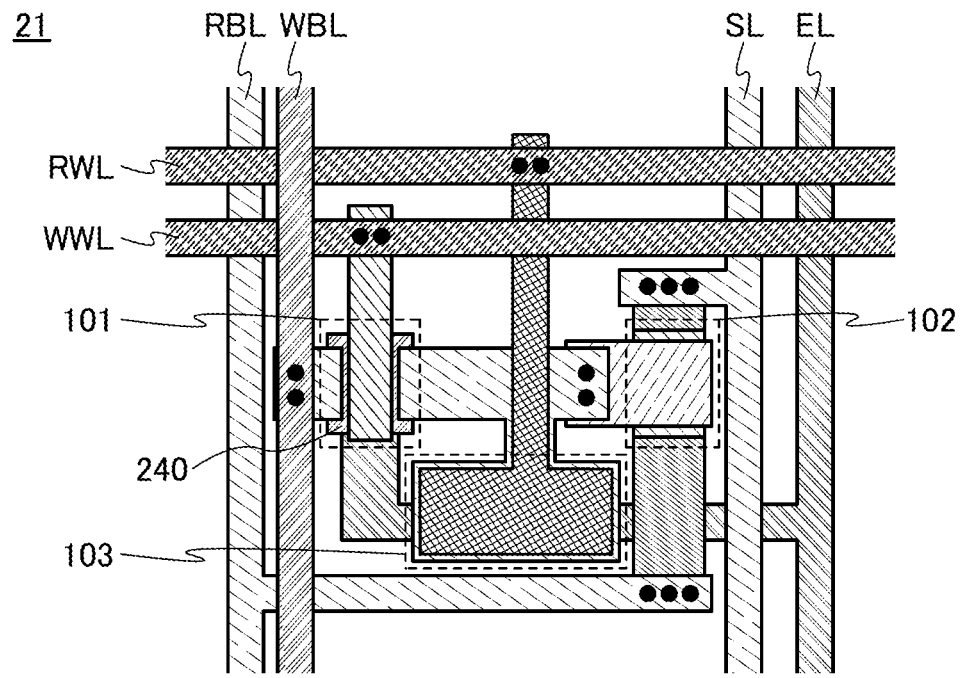
FIGS. 8A and 8B each illustrate a structure example of a semiconductor device.

FIGS. 8A and 8B and FIGS. 9A and 9B show examples of top views of the circuit 21 illustrated in FIG. 7. As illustrated in FIG. 8A, the wiring EL is provided to be adjacent to the wiring SL and along the wiring SL. Part of the wiring EL extends to a region overlapping with the transistor 101 and includes a region overlapping with the oxide semiconductor layer 240. In other words, the wiring EL has a function of a back-gate of the transistor 101.

The wiring EL may be provided between the transistor 102 and the wiring SL. Alternatively, the wiring EL may be provided between the transistor 101 and the wiring WBL or between the wiring WBL and the wiring RBL. The wiring RBL and the wiring WBL may be provided between the transistor 101 and the wiring SL.

Figure 8B:
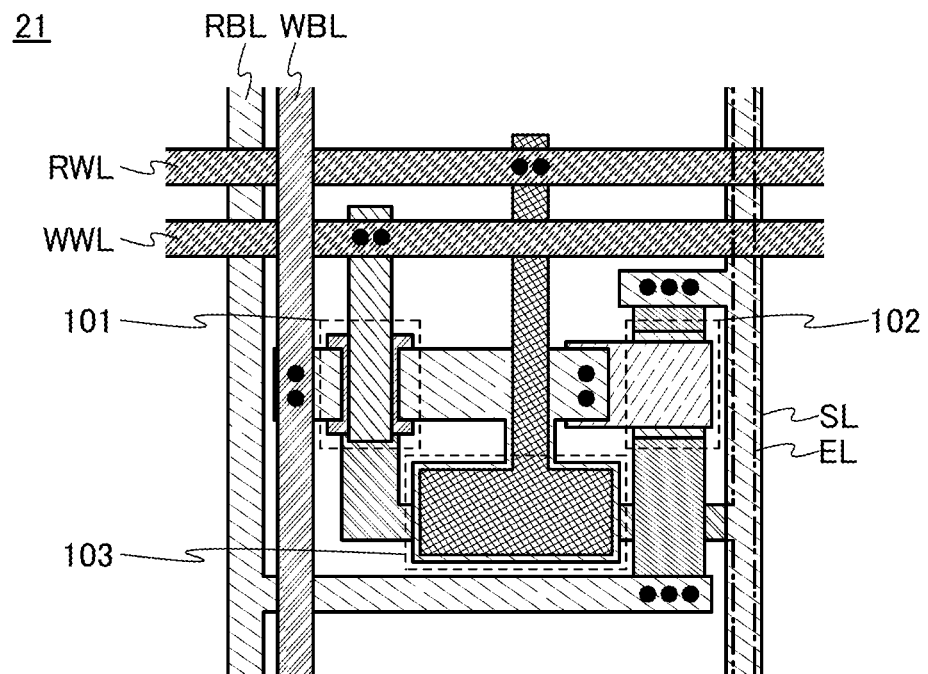
Figure 9A:
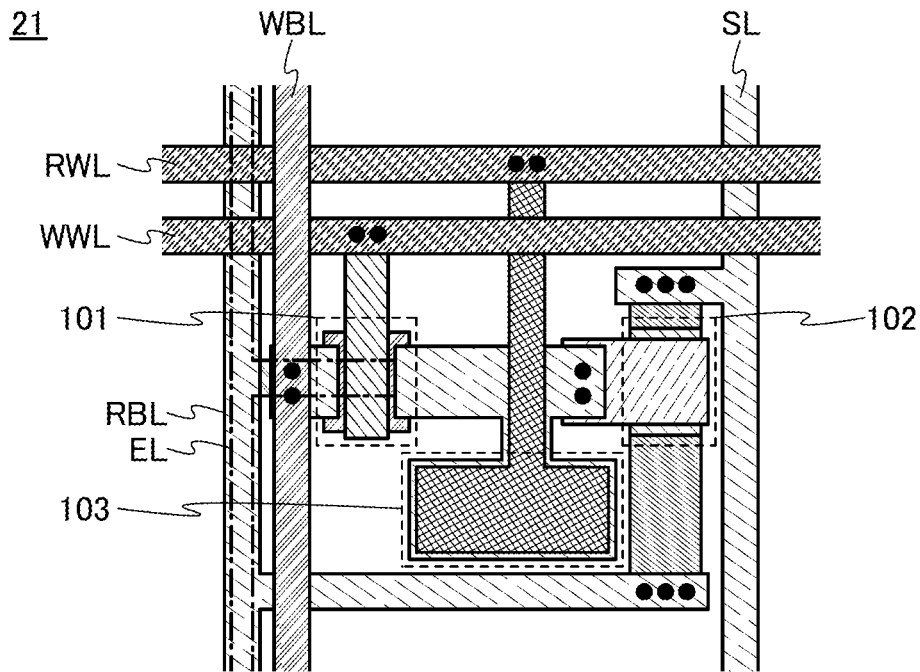
FIGS. 9A and 9B each illustrate a structure example of a semiconductor device.
Figure 9B:
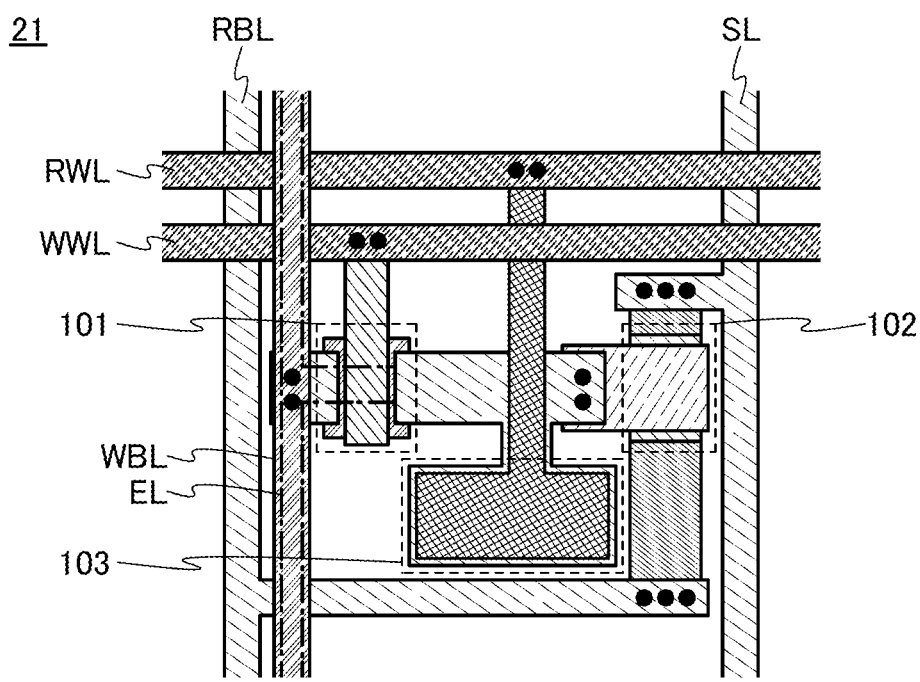

FIG. 8B illustrates a structure where the wiring EL is provided to include a region overlapping with the wiring SL. FIG. 9A illustrates a structure where the wiring EL is provided to include a region overlapping with the wiring RBL. FIG. 9B illustrates a structure where the wiring EL is provided to include a region overlapping with the wiring WBL. With such a structure, the area of the circuit 21 can be reduced.

As illustrated in FIG. 8B and FIGS. 9A and 9B, the width of the wiring EL is preferably smaller than or equal to the width of the wiring (the wiring SL, the wiring RBL, or the wiring WBL) overlapping with the wiring EL. Consequently, the area of the circuit 21 can be further reduced.

The wiring WBL and the wiring RBL may be stacked and the wiring EL may be provided to overlap with the wiring WBL and the wiring RBL.

Modification Example 3

FIG. 10, FIG. 11, FIG. 12, FIG. 13, and FIG. 14 show other configuration examples of the semiconductor device 10. The circuits 21 illustrated in FIG. 10, FIG. 11, FIG. 12, FIG. 13, and FIG. 14 each have a structure where a wiring is shared between predetermined wirings.

Figure 10:
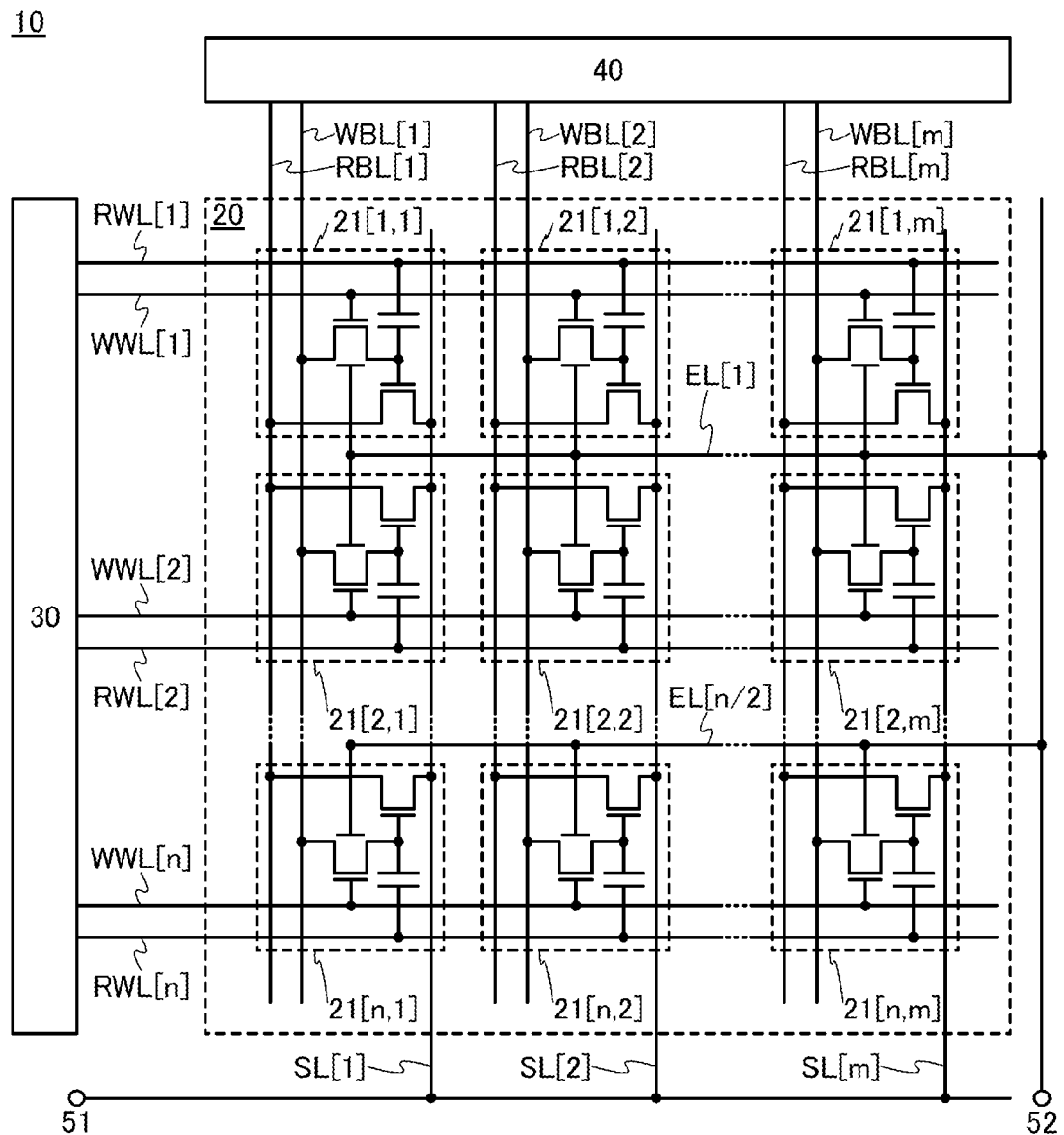
FIG. 10 illustrates a structure example of a semiconductor device.

FIG. 10 shows a structure example of the circuit 21. Although FIG. 1A show the structure where the wirings EL are provided for every row of the circuits 21 and the semiconductor device 10 includes n wirings EL (wirings EL[1] to EL[n]), FIG. 10 shows the semiconductor device 10 having a structure where one wiring EL is shared between the adjacent circuits 21.

Specifically, the circuit 21 in the 2k−1-th row (k is a natural number) and the circuit 21 in the 2k-th row which are in the same column are connected to the same wiring EL. For example, the circuit 21[1,1] and the circuit 21[2,1] both are connected to the wiring EL[1] and share the wiring EL[1]. Thus, the number of wirings EL can be reduced from n to n/2. In FIG. 10, the length of the circuit 20 in the X direction (in the horizontal direction in the drawing) can be reduced by providing the wiring EL to intersect with the wiring SL, and in addition, the length of the circuit 20 in the Y direction (in the vertical direction in the drawing) can also be reduced by sharing the wirings EL between the adjacent circuits 21.

By providing the shared wiring EL to include a region overlapping with the wiring RWL or the wiring WWL (see FIGS. 6A and 6B), the area of the circuit 21 can be further reduced.

FIG. 10 illustrates the structure where the circuit 21 in the 2k−1-th row (k is a natural number) and the circuit 21 in the 2k-th row which are in the same column share the wiring EL; however, as illustrated in FIG. 11, the circuit 21 in the 2k−1-th column and the circuit 21 in the 2k-th column which are in the same row may share the wiring EL. For example, in FIG. 11, the circuit 21[1,1] and the circuit 21[1,2] both are connected to the wiring EL[1] and share the wiring EL[1].

The wiring EL is provided along the wiring SL. Accordingly, in FIG. 11, the length of the circuit 20 in the Y direction (in the vertical direction in the drawing) is reduced and the wiring EL is shared, so that the length of the circuit 20 in the X direction (in the horizontal direction) can be reduced.

By providing the shared wiring EL to include a region overlapping with the wiring SL, the wiring RBL, or the wiring WBL (see FIG. 8B and FIGS. 9A and 9B), the area of the circuit 21 can be further reduced.

Figure 12:
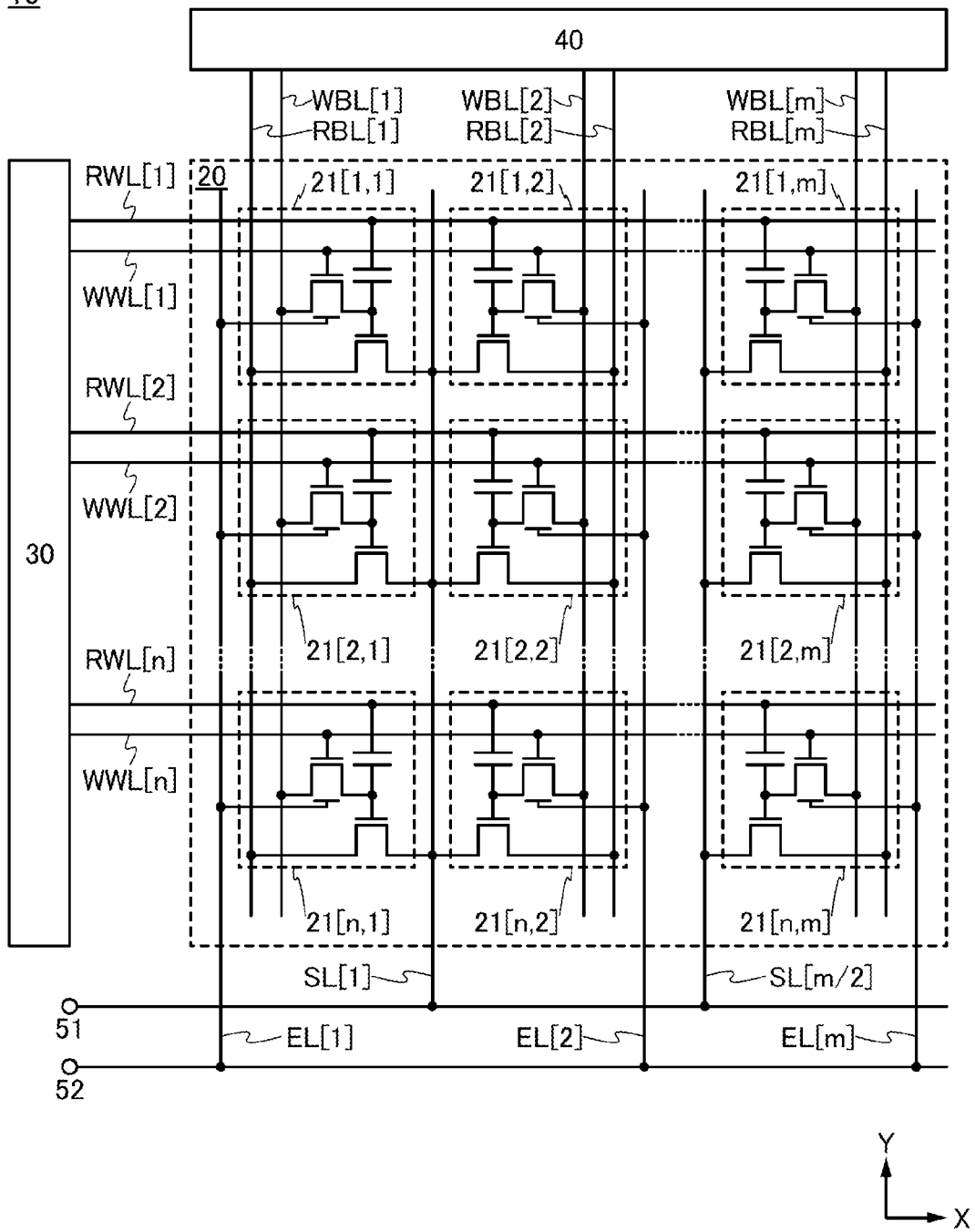
FIG. 12 illustrates a structure example of a semiconductor device.

The semiconductor device 10 in FIG. 12 has a structure where one wiring SL is shared between the adjacent circuits 21. Specifically, the circuit 21 in the 2k−1-th column and the circuit 21 in the 2k-th column which are in the same row are connected to the same wiring SL. For example, the circuit 21[1,1] and the circuit 21[1,2] both are connected to the wiring SL[1] and share the wiring SL[1]. Thus, the number of wirings SL can be reduced from m to m/2, and the area of the circuit 20 can be reduced.

Although the wiring EL is provided along the wiring SL here, the wiring EL may be provided to intersect with the wiring SL (see FIGS. 1A and 1B).

Figure 13:
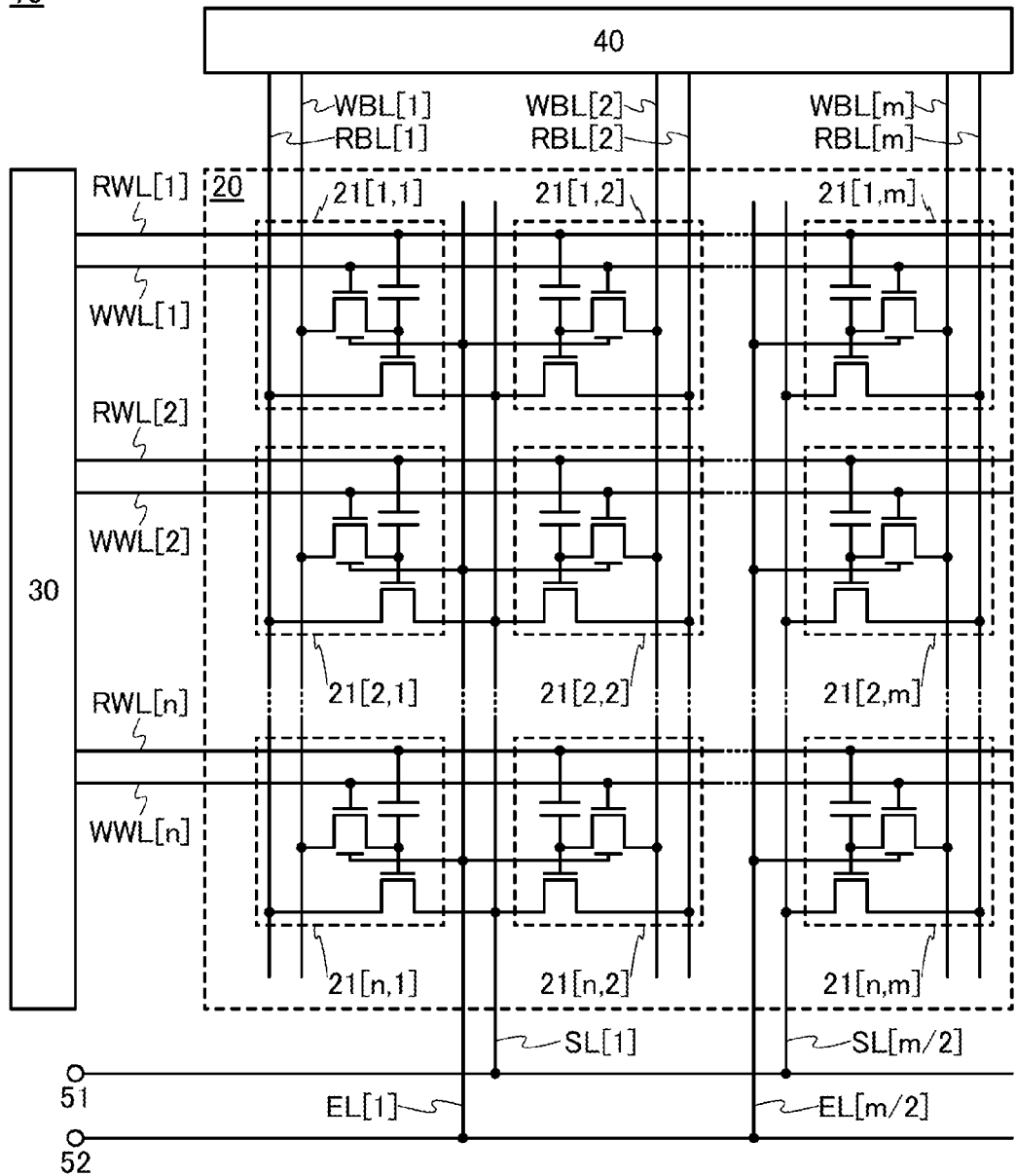
FIG. 13 illustrates a structure example of a semiconductor device.

In the structure illustrated in FIG. 12, the wiring EL may be shared. FIG. 13 illustrates a structure where the wiring EL and the wiring SL are shared between the adjacent circuits 21.

Specifically, the circuit 21 in the 2k−1-th column and the circuit 21 in the 2k-th column which are in the same row are connected to the same wiring EL and the same wiring SL. For example, the circuit 21[1,1] and the circuit 21[2,1] both are connected to the wiring EL[1] and the wiring SL[1] and share the wiring EL[1] and the wiring SL[1]. Thus, the number of each of the wirings EL and the wirings SL can be reduced from m to m/2.

Figure 14:
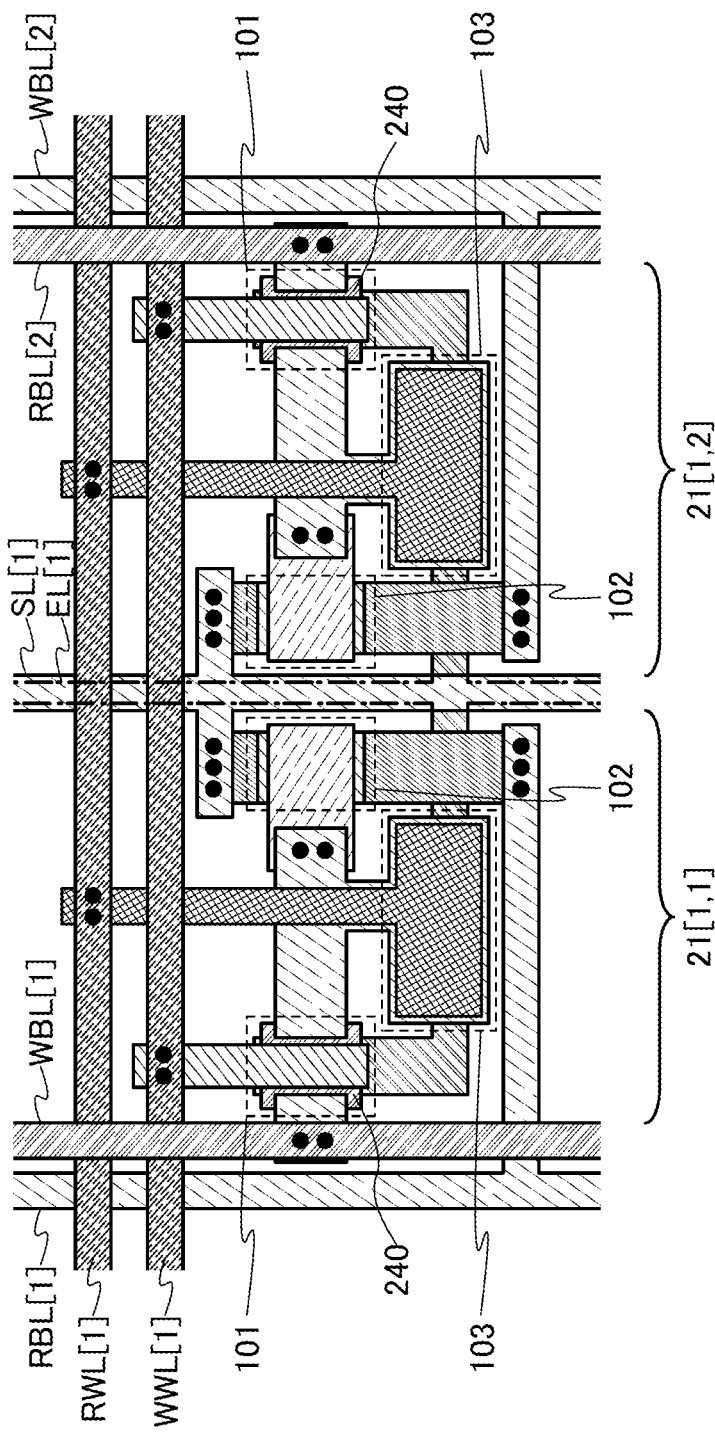
FIG. 14 illustrates a structure example of a semiconductor device.

FIG. 14 shows an example of the top view of the circuit 21[1,1] and the circuit 21[1,2] in FIG. 13. The wiring EL[1] is provided to include a region overlapping with the oxide semiconductor layer 240 in the circuit 21[1,1] and a region overlapping with the oxide semiconductor layer 240 in the circuit 21[1,2], and is shared. The wiring SL[1] is connected to the transistor 102 in the circuit 21[1,1] and the transistor 102 in the circuit 21[1,2] and is shared.

Furthermore, the wiring EL[1] is provided to include a region overlapping with the wiring SL[1]. With the structure where the wiring EL and the wiring SL which are shared are overlapped with each other as described above, the width of four wirings can be reduced to the width of one wiring. Thus, the area of the circuit 20 can be reduced. As illustrated in FIG. 14, the width of the wiring EL is preferably set to be smaller than or equal to the width of the wiring SL. Consequently, the area of the circuit 21 can be further reduced.

Note that the wiring EL can be provided to include a region overlapping with the wiring RBL or the wiring WBL.

Figure 15:
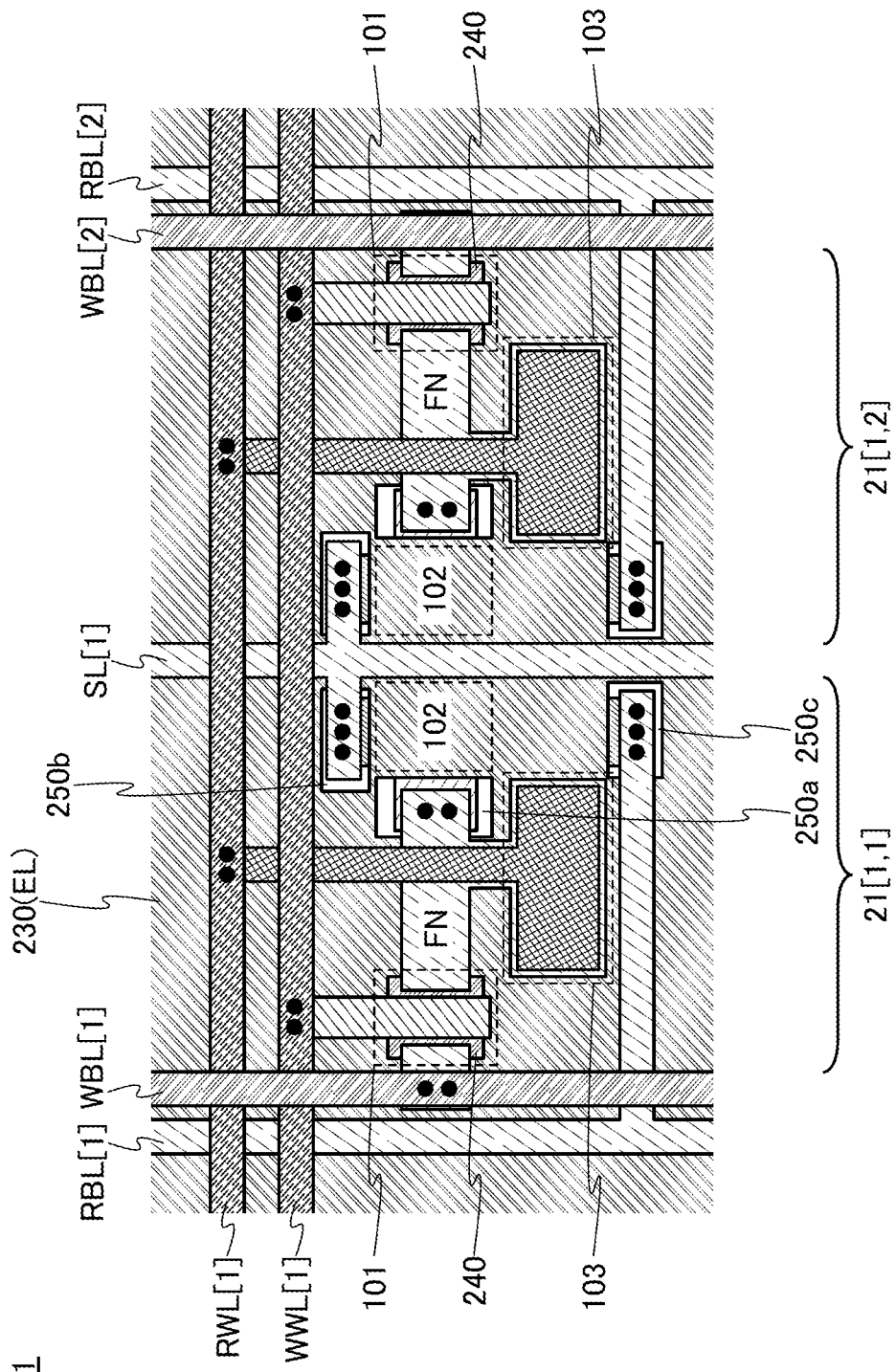
FIG. 15 illustrates a structure example of a semiconductor device.

FIG. 15 shows another structure example of the semiconductor device 10. The circuit 21 in FIG. 15 has a structure where the conductive layer 230 functioning as the wiring EL is formed over the entire surface of the two adjacent circuits 21 and thus, the wiring EL is shared between the circuits 21.

For example, the conductive layer 230 having a function of the wiring EL is formed over the entire surface of the circuit 21[1,1] and the circuit 21[1,2] and thus, the wiring EL is shared between the circuit 21[1,1] and the circuit 21[1,2]. The conductive layer 230 includes a region overlapping with the oxide semiconductor layer 240 in the circuit 21[1,1] and a region overlapping with the oxide semiconductor layer 240 in the circuit 21[1,2] and has a function of a back-gate of the transistor 101.

When the conductive layer 230 having a function of the wiring EL is formed over the entire surface of the circuit 21 as described above, capacitance is added to the node FN (the conductive layer 241b), and the capacitor 103 can have a smaller size or can be omitted. Therefore, the area of the circuit 21 can be reduced. Electromagnetic noise from the conductive layer, the impurity regions, and the like below the conductive layer 230 to the node FN can be blocked. Therefore, stable data retention can be performed.

Note that in the circuits 21, the conductive layer 230 needs to be removed at a connection portion between the conductive layer above the conductive layer 230 and the conductive layer or the impurity region below the conductive layer 230. In FIG. 15, the conductive layer 230 is removed at a connection portion 250a between one of a source and a drain of the transistor 101 and a gate of the transistor 102, a connection portion 250b between one of a source and a drain of the transistor 102 and the wiring SL, and a connection portion 250c between the other of the source and the drain of the transistor 102 and the wiring RBL.

In FIG. 15, the conductive layer 230 is formed over the entire surface of the circuit 21[1,1] and the circuit 21[1,2] which are adjacent to the conductive layer 230; however, one embodiment of the present invention is not limited thereto. For example, the conductive layer 230 may be formed over the entire surface of the circuits 21 in the same row or the same column or may be formed over the entire surface of all of the circuits 21.

Modification Example 4

FIGS. 16A to 16E show modification examples of a configuration of the circuit 21 in FIGS. 2A and 2B.

Figure 16A:
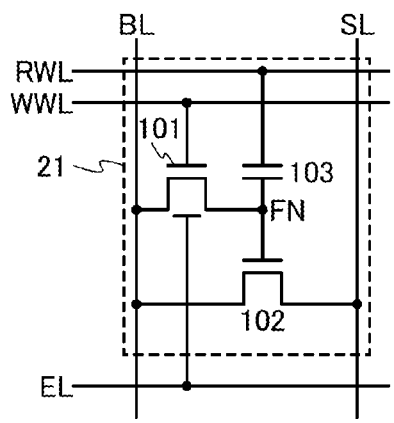
FIGS. 16A to 16E are circuit diagrams each illustrating a configuration example of a circuit.

As shown in FIG. 16A, one of a source and a drain of the transistor 101 and one of a source and a drain of the transistor 102 may be connected to the wiring BL. In other words, a wiring serving as the wiring WBL and the wiring RBL can be used. With such a configuration, one of the wiring WBL and the wiring RBL can be omitted, and the area of the circuit 20 can be reduced.

Figure 16B:
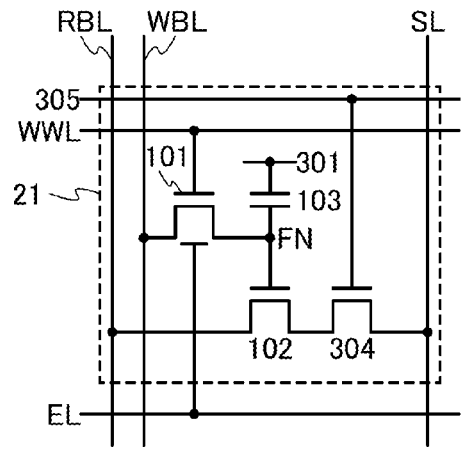

In FIG. 2A and FIG. 16A, the circuit 21 may be provided with an element such as a switch in addition to the transistor 101, the transistor 102, and the capacitor 103. For example, as shown in FIG. 16B, a transistor 304 functioning as a switch may be provided between the transistor 102 and the wiring SL. A gate of the transistor 304 is connected to a wiring 305, one of a source and a drain of the transistor 304 is connected to one of the source and the drain of the transistor 102, and the other of the source and the drain of the transistor 304 is connected to the wiring SL. With such a configuration, data reading from the circuit 21 can be controlled by the conduction state of the transistor 304. In that case, one electrode of the capacitor 103 can be connected to the wiring 301 having a function of transmitting a predetermined potential (fixed potential). The potential of the wiring 301 can be set to, for example, a low power supply potential (e.g., a ground potential). Note that the wiring 305 may be the wiring RWL or a wiring different from the wiring RWL. Furthermore, the one electrode of the capacitor 103 may be connected to the wiring RWL.

Figure 16C:
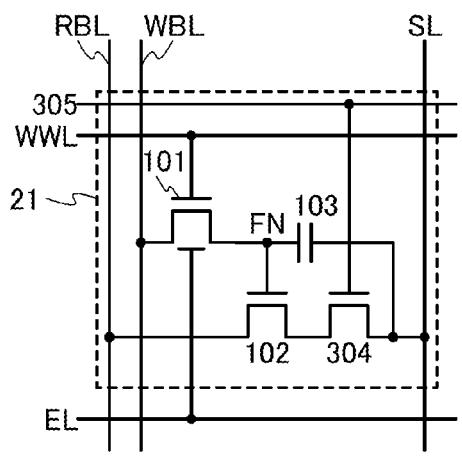

In FIG. 16B, one electrode of the capacitor 103 may be connected to the wiring SL (see FIG. 16C). With such a configuration, the wiring RWL and the wiring 301 can be omitted, and the area of the circuit 20 can be reduced.

Figure 16D:
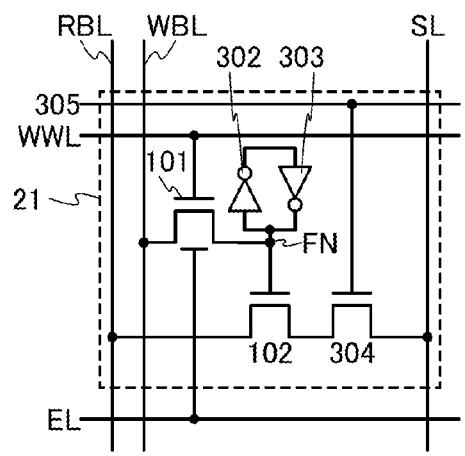

As shown in FIG. 16D, inverters 302 and 303 may be used instead of the capacitor 103. An input terminal of the inverter 302 is connected to the node FN, and an output terminal of the inverter 302 is connected to an input terminal of the inverter 303. An output terminal of the inverter 303 is connected to the node FN. With such a configuration, change in the potential of the node FN caused by change in the potential of another wiring or electrode can be prevented. Without limitation to the example using the inverters 302 and 303 in FIG. 16D, an element having a function of inverting the polarity of an input signal can be substituted for the inverters 302 and 303.

Figure 16E:
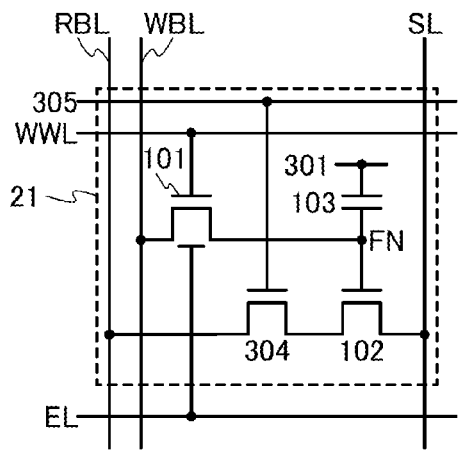

In FIGS. 16B to 16D, the transistor 304 may be provided between the wiring RBL and the transistor 102 (see FIG. 16E). In that case, the gate of the transistor 304 is connected to the wiring 305, one of the source and the drain of the transistor 304 is connected to one of the source and the drain of the transistor 102, and the other of the source and the drain of the transistor 304 is connected to the wiring RBL. Such a configuration can prevent change in the potential of the node FN caused by change in the potential of the wiring RBL. Accordingly, a malfunction of the circuit 21 can be prevented.

In FIGS. 16A to 16E, the transistors 102 and 304 may be p-channel transistors.

The configurations in FIGS. 16A to 16E can be combined freely. Furthermore, the configurations of Modification examples 1 to 4 can be combined freely.

The structure and method described in this embodiment can be implemented by being combined as appropriate with any of the other structures and methods described in the other embodiments.

Embodiment 4

One embodiment of the present invention can also be applied to a display device or the like, in addition to a memory device. In this embodiment, application examples of the embodiments of the present invention described in Embodiments 1 to 3 to a display device are described.

A display device illustrated in FIG. 17A includes a region including pixels of display elements (hereinafter, the region is referred to as a pixel portion 402), a circuit portion being provided outside the pixel portion 402 and including a circuit for driving the pixels (hereinafter, the portion is referred to as a driver circuit portion 404), circuits each having a function of protecting an element (hereinafter, the circuits are referred to as protection circuits 406), and a terminal portion 407. Note that the protection circuits 406 are not necessarily provided.

A part or the whole of the driver circuit portion 404 is preferably formed over a substrate over which the pixel portion 402 is formed, in which case the number of components and the number of terminals can be reduced. When a part or the whole of the driver circuit portion 404 is not formed over the substrate over which the pixel portion 402 is formed, the part or the whole of the driver circuit portion 404 can be mounted by COG or tape automated bonding (TAB).

The pixel portion 402 includes a plurality of circuits for driving display elements arranged in n rows and m columns (hereinafter, such circuits are referred to as pixel circuits 401). The driver circuit portion 404 includes driver circuits such as a circuit for supplying a signal (scan signal) to select a pixel (hereinafter, the circuit is referred to as a gate driver 404a) and a circuit for supplying a signal (data signal) to drive a display element in a pixel (hereinafter, the circuit is referred to as a source driver 404b).

The gate driver 404a includes a shift register or the like. The gate driver 404a receives a signal for driving the shift register through the terminal portion 407 and outputs a signal. For example, the gate driver 404a receives a start pulse signal, a clock signal, or the like and outputs a pulse signal. The gate driver 404a has a function of controlling the potentials of wirings supplied with scan signals (hereinafter, such wirings are referred to as scan lines GL[1] to GL[n]). Note that a plurality of gate drivers 404a may be provided to control the scan lines GL[1] to GL[n] separately. Alternatively, the gate driver 404a has a function of supplying an initialization signal. Without being limited thereto, the gate driver 404a can supply another signal.

The source driver 404b includes a shift register or the like. The source driver 404b receives a signal (video signal) from which a data signal is derived, as well as a signal for driving the shift register, through the terminal portion 407. The source driver 404b has a function of generating a data signal to be written to the pixel circuits 401 which is based on the video signal. In addition, the source driver 404b has a function of controlling output of a data signal in response to a pulse signal produced by input of a start pulse signal, a clock signal, or the like. Furthermore, the source driver 404b has a function of controlling the potentials of wirings supplied with data signals (hereinafter, such wirings are referred to as signal lines DL[1] to DL[m]). Alternatively, the source driver 404b has a function of supplying an initialization signal. Without being limited thereto, the source driver 404b can supply another signal.

The source driver 404b includes a plurality of analog switches or the like, for example. The source driver 404b can output, as the data signals, signals obtained by time-dividing the video signal by sequentially turning on the plurality of analog switches. The source driver 404b may include a shift register or the like.

A pulse signal and a data signal are input to each of the plurality of pixel circuits 401 through one of the plurality of scan lines GL supplied with scan signals and one of the plurality of signal lines DL supplied with data signals, respectively. Writing and holding of the data signal to and in each of the plurality of pixel circuits 401 are controlled by the gate driver 404a. For example, to the pixel circuit 401 in the i-th row and the j-th column, a pulse signal is input from the gate driver 404a through the scan line GL[i], and a data signal is input from the source driver 404b through the signal line DL[j] in accordance with the potential of the scan line GL[i].

Figure 17A:
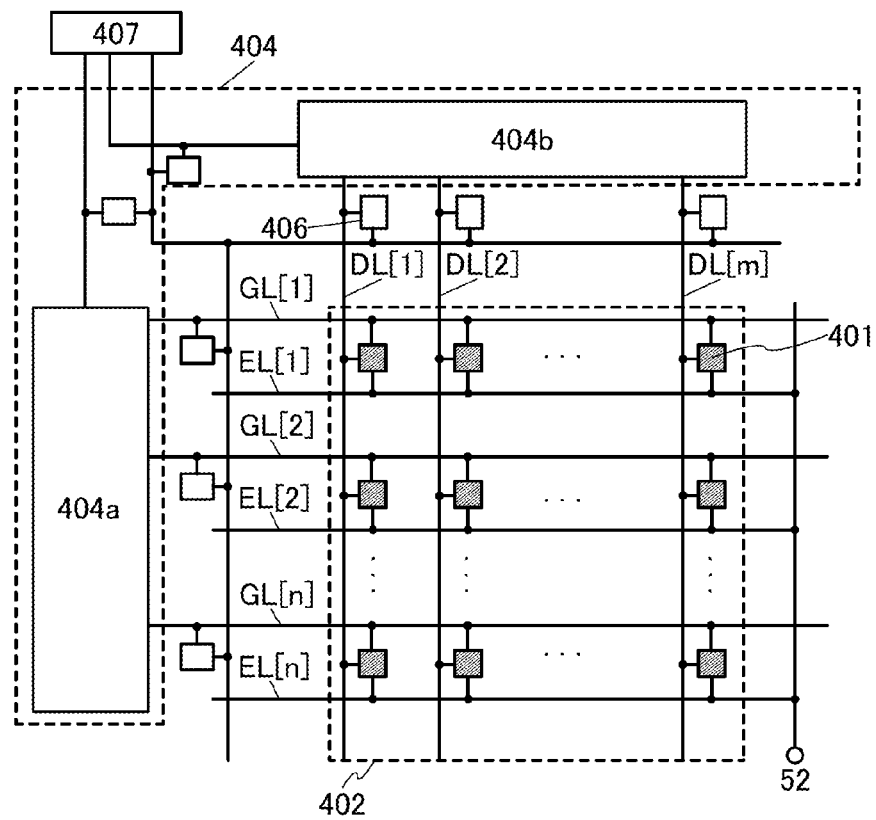
FIGS. 17A to 17C illustrate structure examples of a display device.

The protection circuit 406 shown in FIG. 17A is connected to, for example, the scan line GL between the gate driver 404a and the pixel circuit 401. Alternatively, the protection circuit 406 is connected to the signal line DL between the source driver 404b and the pixel circuit 401. Alternatively, the protection circuit 406 can be connected to a wiring between the gate driver 404a and the terminal portion 407. Alternatively, the protection circuit 406 can be connected to a wiring between the source driver 404b and the terminal portion 407. Note that the terminal portion 407 means a portion having terminals for inputting power, control signals, and video signals to the display device from external circuits.

The protection circuit 406 is a circuit that electrically connects a wiring connected to the protection circuit to another wiring when a potential out of a certain range is applied to the wiring connected to the protection circuit.

As illustrated in FIG. 17A, the protection circuits 406 are provided for the pixel portion 402 and the driver circuit portion 404, so that the resistance of the display device to overcurrent generated by electrostatic discharge (ESD) or the like can be improved. Note that the configuration of the protection circuits 406 is not limited to that, and for example, a configuration in which the protection circuits 406 are connected to the gate driver 404a or a configuration in which the protection circuits 406 are connected to the source driver 404b may be employed. Alternatively, the protection circuits 406 may be configured to be connected to the terminal portion 407.

In FIG. 17A, an example in which the driver circuit portion 404 includes the gate driver 404a and the source driver 404b is shown; however, the structure is not limited thereto. For example, only the gate driver 404a may be formed and a separately prepared substrate where a source driver circuit is formed (e.g., a driver circuit substrate formed with a single crystal semiconductor film or a polycrystalline semiconductor film) may be mounted.

The plurality of pixel circuits 401 are each connected to the wiring EL, and a predetermined potential is supplied from the terminal 52 to the wiring EL. The wiring EL has a function of transmitting a signal for selecting all of the pixel circuits 401 as described in Embodiments 1 to 3.

By supplying a predetermined potential to the wiring EL, all of the pixel circuits 401 are selected, so that data writing can be performed on all of the pixel circuits 401 at one time. Accordingly, operation in which all of the pixel circuits 401 perform black display or white display can be performed for a short time without driving the gate driver 404a. Such white display or black display on the entire screen can be applied to, for example, operation in which the display portion performs white display or black display on the entire screen so that a user is alerted to an abnormality of a display device, operation in which the display portion performs white display on the entire screen to be used as a light, or operation in which the display portion performs black display on the entire screen to be used as a mirror. Consequently, the display device can have new functions.

Figure 17B:
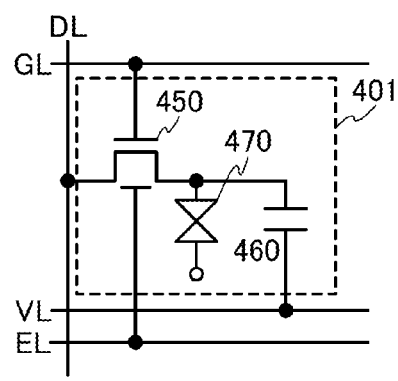

Each of the plurality of pixel circuits 401 in FIG. 17A can have a structure illustrated in FIG. 17B, for example.

The pixel circuit 401 illustrated in FIG. 17B includes the liquid crystal element 470, the transistor 450, and the capacitor 460.

As the transistor 450, any of OS transistors described in Embodiment 5 can be used.

The potential of one of a pair of electrodes of the liquid crystal element 470 is set in accordance with the specifications of the pixel circuit 401 as appropriate. The alignment state of the liquid crystal element 470 depends on written data. A common potential may be supplied to one of the pair of electrodes of the liquid crystal element 470 included in each of the plurality of pixel circuits 401. Furthermore, the potential supplied to one of the pair of electrodes of the liquid crystal element 470 in the pixel circuit 401 in one row may be different from the potential supplied to one of the pair of electrodes of the liquid crystal element 470 in the pixel circuit 401 in another row.

As examples of a driving method of the display device including the liquid crystal element 470, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

A gate of the transistor 450 is connected to the scan line GL, one of a source and a drain of the transistor 450 is connected to the signal line DL, and the other of the source and the drain of the transistor 450 is connected to the other of the pair of electrodes of the liquid crystal element 470. The transistor 450 has a function of controlling whether to write a data signal by being turned on or off.

One electrode of the capacitor 460 is connected to a wiring to which a predetermined potential is supplied (hereinafter referred to as a potential supply line VL), and the other electrode of the capacitor 460 is connected to the other of the pair of electrodes of the liquid crystal element 470. The potential of the potential supply line VL is set in accordance with the specifications of the pixel circuit 401 as appropriate. The capacitor 460 functions as a storage capacitor for storing written data.

For example, in the display device including the pixel circuit 401 in FIG. 17B, the pixel circuits 401 are sequentially selected row by row by the gate driver 404a shown in FIG. 17A, whereby the transistors 450 are turned on and a data signal is written.

When the transistors 450 are turned off, the pixel circuits 401 in which the data has been written are brought into a holding state. This operation is sequentially performed row by row; thus, an image can be displayed.

In each of the pixel circuits 401, the transistor 450 has a back-gate connected to the wiring EL. Accordingly, when a predetermined potential (potential that the voltage Vgs between the back-gate of the transistor 450 and one of the source and the drain of the transistor 450 is higher than the threshold voltage $V_{th}$ of the transistor 450) is supplied to the wiring EL, the transistor 450 can be turned on regardless of the potential of the scan line GL. Thus, data writing can be performed on all of the pixel circuits 401 at one time.

For example, by supplying a data signal for white display or black display to the signal lines DL[1] to DL[m] and then supplying a predetermined potential to the wirings EL, white display or black display on the entire screen can be performed for a short time. Consequently, the display device can have new functions.

Figure 17C:
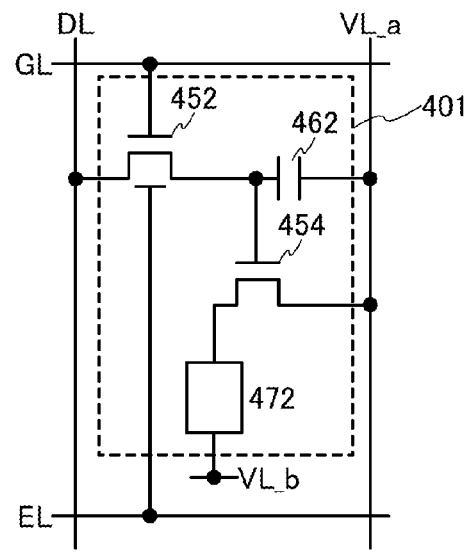

Each of the plurality of pixel circuits 401 in FIG. 17A can have the structure shown in FIG. 17C, for example.

The pixel circuit 401 shown in FIG. 17C includes transistors 452 and 454, a capacitor 462, and a light-emitting element 472. Any of the OS transistors described in Embodiment 5 can be used as one or both of the transistors 452 and 454.

A gate of the transistor 452 is connected to the scan line GL, and one of a source and a drain of the transistor 452 is connected to the signal line DL. The transistor 452 has a function of controlling whether to write a data signal by being turned on or off.

One electrode of the capacitor 462 is connected to a wiring supplied with a predetermined potential (potential supply line VL_a), and the other electrode of the capacitor 462 is connected to the other of the source and the drain of the transistor 452. The capacitor 462 has a function of a storage capacitor for storing written data.

A gate of the transistor 454 is connected to the other of the source and the drain of the transistor 452, and one of a source and a drain of the transistor 454 is connected to the potential supply line VL_a.

One electrode (an anode or a cathode) of the light-emitting element 472 is connected to a wiring supplied with a predetermined potential (potential supply line VL_b), and the other electrode of the light-emitting element 472 is connected to the other of the source and the drain of the transistor 454.

As the light-emitting element 472, an organic electroluminescent element (also referred to as an organic EL element) can be used, for example. Note that the light-emitting element 472 is not limited to an organic EL element; an inorganic EL element containing an inorganic material may be used.

A high power supply potential VDD is supplied to one of the potential supply line VL_a and the potential supply line VL_b, and a low power supply potential VSS is supplied to the other.

For example, in the display device including the pixel circuit 401 in FIG. 17C, the pixel circuits 401 are sequentially selected row by row by the gate driver 404a shown in FIG. 17A, whereby the transistors 452 are turned on and a data signal is written.

When the transistor 452 is turned off, the pixel circuit 401 to which the data has been written is brought into a holding state. Furthermore, the amount of current flowing between the source and the drain of the transistor 454 is controlled in accordance with the potential of the written data signal. The light-emitting element 472 emits light with a luminance corresponding to the amount of flowing current. This operation is sequentially performed row by row; thus, an image can be displayed.

In each of the pixel circuits 401, the transistor 452 has a back-gate connected to the wiring EL. Accordingly, as in FIG. 17B, when a predetermined potential is supplied to the wiring EL, the transistor 450 can be turned on regardless of the potential of the scan line GL. Thus, data writing can be performed on all of the pixel circuits 401 at one time. Consequently, the display device can have new functions.

As described above, one embodiment of the present invention can also be applied to a display device.

The structure and method described in this embodiment can be implemented by being combined as appropriate with any of the other structures and methods described in the other embodiments.

Embodiment 5

In this embodiment, a structure example of an OS transistor that can be used in one embodiment of the present invention will be described.

Structure Example 1

Figure 18A:
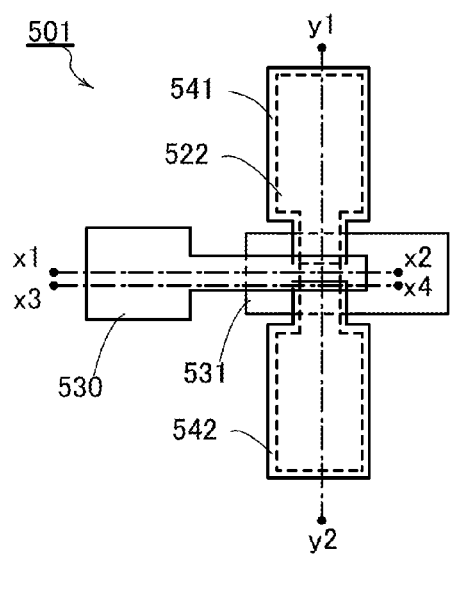
FIGS. 18A to 18D illustrate a structure example of a transistor.
Figure 18B:
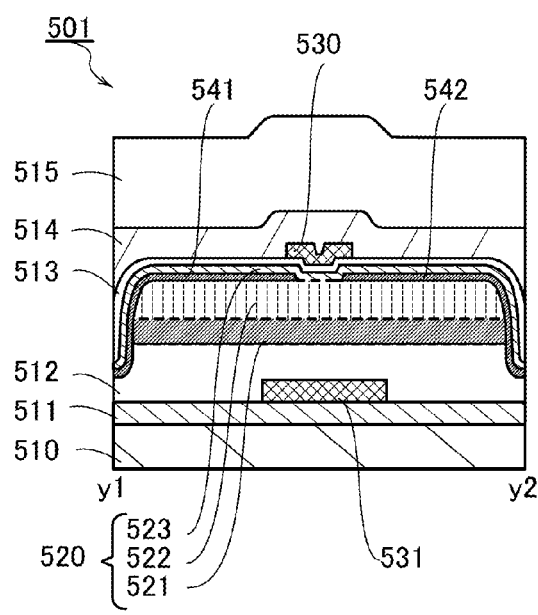
Figure 18C:
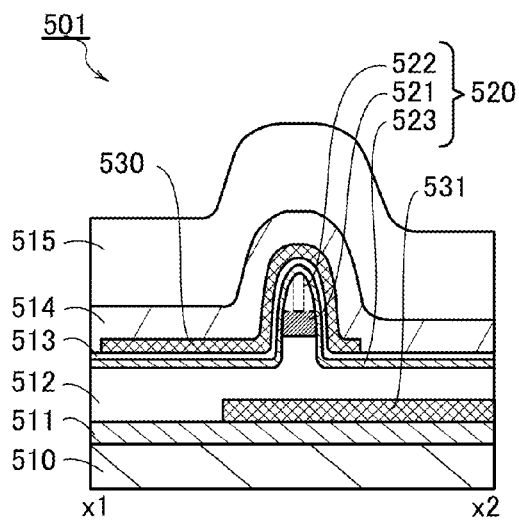
Figure 18D:
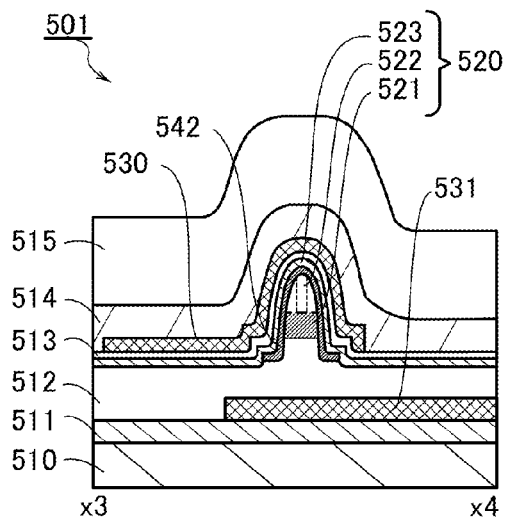

FIGS. 18A to 18D illustrate a structure example of an OS transistor. FIG. 18A is a top view illustrating a structure example of an OS transistor. FIG. 18B is a cross-sectional view taken along a line y1-y2, FIG. 18C is a cross-sectional view taken along a line x1-x2, and FIG. 18D is a cross-sectional view taken along a line x3-x4. Here, in some cases, the direction of the line y1-y2 is referred to as a channel length direction, and the direction of the line x1-x2 is referred to as a channel width direction. Accordingly, FIG. 18B illustrates a cross-sectional structure of the OS transistor in the channel length direction, and FIGS. 18C and 18D each illustrate a cross-sectional structure of the OS transistor in the channel width direction. Note that to clarify the device structure, FIG. 18A does not illustrate some components.

An OS transistor 501 illustrated in FIGS. 18A to 18D includes a back-gate. The OS transistor 501 is formed over an insulating surface, here, over an insulating layer 511. The insulating layer 511 is formed over a surface of a substrate 510. The OS transistor 501 is covered with an insulating layer 514 and an insulating layer 515. Note that the insulating layers 514 and 515 may be regarded as components of the OS transistor 501. The OS transistor 501 includes an insulating layer 512, an insulating layer 513, oxide semiconductor layers 521 to 523, a conductive layer 530, a conductive layer 531, a conductive layer 541, and a conductive layer 542. Here, the oxide semiconductor layers 521, 522, and 523 are collectively referred to as an oxide semiconductor layer 520.

The insulating layer 513 includes a region functioning as a gate insulating layer. The conductive layer 530 functions as a gate electrode (a first gate electrode). The conductive layer 531 functions as a back-gate electrode (a second gate electrode). The conductive layer 531 functions as part of the wiring EL in Embodiments 1 to 4 or as a conductive layer connected to the wiring EL. The conductive layer 541 and the conductive layer 542 function as a source electrode and a drain electrode. The OS transistor including a back-gate can be used as the transistor 101, the transistor 450, the transistor 452, and the like in Embodiments 1 to 4. The transistor 501 without the conductive layer 531 can be used as the transistor 102, the transistor 304, and the like.

As illustrated in FIGS. 18B and 18C, the oxide semiconductor layer 520 includes a region where the oxide semiconductor layer 521, the oxide semiconductor layer 522, and the oxide semiconductor layer 523 are stacked in this order. The insulating layer 513 covers this stacked region. The conductive layer 531 overlaps with the stacked region of the oxide semiconductor layer with the insulating layer 513 provided therebetween. The conductive layer 541 and the conductive layer 542 are provided over the stacked film formed of the oxide semiconductor layer 521 and the oxide semiconductor layer 523 and are in contact with a top surface of this stacked film and a side surface positioned in the channel length direction of the stacked film. In the example of FIGS. 18A to 18D, the conductive layers 541 and 542 are also in contact with the insulating layer 512. The oxide semiconductor layer 523 is formed to cover the oxide semiconductor layers 521 and 522 and the conductive layers 541 and 542. A bottom surface of the oxide semiconductor layer 523 is in contact with a top surface of the oxide semiconductor layer 522.

The conductive layer 530 is formed so as to surround, in the channel width direction, the region where the oxide semiconductor layers 521 to 523 are stacked in the oxide semiconductor layer 520 with the insulating layer 513 positioned therebetween (see FIG. 18C). Therefore, a gate electric field in the vertical direction and a gate electric field in the lateral direction are applied to this stacked region. In the OS transistor 501, "the gate electric field" refers to an electric field generated by a voltage applied to the conductive layer 531 (gate electrode layer). Accordingly, the whole stacked region of the oxide semiconductor layers 521 to 523 can be electrically surrounded by the gate electric fields, so that a channel is formed in the whole oxide semiconductor layer 522 (bulk), in some cases. Thus, high on-state current characteristics of the OS transistor 501 can be achieved.

In this specification, a structure of a transistor in which a semiconductor is electrically surrounded by a gate electric field as in the above transistor is referred to as "a surrounded channel (s-channel) structure". The OS transistor 501 has the s-channel structure. With this s-channel structure, a large amount of current can flow between the source and the drain of the transistor, so that a high drain current in an on state (high on-state current) can be achieved.

By employing the s-channel structure in the OS transistor 501, channel formation region controllability by a gate electric field applied to the side surface of the oxide semiconductor layer 522 becomes easy. In the structure where the conductive layer 530 reaches below the oxide semiconductor layer 522 and faces the side surface of the oxide semiconductor layer 521, higher controllability can be achieved, which is preferable. Consequently, the subthreshold swing (S value) of the OS transistor 501 can be made small, so that a short-channel effect can be reduced. Thus, the s-channel structure is appropriate for miniaturization.

When an OS transistor which has a three-dimensional structure as in the OS transistor 501 illustrated in FIGS. 18A to 18D, the channel length can be less than 100 nm. By the miniaturization, the circuit area of the OS transistor can be made small. The channel length of the OS transistor is preferably less than 65 nm, further preferably less than or equal to 30 nm or less than or equal to 20 nm.

A conductor functioning as a gate of a transistor, a conductor functioning as a source of a transistor, and a conductor functioning as a drain of a transistor are referred to as a gate electrode, a source electrode, and a drain electrode, respectively. A region functioning as a source of a transistor and a region functioning as a drain of a transistor are referred to as a source region and a drain region, respectively. In this specification, a gate electrode might be referred to as a gate, a drain electrode or a drain region might be referred to as a drain, and a source electrode or a source region might be referred to as a source.

The channel length refers to, for example, a distance between a source and a drain in a region where a semiconductor (or a portion where a current flows in a semiconductor when a transistor is on) and a gate overlap each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate overlap with each other, or a region where a channel is formed. In one transistor, channel widths in all regions are not necessarily the same. In other words, the channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In this specification, in the case where the term "channel width" is simply used, it may denote an apparent channel width in some cases. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Structure Example 2

Figure 19A:
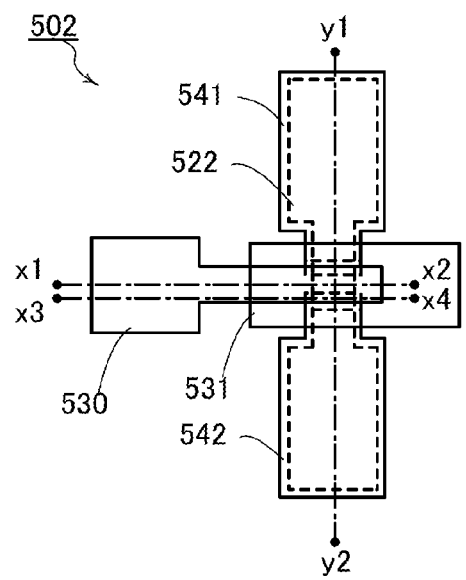
FIGS. 19A to 19D illustrate a structure example of a transistor.
Figure 19B:
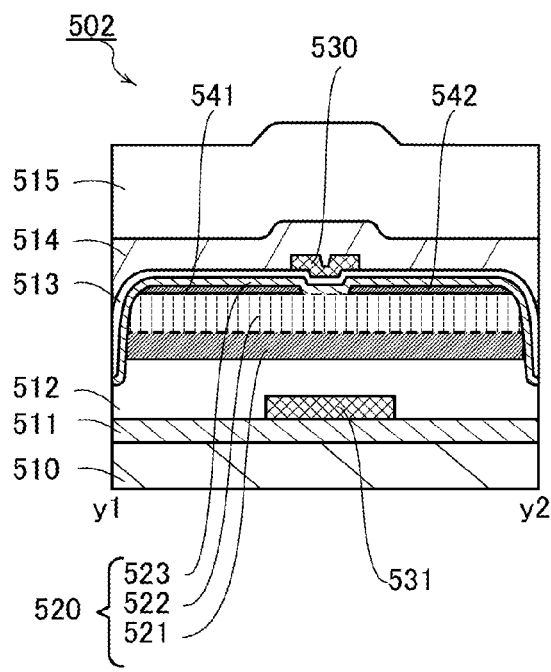
Figure 19C:
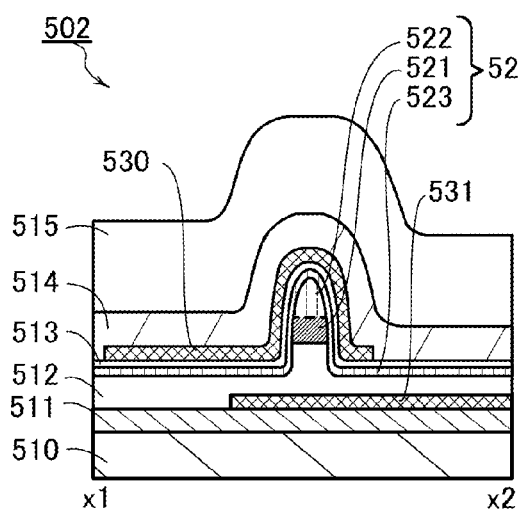
Figure 19D:
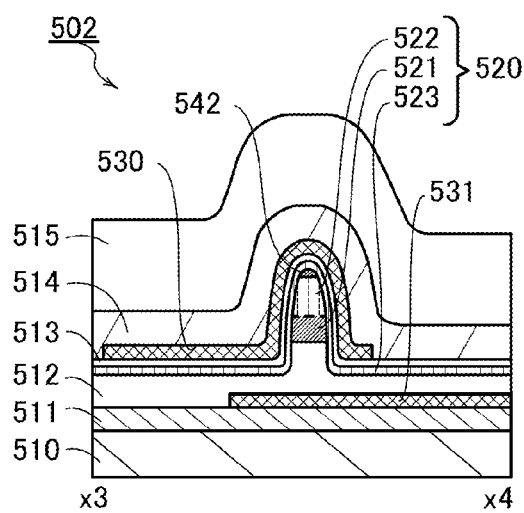
Figure 20A:
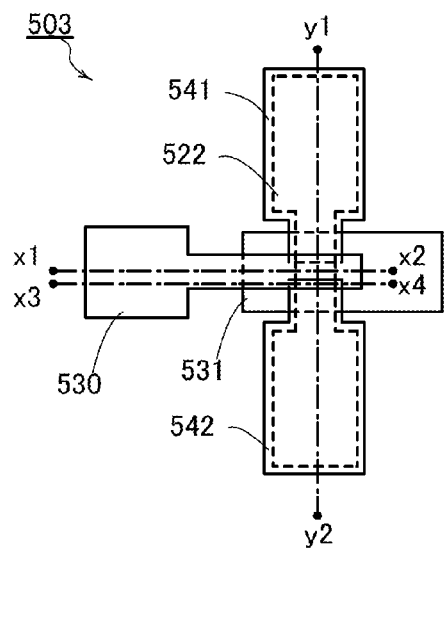
FIGS. 20A to 20D illustrate a structure example of a transistor.
Figure 20B:
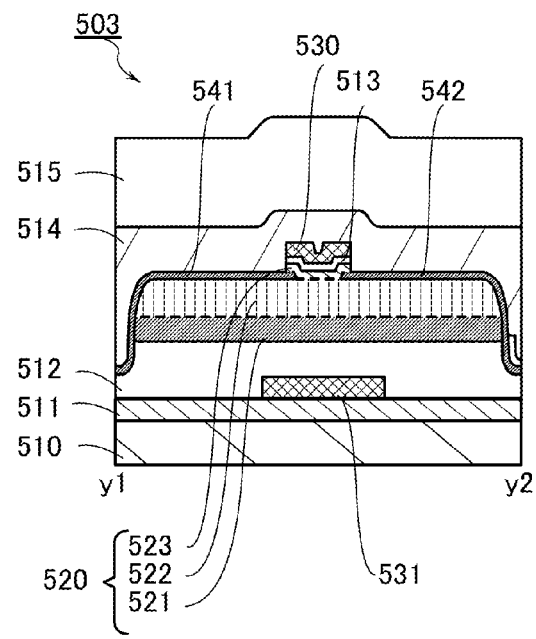
Figure 20C:
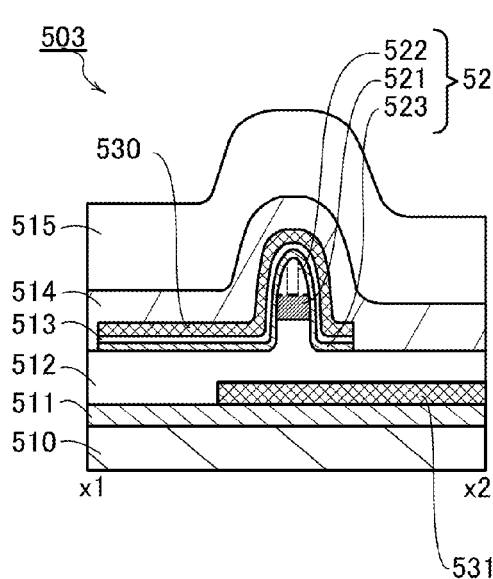
Figure 20D:
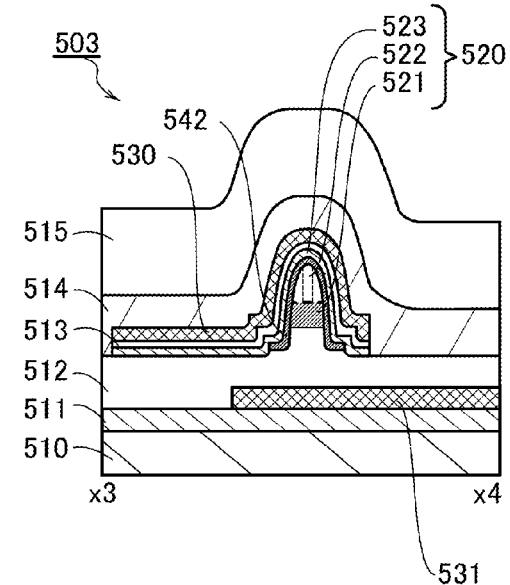
Figure 21A:
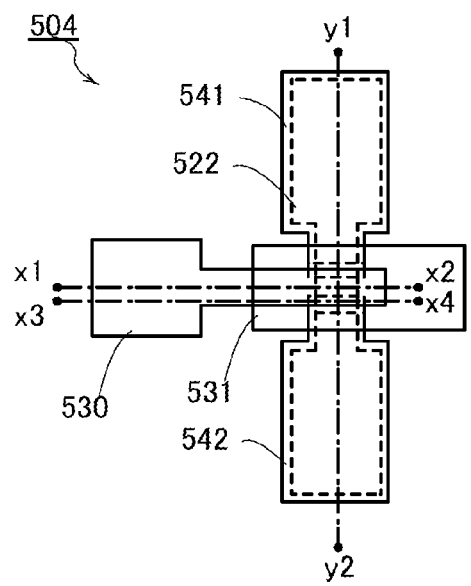
FIGS. 21A to 21D illustrate a structure example of a transistor.
Figure 21B:
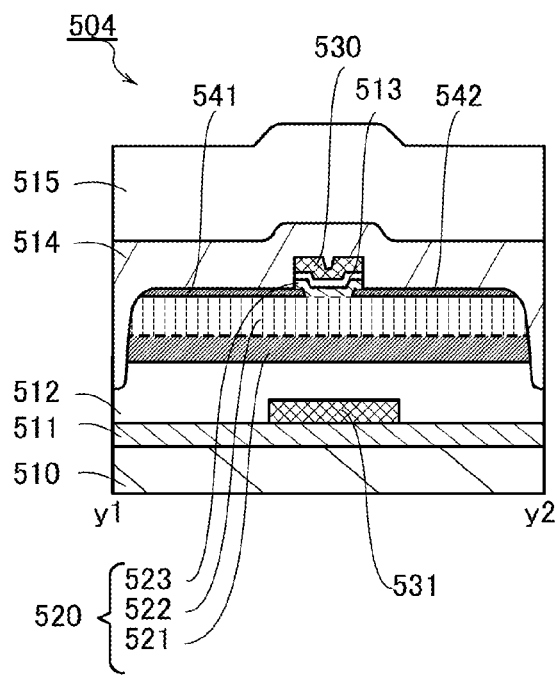
Figure 21C:
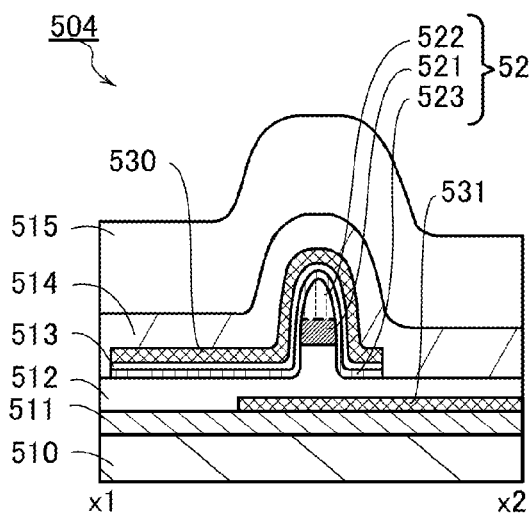
Figure 21D:
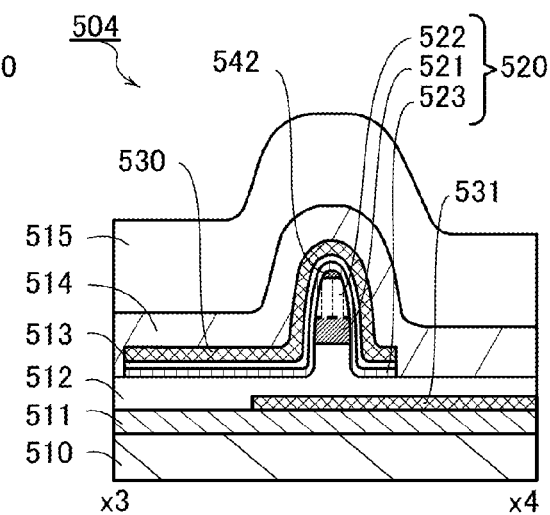
Figure 22A:
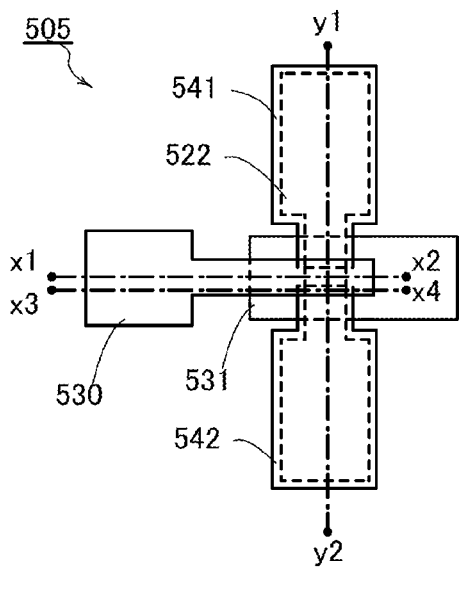
FIGS. 22A to 22D illustrate a structure example of a transistor.
Figure 22B:
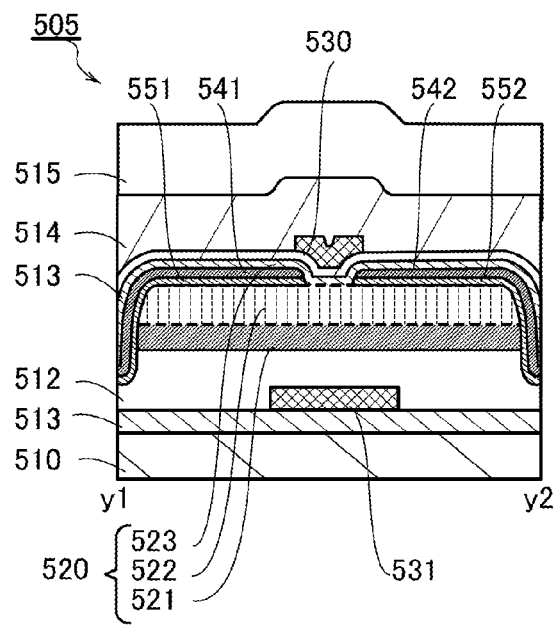
Figure 22C:
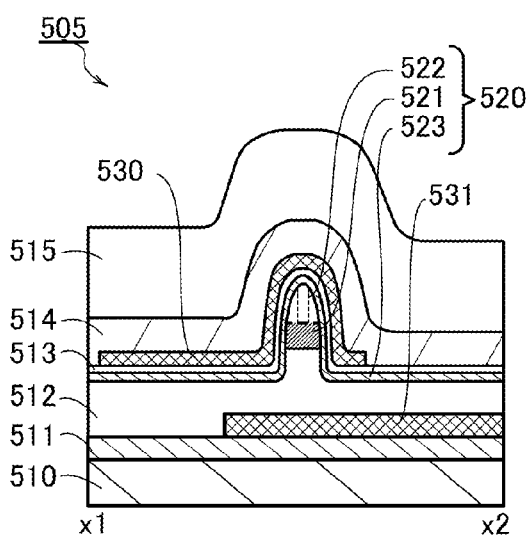
Figure 22D:
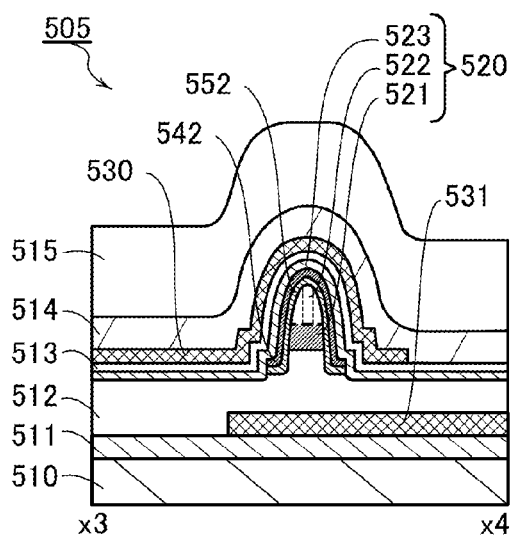
Figure 23A:
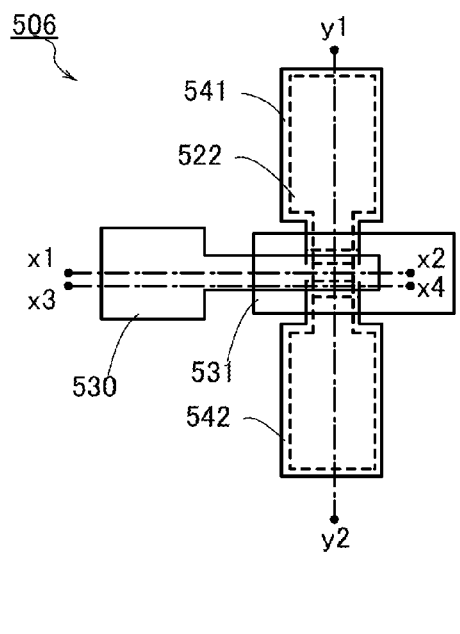
FIGS. 23A to 23D illustrate a structure example of a transistor.
Figure 23B:
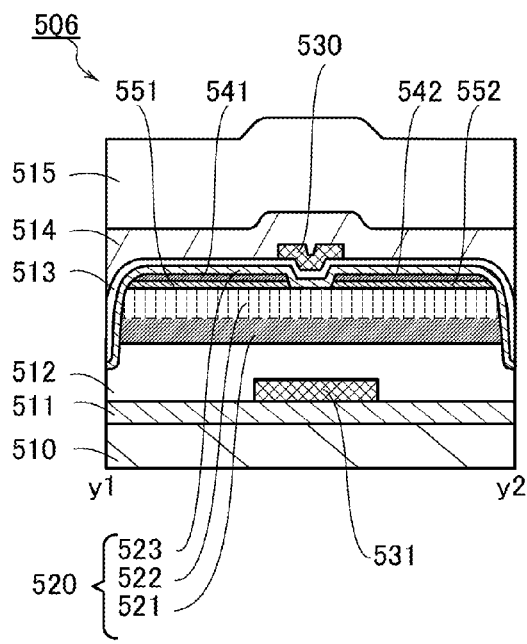
Figure 23C:
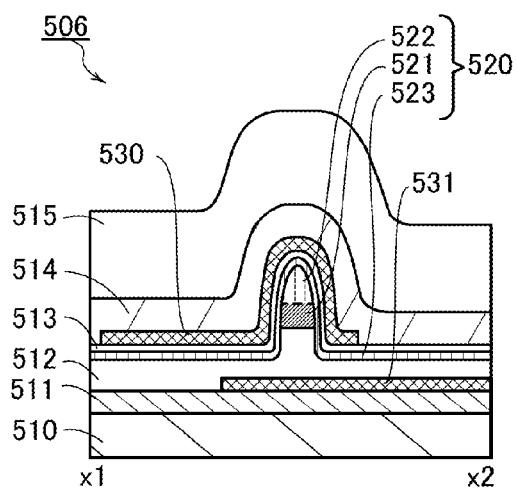
Figure 23D:
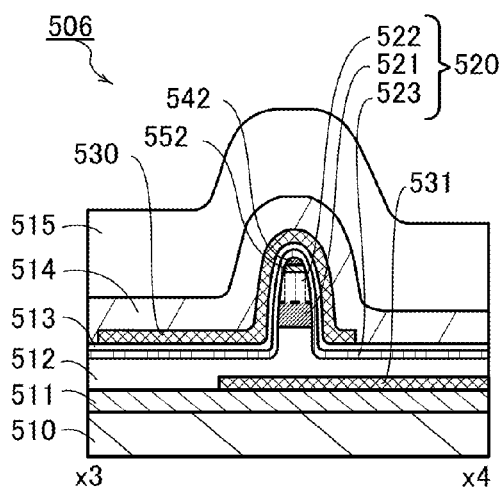

An OS transistor 502 illustrated in FIGS. 19A to 19D is a modification example of the OS transistor 501. FIG. 19A is a top view of the OS transistor 502. FIG. 19B is a cross-sectional view taken along a line y1-y2, FIG. 19C is a cross-sectional view taken along a line x1-x2, and FIG. 19D is a cross-sectional view taken along a line x3-x4. Note that to clarify the device structure, FIG. 19A does not illustrate some components.

Like the OS transistor 501, the OS transistor 502 illustrated in FIGS. 19A to 19D also has the s-channel structure. The OS transistor 502 is different from the OS transistor 501 in the shapes of the conductive layer 541 and the conductive layer 542. The conductive layer 541 and the conductive layer 542 in the OS transistor 502 are formed from a hard mask used for forming the stacked film of the oxide semiconductor layer 521 and the oxide semiconductor layer 522. Therefore, the conductive layer 541 and the conductive layer 542 are not in contact with the side surfaces of the oxide semiconductor layer 521 and the oxide semiconductor layer 522 (see FIG. 19D).

Through the following steps, the oxide semiconductor layers 521 and 522 and the conductive layers 541 and 542 can be formed. A two-layer oxide semiconductor film including the oxide semiconductor layers 521 and 522 is formed. A single-layer or stacked-layer conductive film is formed over the oxide semiconductor film. This conductive film is etched, so that a hard mask is formed. Using this hard mask, the two-layer oxide semiconductor film is etched to form the oxide semiconductor layers 521 and 522. Then, the hard mask is etched to form the conductive layers 541 and 542.

Structure Examples 3 and 4

An OS transistor 503 illustrated in FIGS. 20A to 20D is a modification example of the OS transistor 501, and an OS transistor 504 illustrated in FIGS. 21A to 21D is a modification example of the OS transistor 502. In each of the OS transistors 503 and 504, the oxide semiconductor layer 523 and the insulating layer 513 are etched using the conductive layer 530 as a mask. Thus, an edge of the oxide semiconductor layer 523 and an edge of the insulating layer 513 are substantially aligned with an edge of the conductive layer 530.

Structure Examples 5 and 6

An OS transistor 505 illustrated in FIGS. 22A to 22D is a modification example of the OS transistor 501, and an OS transistor 506 illustrated in FIGS. 23A to 23D is a modification example of the OS transistor 502. The OS transistors 505 and 506 each include a layer 551 between the oxide semiconductor layer 523 and the conductive layer 541 and a layer 552 between the oxide semiconductor layer 523 and the conductive layer 542.

The layers 551 and 552 can each be formed using a layer of a transparent conductor, an oxide semiconductor, a nitride semiconductor, or an oxynitride semiconductor, for example. The layers 551 and 552 can each be formed using an n-type oxide semiconductor layer or a conductive layer which has a higher resistance than the conductive layers 541 and 542. The layers 551 and 552 may be formed using, for example, a layer containing indium, tin, and oxygen, a layer containing indium and zinc, a layer containing indium, tungsten, and zinc, a layer containing tin and zinc, a layer containing zinc and gallium, a layer containing zinc and aluminum, a layer containing zinc and fluorine, a layer containing zinc and boron, a layer containing tin and antimony, a layer containing tin and fluorine, a layer containing titanium and niobium, or the like. Any of these layers may contain one or more of hydrogen, carbon, nitrogen, silicon, germanium, and argon.

The layers 551 and 552 may have a property of transmitting visible light. Alternatively, the layers 551 and 552 may have a property of not transmitting visible light, ultraviolet light, infrared light, or X-rays by reflecting or absorbing it. In some cases, such a property can suppress a change in electrical characteristics of the transistor due to stray light.

As each of the layers 551 and 552, a layer which does not form a Schottky barrier with the oxide semiconductor layer 523 is preferably used. Thus, on-state characteristics of the OS transistors 505 and 506 can be improved.

The layers 551 and 552 are each preferably a layer that has a higher resistance than conductors 516a and 516b. The layers 551 and 552 each preferably have resistance lower than the channel resistance of the transistor. For example, the layers 551 and 552 may have a resistivity higher than or equal to 0.1 Ωcm and lower than or equal to 100 Ωcm, higher than or equal to 0.5 Ωcm and lower than or equal to 50 Ωcm, or higher than or equal to 1 Ωcm and lower than or equal to 10 Ωcm. The layers 551 and 552 having a resistivity within the above range can reduce electric field concentration in a boundary portion between the channel and the drain. Therefore, a change in electrical characteristics of the transistor can be suppressed. In addition, a punch-through current generated by an electric field from the drain can be reduced. Thus, a transistor with a small channel length can have favorable saturation characteristics. Note that in a circuit configuration where the source and the drain do not interchange, only one of the layers 551 and 552 (e.g., the layer on the drain side) may preferably be provided.

The components of the OS transistors 501 to 506 are described below.

<Oxide Semiconductor Layer>

As the semiconductor material of the oxide semiconductor layers 521 to 523, typically, an In—Ga oxide, an In—Zn oxide, or an In-M-Zn oxide (M is Ga, Y, Zr, La, Ce, or Nd) is used. In addition, the oxide semiconductor layers 521 to 523 are not limited to the oxide semiconductor layers containing indium. The oxide semiconductor layers 521 to 523 can be a Zn—Sn oxide layer, a Ga—Sn oxide layer, a Zn—Mg oxide layer, for example. The oxide semiconductor layer 522 is preferably formed using an In-M-Zn oxide. Each of the oxide semiconductor layers 521 and 523 is preferably formed using a Ga oxide.

A case where the oxide semiconductor layers 521 to 523 are formed using In-M-Zn oxide films formed by a sputtering method is described. The atomic ratio of metal elements of a target for the deposition of an In-M-Zn oxide that is used for forming the oxide semiconductor layer 522 is In:M:Zn=$x_1$:$y_1$:$z_1$. The atomic ratio of metal elements of a target that is used for forming the oxide semiconductor layer 521 and the oxide semiconductor layer 523 is In:M:Zn=$x_2$:$y_2$:$z_2$.

For forming the oxide semiconductor layer 522, a polycrystalline target of an In-M-Zn oxide in which $x_1/y_1$ is greater than or equal to 1/3 and less than or equal to 6, or greater than or equal to 1 and less than or equal to 6, and $z_1/y_1$ is greater than or equal to 1/3 and less than or equal to 6, or greater than or equal to 1 and less than or equal to 6 is preferably used. Note that when $z_1/y_1$ is greater than or equal to 1 and less than or equal to 6, a c-axis aligned crystalline oxide semiconductor (CAAC-OS) film is easily formed. Typical examples of the atomic ratio of the metal elements in the target include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, and In:M:Zn=4:2:4.1. Note that the CAAC-OS is an oxide semiconductor including a c-axis aligned crystal part, and is described later. It is preferable that the CAAC-OS film have no spinel crystal structure in particular. Thus, the reliability and electrical characteristics of the transistor including the CAAC-OS film can be improved.

In the target used for forming the oxide semiconductor layers 521 and 523, $x_2/y_2$ is preferably less than $x_1/y_1$, and $z_2/y_2$ is preferably greater than or equal to 1/3 and less than or equal to 6, further preferably greater than or equal to 1 and less than or equal to 6. Note that when $z_2/y_2$ is greater than or equal to 1 and less than or equal to 6, a CAAC-OS film is easily formed. Typical examples of the atomic ratio of the metal elements in the target include In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

In the In-M-Zn oxide film, the proportions of atoms in the atomic ratio vary within a range of ±40% as an error. For example, the atomic ratio of metal elements contained in an oxide semiconductor film deposited using an oxide target of In:M:Zn=4:2:4.1 is approximately In:M:Zn=4:2:3.

[Energy Band]

Figure 24A:
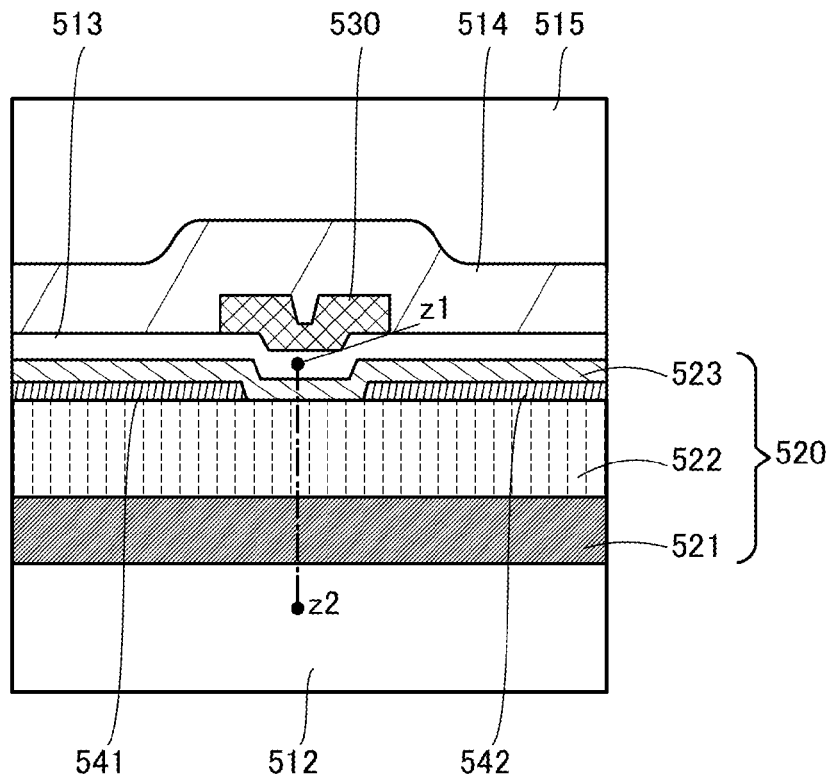
FIGS. 24A and 24B illustrate an energy band of a transistor.
Figure 24B:
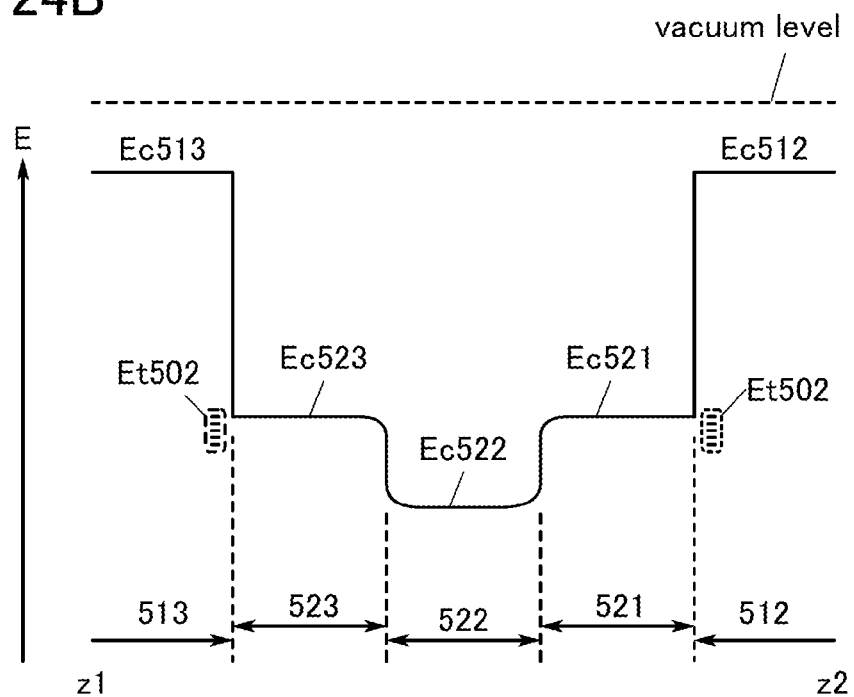

Next, a function and an effect of the oxide semiconductor layer 520 in which the oxide semiconductor layers 521, 522, and 523 are stacked are described using an energy band diagram in FIG. 24B. FIG. 24A is an enlarged view of a channel region of the OS transistor 502 illustrated in FIG. 19B. FIG. 24B shows an energy band diagram of a portion taken along a dotted line z1-z2 (the channel formation region of the OS transistor 502) in FIG. 24A. The OS transistor 502 is described below as an example, but the same can apply to the OS transistor 501 and the OS transistors 503 to 506.

In FIG. 24B, Ec512, Ec521, Ec522, Ec523, and Ec513 indicate the energy of the conduction band minimum of the insulating layer 512, the oxide semiconductor layer 521, the oxide semiconductor layer 522, the oxide semiconductor layer 523, and the insulating layer 513, respectively.

Here, a difference in energy between the vacuum level and the conduction band minimum (the difference is also referred to as "electron affinity") corresponds to a value obtained by subtracting an energy gap from a difference in energy between the vacuum level and the valence band maximum (the difference is also referred to as an ionization potential). Note that the energy gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectroscopy (UPS) device (VersaProbe manufactured by ULVAC-PHI, Inc.).

Note that an In—Ga—Zn oxide which is formed using a sputtering target having an atomic ratio of In:Ga:Zn=1:3:2 has an energy gap of approximately 3.5 eV and an electron affinity of approximately 4.5 eV. An In—Ga—Zn oxide which is formed using a sputtering target having an atomic ratio of In:Ga:Zn=1:3:4 has an energy gap of approximately 3.4 eV and an electron affinity of approximately 4.5 eV. An In—Ga—Zn oxide which is formed using a sputtering target having an atomic ratio of In:Ga:Zn=1:3:6 has an energy gap of approximately 3.3 eV and an electron affinity of approximately 4.5 eV. An In—Ga—Zn oxide which is formed using a sputtering target having an atomic ratio of In:Ga:Zn=1:6:2 has an energy gap of approximately 3.9 eV and an electron affinity of approximately 4.3 eV. An In—Ga—Zn oxide which is formed using a sputtering target having an atomic ratio of In:Ga:Zn=1:6:8 has an energy gap of approximately 3.5 eV and an electron affinity of approximately 4.4 eV. An In—Ga—Zn oxide which is formed using a sputtering target having an atomic ratio of In:Ga:Zn=1:6:10 has an energy gap of approximately 3.5 eV and an electron affinity of approximately 4.5 eV. An In—Ga—Zn oxide which is formed using a sputtering target having an atomic ratio of In:Ga:Zn=1:1:1 has an energy gap of approximately 3.2 eV and an electron affinity of approximately 4.7 eV. An In—Ga—Zn oxide which is formed using a sputtering target having an atomic ratio of In:Ga:Zn=3:1:2 has an energy gap of approximately 2.8 eV and an electron affinity of approximately 5.0 eV.

Since the insulating layer 512 and the insulating layer 513 are insulators, Ec512 and Ec513 are closer to the vacuum level than Ec521, Ec522, and Ec523 (i.e., the insulating layer 512 and the insulating layer 513 have a smaller electron affinity than the oxide semiconductor layers 521, 522, and 523).

Ec521 is closer to the vacuum level than Ec522. Specifically, Ec521 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Ec523 is closer to the vacuum level than Ec522. Specifically, Ec523 is preferably located closer to the vacuum level than Ec522 by 0.05 eV or more, 0.07 eV or more, 0.1 eV or more, or 0.15 eV or more and 2 eV or less, 1 eV or less, 0.5 eV or less, or 0.4 eV or less.

Mixed regions are formed in the vicinity of the interface between the oxide semiconductor layer 521 and the oxide semiconductor layer 522 and the interface between the oxide semiconductor layer 522 and the oxide semiconductor layer 523; thus, the energy at the conduction band minimum changes continuously. In other words, no state or few states exist at these interfaces.

Accordingly, electrons transfer mainly through the oxide semiconductor layer 522 in the stacked-layer structure having the above energy band structure. Therefore, even if an interface state exists at the interface between the oxide semiconductor layer 521 and the insulating layer 512 or the interface between the oxide semiconductor layer 523 and the insulating layer 513, the interface state hardly influences the transfer of electrons. In addition, since no interface state or few interface states exist at the interface between the oxide semiconductor layer 521 and the oxide semiconductor layer 522 and the interface between the oxide semiconductor layer 523 and the oxide semiconductor layer 522, the transfer of electrons is not interrupted in the region. Consequently, the OS transistor 502 including the above stacked oxide semiconductors can have high field-effect mobility.

Although trap states Et502 due to impurities or defects might be formed in the vicinity of the interface between the oxide semiconductor layer 521 and the insulating layer 512 and the interface between the oxide semiconductor layer 523 and the insulating layer 513 as illustrated in FIG. 24B, the oxide semiconductor layer 522 can be separated from the trap states owing to the existence of the oxide semiconductor layers 521 and 523.

In the OS transistor 502, in the channel width direction, the top surface and side surfaces of the oxide semiconductor layer 522 are in contact with the oxide semiconductor layer 523, and the bottom surface of the oxide semiconductor layer 522 is in contact with the oxide semiconductor layer 521 (see FIG. 19C). Surrounding the oxide semiconductor layer 522 by the oxide semiconductor layers 521 and 523 in this manner can further reduce the influence of the trap states.

However, when the energy difference between Ec522 and Ec521 or Ec523 is small, an electron in the oxide semiconductor layer 522 might reach the trap state by passing over the energy difference. Since the electron is trapped at the trap state, a negative fixed charge is generated at the interface with the insulating film, causing the threshold voltage of the transistor to be shifted in the positive direction.

Therefore, each of the energy gaps between Ec521 and Ec522 and between Ec522 and Ec523 is preferably 0.1 eV or more, or further preferably 0.15 eV or more, in which case a change in the threshold voltage of the transistor can be reduced and the transistor can have favorable electrical characteristics.

The band gap of each of the oxide semiconductor layers 521 and 523 is preferably wider than that of the oxide semiconductor layer 522.

For the oxide semiconductor layers 521 and 523, a material containing Ga Y, Zr, La, Ce, or Nd with a higher atomic ratio than that used for the oxide semiconductor layer 522 can be used, for example. Specifically, any of the above metal elements with an atomic ratio 1.5 times or more, preferably 2 times or more, or further preferably 3 times or more as high as the metal element in the oxide semiconductor layer 522 is contained. Any of the above metal elements is strongly bonded to oxygen and thus has a function of suppressing generation of an oxygen vacancy in the oxide semiconductor. That is, an oxygen vacancy is less likely to be generated in the oxide semiconductor layers 521 and the 523 than in the oxide semiconductor layer 522.

When the oxide semiconductor layers 521, 522, and 523 are In-M-Zn oxides containing at least indium, zinc, and M (M is Ga, Y, Zr, La, Ce, or Nd) and the atomic ratio of In to M and Zn of the oxide semiconductor layer 521 is $x_1:y_1:z_1$, that of the oxide semiconductor layer 522 is $x_2:y_2:z_2$, and that of the oxide semiconductor layer 523 is $x_3:y_3:z_3$, $y_1/x_1$ and $y_3/x_3$ are preferably larger than $y_2/x_2$. Furthermore, $y_1/x_1$ and $y_3/x_3$ are 1.5 times or more as large as $y_2/x_2$, preferably 2 times or more as large as $y_2/x_2$, or further preferably 3 times or more as large as $y_2/x_2$. In this case, the transistor can have stable electrical characteristics when $y_2$ is greater than or equal to $x_2$ in the oxide semiconductor layer 522. However, when $y_2$ is three times or more as large as $x_2$, the field-effect mobility of the transistor is reduced; accordingly, $y_2$ is preferably smaller than 3 times $x_2$.

An In-M-Zn oxide film satisfying the above conditions can be formed using an In-M-Zn oxide target satisfying the above atomic ratio of metal elements.

In the case where Zn and O are not taken into consideration, the proportion of In and the proportion of M in the oxide semiconductor layer 521 and the oxide semiconductor layer 523 are preferably less than 50 atomic % and greater than 50 atomic %, respectively, or further preferably less than 25 atomic % and greater than 75 atomic %, respectively. In the case where Zn and O are not taken into consideration, the proportion of In and the proportion of M in the oxide semiconductor layer 522 are preferably greater than 25 atomic % and less than 75 atomic %, respectively, or further preferably greater than 34 atomic % and less than 66 atomic %, respectively.

Furthermore, at least one of the oxide semiconductor layers 521 and 523 does not necessarily contain indium in some cases. For example, the oxide semiconductor layer 521 and/or the oxide semiconductor layer 523 can be formed using a gallium oxide film.

The thickness of each of the oxide semiconductor layers 521 and 523 is greater than or equal to 3 nm and less than or equal to 100 nm, preferably greater than or equal to 3 nm and less than or equal to 50 nm. The thickness of the oxide semiconductor layer 522 is greater than or equal to 3 nm and less than or equal to 200 nm, preferably greater than or equal to 3 nm and less than or equal to 100 nm, or further preferably greater than or equal to 3 nm and less than or equal to 50 nm. The oxide semiconductor layer 523 is preferably thinner than the oxide semiconductor layers 521 and 522.

Note that in order that an OS transistor in which a channel is formed in an oxide semiconductor have stable electrical characteristics, it is effective to make the oxide semiconductor intrinsic or substantially intrinsic by reducing the concentration of impurities in the oxide semiconductor. The term "substantially intrinsic" refers to the state where an oxide semiconductor has a carrier density lower than $1 \times 10^{17}/cm^3$, preferably lower than $1 \times 10^{15}/cm^3$, further preferably lower than $1 \times 10^{13}/cm^3$.

In the oxide semiconductor, hydrogen, nitrogen, carbon, silicon, and a metal element other than a main component are impurities. For example, hydrogen and nitrogen form donor levels to increase the carrier density, and silicon forms impurity levels in the oxide semiconductor. The impurity level becomes a trap, which might deteriorate the electrical characteristics of the transistor. Therefore, it is preferable to reduce the concentration of the impurities in the oxide semiconductor layers 521, 522, and 523 and at interfaces between the oxide semiconductor layers.

In order to make the oxide semiconductor intrinsic or substantially intrinsic, for example, the concentration of silicon at a certain depth of the oxide semiconductor or in a region of the oxide semiconductor, which is measured by SIMS, is lower than $1 \times 10^{19}$ atoms/cm$^3$, preferably lower than $5 \times 10^{18}$ atoms/cm$^3$, further preferably lower than $1 \times 10^{18}$ atoms/cm$^3$. The concentration of hydrogen at a certain depth of the oxide semiconductor or in a certain region of the oxide semiconductor is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, or still further preferably lower than or equal to $5 \times 10^{18}$ atoms/cm$^3$. The concentration of nitrogen at a certain depth of the oxide semiconductor or in a certain region of the oxide semiconductor is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In addition, in the case where the oxide semiconductor includes a crystal, the crystallinity of the oxide semiconductor might be decreased if silicon or carbon is included at high concentration. In order not to lower the crystallinity of the oxide semiconductor, for example, the concentration of silicon at a certain depth of the oxide semiconductor or in a certain region of the oxide semiconductor is lower than $1 \times 10^{19}$ atoms/cm$^3$, preferably lower than $5 \times 10^{18}$ atoms/cm$^3$, further preferably lower than $1 \times 10^{18}$ atoms/cm$^3$. Furthermore, the concentration of carbon at a certain depth of the oxide semiconductor or in a certain region of the oxide semiconductor is lower than $1 \times 10^{19}$ atoms/cm$^3$, preferably lower than $5 \times 10^{18}$ atoms/cm$^3$, further preferably lower than $1 \times 10^{18}$ atoms/cm$^3$, for example.

A transistor in which a highly purified oxide semiconductor is used for a channel formation region as described above has an extremely low off-state current. In the case where the voltage between a source and a drain is set at approximately 0.1 V, 5 V, or 10 V, for example, the off-state current standardized on the channel width of the transistor can be as low as several yoctoamperes per micrometer to several zeptoamperes per micrometer.

[Off-State Current]

Unless otherwise specified, the off-state current in this specification refers to a drain current of a transistor in the off state (also referred to as non-conduction state and cutoff state). Unless otherwise specified, the off state of an n-channel transistor means that a voltage (Vgs) between its gate and source is lower than the threshold voltage ($V_{th}$), and the off state of a p-channel transistor means that the gate-source voltage Vgs is higher than the threshold voltage $V_{th}$. For example, the off-state current of an n-channel transistor sometimes refers to a drain current that flows when the gate-source voltage Vgs is lower than the threshold voltage $V_{th}$.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage $V_{th}$ is 0.5 V and the drain current is $1 \times 10^{-9}$ A at Vgs of 0.5 V, $1 \times 10^{-13}$ A at Vgs of 0.1 V, $1 \times 10^{-19}$ A at Vgs of −0.5 V, and $1 \times 10^{-22}$ A at Vgs of −0.8 V. The drain current of the transistor is $1 \times 10^{-19}$ A or lower at Vgs of −0.5 V or at Vgs in the range of −0.8 V to −0.5 V; therefore, it can be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the required reliability of a semiconductor device or the like including the transistor is ensured or Vds at which the semiconductor device or the like including the transistor is used. The description "an off-state current of a transistor is lower than or equal to I" may refer to a situation where there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds at which the required reliability of a semiconductor device or the like including the transistor is ensured, or Vds at which in the semiconductor device or the like including the transistor is used.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

<Crystal Structure of Oxide Semiconductor Film>

A structure of an oxide semiconductor film that forms the oxide semiconductor layer 520 is described. In this specification, trigonal and rhombohedral crystal systems are included in a hexagonal crystal system.

An oxide semiconductor film is classified roughly into a single crystal oxide semiconductor film and a non-single-crystal oxide semiconductor film. The non-single-crystal oxide semiconductor film includes any of a CAAC-OS film, a polycrystalline oxide semiconductor film, a microcrystalline oxide semiconductor film, an amorphous oxide semiconductor film, and the like.

<CAAC-OS Film>

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary is not clearly observed. Thus, in the CAAC-OS film, a reduction in electron mobility due to the grain boundary is less likely to occur.

In the high-resolution cross-sectional TEM image of the CAAC-OS film observed in a direction substantially parallel to the sample surface, metal atoms arranged in a layered manner are seen in the crystal parts. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

While in the high-resolution planar TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film including an $InGaZnO_4$ crystal by an out-of-plane method, another peak may appear when 2θ is around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film with a low impurity concentration. The impurity is an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity. Additionally, the impurity contained in the oxide semiconductor film might serve as a carrier trap or a carrier generation source.

The CAAC-OS film is an oxide semiconductor film having a low density of defect states. For example, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus has a low carrier density in some cases. Thus, a transistor including the oxide semiconductor film rarely has a negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. A charge trapped by the carrier traps in the oxide semiconductor film takes a long time to be released. The trapped charge may behave like a fixed charge. Thus, the transistor which includes the oxide semiconductor film having a high impurity concentration and a high density of defect states might have unstable electrical characteristics.

In an OS transistor using the CAAC-OS film, change in electrical characteristics of the transistor due to irradiation with visible light or ultraviolet light is small.

<Microcrystalline Oxide Semiconductor Film>

A microcrystalline oxide semiconductor film has a region in which a crystal part is observed and a region in which a crystal part is not observed clearly in a high-resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high-resolution TEM image of the nc-OS, for example, a grain boundary is not clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is analyzed by an out-of-plane method with an XRD apparatus using an X-ray beam having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter close to or smaller than the size of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

<Amorphous Oxide Semiconductor Film>

The amorphous oxide semiconductor film is an oxide semiconductor film having disordered atomic arrangement and no crystal part. For example, the amorphous oxide semiconductor film does not have a specific state as in quartz.

In a high-resolution TEM image of the amorphous oxide semiconductor film, crystal parts cannot be found. When the amorphous oxide semiconductor film is subjected to structural analysis by an out-of-plane method with an XRD apparatus, a peak which shows a crystal plane does not appear. A halo pattern is observed when the amorphous oxide semiconductor film is subjected to electron diffraction. Furthermore, a spot is not observed and a halo pattern appears when the amorphous oxide semiconductor film is subjected to nanobeam electron diffraction.

An oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In this manner, growth of the crystal part occurs due to the crystallization of the a-like OS film, which is induced by a slight amount of electron beam employed in the TEM observation. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as a d value). The value is calculated to 0.29 nm from crystal structure analysis. Thus, each of the lattice fringes having a distance therebetween of from 0.28 nm to 0.30 nm is regarded as corresponding to the a-b plane of the $InGaZnO_4$ crystal, focusing on the lattice fringes in the high-resolution TEM image.

The film density of the oxide semiconductor film varies depending on the structure in some cases. For example, the structure of an oxide semiconductor film can be estimated by comparing the film density of the oxide semiconductor film with the film density of a single crystal oxide semiconductor film having the same composition as the oxide semiconductor film. For example, the film density of the a-like OS film is higher than or equal to 78.6% and lower than 92.3% of the film density of the single crystal oxide semiconductor film having the same composition. For example, the film density of the nc-OS film and the CAAC-OS film is higher than or equal to 92.3% and lower than 100% of the film density of the single crystal oxide semiconductor film having the same composition. Note that it is difficult to form an oxide semiconductor film having a film density of lower than 78% of the film density of the single crystal oxide semiconductor film having the same composition.

Specific examples of the above description are given. For example, in the case of an oxide semiconductor film having an atomic ratio of In:Ga:Zn=1:1:1, the film density of single crystal $InGaZnO_4$ with a rhombohedral crystal structure is 6.357 g/cm$^3$. Accordingly, in the case of the oxide semiconductor film having an atomic ratio of In:Ga:Zn=1:1:1, the film density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the film density of each of the nc-OS film and the CAAC-OS film is higher than or equal to 5.9 g/cm$^3$ and lower than 6.3 g/cm$^3$.

Note that there is a possibility that an oxide semiconductor film having a certain composition cannot exist in a single crystal structure. In that case, single crystal oxide semiconductor films with different compositions are combined in an adequate ratio to calculate the density equivalent to that of a single crystal oxide semiconductor film with the desired composition. The film density of the single crystal oxide semiconductor film having the desired composition can be calculated using a weighted average according to the combination ratio of the single crystal oxide semiconductor films with different compositions. Note that it is preferable to combine as few kinds of single crystal oxide semiconductor films as possible for film density calculation.

Note that an oxide semiconductor film may be a stacked film including two or more of an amorphous oxide semiconductor film, an a-like OS film, a microcrystalline oxide semiconductor film, and a CAAC-OS film, for example.

<Substrate>

The substrate 510 is not limited to a simple supporting substrate and may be a substrate where a device such as a transistor is formed. In that case, one of the conductive layers 530, 541, and 542 of the OS transistor 501 may be electrically connected to the device.

<Base Insulating Film>

The insulating layer 511 has a function of preventing impurity diffusion from the substrate 510. The insulating layer 512 preferably has a function of supplying oxygen to the oxide semiconductor layer 520. For this reason, the insulating layer 512 is preferably an insulating film containing oxygen, further preferably, an insulating film containing oxygen in which the oxygen content is higher than that in the stoichiometric composition. For example, a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. can be used. When the substrate 510 is a substrate where a device is formed as described above, the insulating layer 511 is preferably subjected to planarization treatment such as chemical mechanical polishing (CMP) treatment so as to have a flat surface.

The insulating layers 511 and 512 can be formed using an insulating material of aluminum oxide, aluminum oxynitride, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, silicon nitride, aluminum nitride oxide, or the like, or a mixed material of these materials. In this specification, oxynitride refers to a material which includes more oxygen than nitrogen, and nitride oxide refers to a material which includes more nitrogen than oxygen.

<Gate Electrode>

The conductive layer 530 is preferably formed using a low-resistance material such as copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), iridium (Ir), strontium (Sr), and platinum (Pt); an alloy mainly containing any of these materials; or a compound mainly containing any of these materials.

The conductive layer 530 may have a single-layer structure or a stacked-layer structure of two or more layers. For example, any of the following structures can be employed: a single-layer structure of an aluminum film containing silicon; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; a single-layer structure of a Cu—Mn alloy film; a two-layer structure in which a Cu film is stacked over a Cu—Mn alloy film; and a three-layer structure in which a Cu—Mn alloy film, a Cu film, and a Cu—Mn alloy film are stacked in this order. A Cu—Mn alloy film is preferably used because of its low electrical resistance and because it forms manganese oxide at the interface with an insulating film containing oxygen and manganese oxide can prevent Cu diffusion.

The conductive layer 530 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

When a transistor T includes a pair of gates that sandwiches a semiconductor film as in the transistors 501 to 506, one of the gates may be supplied with a signal A and the other of the gates may be supplied with a fixed potential Vb.

The signal A is, for example, a signal for controlling the on/off state. The signal A may be a digital signal with two kinds of potentials, $V_1$ and $V_2$ ($V_1 > V_2$). For example, the potential $V_1$ may be a high power supply potential and the potential $V_2$ may be a low power supply potential. The signal A may be an analog signal.

The fixed potential Vb is, for example, a potential for controlling a threshold voltage $V_{thA}$ of the transistor T. The fixed potential Vb may be the potential $V_1$ or the potential $V_2$. In that case, a potential generator circuit for generating the fixed potential Vb does not need to be provided additionally. The fixed potential Vb may be different from the potential $V_1$ or the potential $V_2$. When the fixed potential Vb is low, the threshold voltage $V_{thA}$ can be increased in some cases. As a result, a drain current of when a voltage Vgs between the gate and a source is 0 V can be reduced and a leakage current of the circuit including the transistor T can be reduced in some cases. The fixed potential Vb may be, for example, lower than the low power source potential. When the fixed potential Vb is high, the threshold voltage $V_{thA}$ may be decreased in some cases. As a result, a drain current of when the voltage Vgs between the gate and the source is VDD can be increased and operation speed of the circuit including the transistor T can be increased in some cases. The fixed potential Vb may be, for example, higher than the low power source potential.

The signal A may be applied to one gate and a signal B may be applied to the other gate of the transistor T. The signal B is, for example, a signal for controlling the on/off state of the transistor T. The signal B may be a digital signal with two kinds of potentials, $V_3$ and $V_4$ ($V_3 > V_4$). For example, the potential $V_3$ may be the high power supply potential and the potential $V_4$ may be the low power supply potential. The signal B may be an analog signal.

When both the signal A and the signal B are digital signals, the signal B may have the same digital value as the signal A. In that case, an on-state current of the transistor T may be increased and operation speed of the circuit including the transistor T may be increased in some cases. Here, the potential $V_1$ of the signal A may be different from the potential $V_3$ of the signal B. Furthermore, the potential $V_2$ of the signal A may be different from the potential $V_4$ of the signal B. For example, if a gate insulating film used with the gate to which the signal B is input is thicker than a gate insulating film used with the gate to which the signal A is input, the potential amplitude of the signal B ($V_3$-$V_4$) can be larger than the potential amplitude of the signal A ($V_1$-$V_2$). In this way, influence of the signal A and that of the signal B on the on/off state of the transistor T can be approximately the same in some cases.

When both the signal A and the signal B are digital signals, the signal B may be a signal with a different digital value from that of the signal A. In that case, the signal A and the signal B can separately control the transistor T, and thus higher performance may be achieved. For example, if the transistor T is an n-channel transistor, the transistor T may be turned on only when the signal A has the potential $V_1$ and the signal B has the potential $V_3$, or may be turned off only when the signal A has the potential $V_2$ and the signal B has the potential $V_4$, in which case the transistor T, a single transistor, may function as a NAND circuit, a NOR circuit, or the like. In addition, the signal B may be a signal for controlling the threshold voltage $V_{thA}$. For example, the potential of the signal B in a period when the circuit including the transistor T operates may be different from the potential of the signal B in a period when the circuit does not operate. The potential of the signal B may vary depending on operation modes of the circuit. In that case, the potential of the signal B is not switched so often as that of the signal A in some cases.

When both the signal A and the signal B are analog signals, the signal B may be an analog signal with the same potential as that of the signal A, an analog signal with a potential that is a constant multiple of the potential of the signal A, an analog signal with a potential that is higher or lower than the potential of the signal A by a constant, or the like. In that case, an on-state current of the transistor T may be increased and operation speed of the circuit including the transistor T may be increased in some cases. The signal B may be an analog signal different from the signal A. In that case, the signal A and the signal B can separately control the transistor T, and thus higher performance may be achieved.

The signal A and the signal B may be a digital signal and an analog signal, respectively. The signal A and the signal B may be an analog signal and a digital signal, respectively.

A fixed potential Va may be applied to one gate and a fixed potential Vb may be applied to the other gate of the transistor T. When both of the gates of the transistor T are supplied with the fixed potentials, the transistor T can serve as an element equivalent to a resistor in some cases. For example, when the transistor T is an n-channel transistor, effective resistance of the transistor can be decreased (increased) by heightening (lowering) the fixed potential Va or the fixed potential Vb in some cases. When both the fixed potential Va and the fixed potential Vb are heightened (lowered), effective resistance lower (higher) than that obtained by the transistor with one gate can be obtained in some cases.

<Gate Insulating Layer>

The insulating layer 513 is formed using an insulating film having a single-layer structure or a stacked-layer structure. The insulating layer 513 can be formed using an insulating film containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 513 may be a stack including any of the above materials. The insulating layer 513 may contain lanthanum (La), nitrogen, zirconium (Zr), or the like as an impurity. The insulating layer 511 can be formed in a manner similar to that of the insulating layer 513. The insulating layer 513 contains oxygen, nitrogen, silicon, hafnium, or the like, for example. Specifically, the insulating layer 513 preferably includes hafnium oxide, and silicon oxide or silicon oxynitride.

Hafnium oxide has a higher dielectric constant than silicon oxide and silicon oxynitride. Therefore, the insulating layer 513 using hafnium oxide can have a larger thickness than the insulating layer 513 using silicon oxide or the like; thus, leakage current due to tunnel current can be low. That is, a transistor with a low off-state current can be provided. Moreover, hafnium oxide with a crystal structure has a higher dielectric constant than hafnium oxide with an amorphous structure. Therefore, it is preferable to use hafnium oxide with a crystal structure in order to provide a transistor with a low off-state current. Examples of the crystal structure include a monoclinic crystal structure and a cubic crystal structure. Note that one embodiment of the present invention is not limited to the above examples.

<Source Electrode, Drain Electrode, Back Gate Electrode>

The conductive layers 541 and 542 and the conductive layer 531 can be formed in a manner similar to that of the conductive layer 530. A Cu—Mn alloy film is preferably used for the conductive layers 541 and 542 because of its low electrical resistance and because it forms manganese oxide at the interface with the oxide semiconductor layer 520 and manganese oxide can prevent Cu diffusion.

<Protective Insulating Film>

The insulating layer 514 preferably has a function of blocking oxygen, hydrogen, water, an alkali metal, an alkaline earth metal, and the like. The provision of the insulating layer 514 can prevent outward diffusion of oxygen from the oxide semiconductor layer 520 and entry of hydrogen, water, or the like into the oxide semiconductor layer 520 from the outside. The insulating layer 514 can be a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating layer 514 because it is highly effective in preventing transmission of both oxygen and impurities such as hydrogen and moisture. Thus, during and after the manufacturing process of the transistor, the aluminum oxide film can suitably function as a protective film that has effects of preventing entry of impurities such as hydrogen and moisture, which cause variations in the electrical characteristics of the transistor, into the oxide semiconductor layer 520, preventing release of oxygen, which is the main component of the oxide semiconductor layer 520, from the oxide semiconductor, and preventing unnecessary release of oxygen from the insulating layer 512. In addition, oxygen contained in the aluminum oxide film can be diffused into the oxide semiconductor.

<Interlayer Insulating Film>

The insulating layer 515 is preferably formed over the insulating layer 514. The insulating layer 515 can be formed using an insulating film with a single-layer structure or a layered structure. The insulating film can be an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

<Deposition Method>

A sputtering method and a plasma-enhanced chemical vapor deposition method are typical examples of a method of forming an insulating film, a conductive film, a semiconductor film, and the like. The insulating film, the conductive film, the semiconductor film, and the like may be formed by another method, for example, a thermal CVD method. A metal organic chemical vapor deposition (MOCVD) method or an atomic layer deposition (ALD) method can be employed as a thermal CVD method, for example.

A thermal CVD method does not generate plasma and thus has an advantage that no defect due to plasma damage is caused. Deposition by a thermal CVD method may be performed in such a manner that the pressure in a chamber is set to an atmospheric pressure or a reduced pressure, and a source gas and an oxidizer are supplied to the chamber at the same time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time as or after the introduction of the first source gas so that the source gases are not mixed, and then a second source gas is introduced. Note that in the case where the first source gas and the inert gas are introduced at the same time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated more than once until desired thickness is obtained, so that a thin film with excellent step coverage can be formed. The thickness of the thin film can be adjusted by the number of repetition times of the sequence of the gas introduction; therefore, an ALD method makes it possible to accurately adjust thickness and thus is suitable for manufacturing a minute FET.

The conductive film and the semiconductor film that are described in the above embodiment can be formed by a thermal CVD method such as a MOCVD method or an ALD method. For example, in the case where an $InGaZnO_X$ ($X>0$) film is formed, trimethylindium, trimethylgallium, and dimethylzinc are used. Note that the chemical formula of trimethylindium is $(CH_3)_3In$. The chemical formula of trimethylgallium is $(CH_3)_3Ga$. The chemical formula of dimethylzinc is $Zn(CH_3)_2$. Without limitation to the above combination, triethylgallium (chemical formula: $(C_2H_5)_3Ga$) can be used instead of trimethylgallium and diethylzinc (chemical formula: $Zn(C_2H_5)_2$) can be used instead of dimethylzinc.

For example, in the case where a tungsten film is formed using a deposition apparatus employing ALD, a $WF_6$ gas and a $B_2H_6$ gas are sequentially introduced more than once to form an initial tungsten film, and then a $WF_6$ gas and an $H_2$ gas are introduced, so that a tungsten film is formed. Note that an $SiH_4$ gas may be used instead of a $B_2H_6$ gas.

For example, in the case where an oxide semiconductor film, for example, an $InGaZnO_X$ ($X>0$) film is formed using a deposition apparatus employing ALD, an $In(CH_3)_3$ gas and an $O_3$ gas are sequentially introduced more than once to form an $InO_2$ layer, a $Ga(CH_3)_3$ gas and an $O_3$ gas are used to form a GaO layer, and then a $Zn(CH_3)_2$ gas and an $O_3$ gas are used to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing these gases. Note that although an $H_2O$ gas that is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

The structure and method described in this embodiment can be implemented by being combined as appropriate with any of the other structures and methods described in the other embodiments.

Embodiment 6

In this embodiment, an example of a semiconductor device having a structure different from that in FIG. 5B is described. Specifically, an example of a structure where the transistor 101 and the transistor 102 are stacked is illustrated in FIG. 25.

FIG. 25 is a cross-sectional view illustrating a structure example of the circuit 21 in Embodiment 1. In FIG. 25, a section A1-A2 shows a cross-sectional structure of the transistor 101 and the transistor 102 in the channel length direction, and a section B1-B2 shows a cross-sectional structure of the transistor 101 in the channel width direction.

In FIG. 25, regions where reference numerals and hatching patterns are not given show regions formed using an insulator. The region can be formed using an insulator containing one or more of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, in these regions, an organic resin such as a polyimide resin, a polyamide resin, an acrylic resin, a siloxane resin, an epoxy resin, or a phenol resin can be used.

<Transistor 101>

The transistor 101 in FIG. 25 is an OS transistor including a back-gate.

The transistor 101 is formed over an insulating layer 603. The transistor 101 includes an oxide semiconductor layer 630 including a channel formation region, a conductive layer 635, a conductive layer 636, a conductive layer 637, a conductive layer 638, and a gate insulating layer 639. The transistor 101 is covered with an insulating layer 604 and an insulating layer 605. The oxide semiconductor layer 630 of the transistor 101 has a three-layer structure of oxide semiconductor layers 631 to 633, which is similar to a three-layer structure of the OS transistor 502 in FIGS. 19A to 19D. The conductive layer 635 has a region functioning as a back-gate electrode of the transistor 101 and the wiring EL. The conductive layer 636 has a region functioning as a gate electrode of the transistor 101 and the wiring WWL. The conductive layers 637 and 638 function as a source electrode and a drain electrode of the transistor 101.

The insulating layer 603 serving as a base insulating layer of the transistor 101 is preferably formed using an insulator having a function of preventing diffusion of hydrogen from a lower layer to the oxide semiconductor layer 630. This has an effect of improving reliability of the Si transistor by terminating dangling bonds of silicon in the Si layer by hydrogen. In contrast, as described above, hydrogen serves as an impurity that reduces reliability of the oxide semiconductor layer in the OS transistor. Thus, the insulating layer 603 confines hydrogen in the lower layer and diffuses hydrogen from the lower layer to an upper layer, so that reliability of both the transistor 101 (OS transistor) and the transistor 102 (Si transistor) can be improved. The insulating layer 603 can be formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ), for example. In particular, an aluminum oxide film is preferably used because the aluminum oxide film has a high shielding (blocking) effect of preventing transmission of both oxygen and impurities such as hydrogen and moisture.

A conductive layer 650 has a region functioning as the wiring WBL and the wiring RBL. That is, the wiring WBL and the wiring RBL are shared as illustrated in FIG. 16A. The conductive layer 650 is electrically connected to the conductive layer 637 of the transistor 101 through the conductive layers 651 to 653. The conductive layer 650 is also electrically connected to an impurity region 611 of the transistor 101 through the conductive layers 651 to 653 and conductive layers 654 to 656.

<Transistor 102>

Here, a planar-type field-effect transistor is used as the transistor 102. The transistor 102 is manufactured using an SOI semiconductor substrate including a single crystal silicon layer. Hereinafter, a transistor including silicon in a channel formation region is also referred to as a Si transistor. A substrate 600 is a substrate (e.g., a single crystal silicon substrate) that supports the single crystal silicon layer. An insulating layer 601 is a buried oxide layer (BOX layer) for insulating the single crystal silicon layer from the substrate 600. Needless to say, a Si transistor such as the transistor 102 can be manufactured using a bulk-type single crystal silicon substrate. The structure of the transistor 102 is not limited to the example of FIG. 25. For example, a 3D transistor formed utilizing a projection portion of a semiconductor substrate (e.g., a fin-type transistor or a Tri-gate type transistor) can be employed.

The transistor 102 includes a Si layer 610, a gate insulating layer 616, and a conductive layer 620. In the Si layer 610, the impurity region 611, an impurity region 612, an impurity region 613, an impurity region 614, and a channel formation region 615 are formed. The impurity regions 611 and 612 function as a source region and a drain region. The impurity regions 613 and 614 function as lightly doped drain (LDD) regions or extension regions. Here, the conductivity type of each of the impurity regions 611 to 614 is a p-type. The impurity region 612 has a region functioning as the wiring SL. The conductive layer 620 has a region functioning as a gate electrode of the transistor 102. Insulating layers 618 and 619 are formed on side surfaces of the conductive layer 620. The impurity regions 611 to 614 can be formed in the Si layer 610 in a self-aligned manner by the formation of the insulating layers 618 and 619. The transistor 102 is covered with an insulating layer 602.

<Capacitor 103>

A region in which a conductor 661 and a conductor 662 overlap each other with a dielectric provided therebetween functions as the capacitor 103. The conductor 661 has a region functioning as the wiring RWL. The conductor 662 is electrically connected to the gate electrode (the conductive layer 620) of the transistor 101 through conductors 663 to 666.

The structure and method described in this embodiment can be implemented by being combined as appropriate with any of the other structures and methods described in the other embodiments.

Embodiment 7

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 26A to 26F illustrate specific examples of these electronic devices.

Figure 26A:
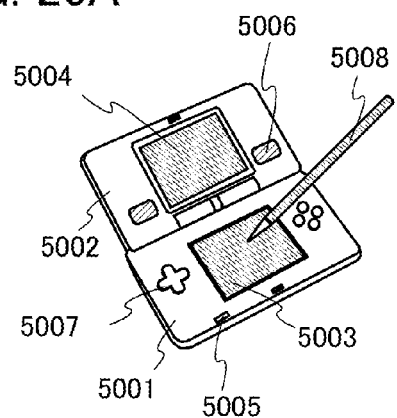
FIGS. 26A to 26F each illustrate an electronic device.

FIG. 26A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 26A has the two display portions 5003 and 5004, the number of display portions included in a portable game machine is not limited to this.

Figure 26B:
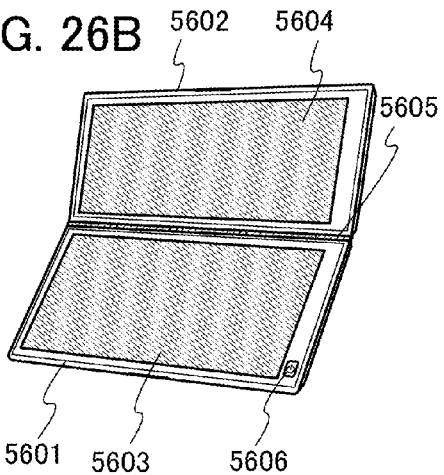

FIG. 26B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 26C:
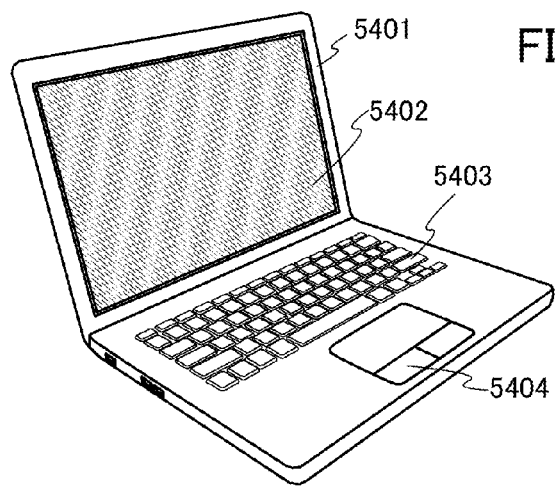

FIG. 26C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 26D:
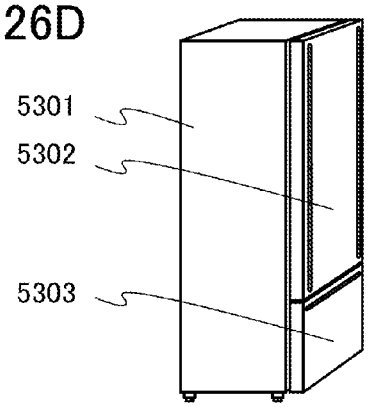

FIG. 26D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 26E:
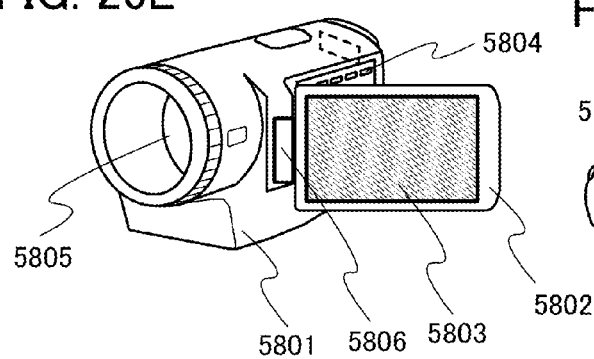

FIG. 26E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 26F:
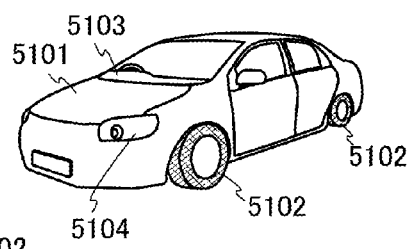

FIG. 26F illustrates a motor vehicle including a car body 5101, wheels 5102, a dashboard 5103, lights 5104, and the like. The semiconductor device of one embodiment of the present invention can be used for a variety of integrated circuits included in motor vehicles.

The structure and method described in this embodiment can be implemented by being combined as appropriate with any of the other structures and methods described in the other embodiments.

EXPLANATION OF REFERENCE

10: semiconductor device, 20: circuit, 21: circuit, 30: circuit, 31: circuit, 40: circuit, 51: terminal, 52: terminal, 101: transistor, 102: transistor, 103: capacitor, 110: connection circuit, 111: transistor, 112: transistor, 113: resistor, 114: transistor, 115: transistor, 116: transistor, 117: transistor, 118: transistor, 119: capacitor, 120: transistor, 121: transistor, 122: transistor, 123: transistor, 124: capacitor, 200: substrate, 201: insulating layer, 210: semiconductor layer, 211: channel formation region, 212a: high-concentration impurity region, 212b: high-concentration impurity region, 213a: low-concentration impurity region, 213b: low-concentration impurity region, 214: insulating layer, 215: conductive layer, 216a: insulating layer, 216b: insulating layer, 220: insulating layer, 221: insulating layer, 230: conductive layer, 231: insulating layer, 240: oxide semiconductor layer, 241: conductive layer, 242: insulating layer, 243: conductive layer, 244: insulating layer, 245: insulating layer, 246: conductive layer, 247: conductive layer, 250: connection portion, 301: wiring, 302: inverter, 303: inverter, 304: transistor, 305: wiring, 401: pixel circuit, 402: pixel portion, 404: driver circuit portion, 404a: gate driver, 404b: source driver, 406: protection circuit, 407: terminal portion, 450: transistor, 452: transistor, 454: transistor, 460: capacitor, 462: capacitor, 470: liquid crystal element, 472: light-emitting element, 501: transistor, 502: transistor, 503: transistor, 504: transistor, 505: transistor, 506: transistor, 510: substrate, 511: insulating layer, 512: insulating layer, 513: insulating layer, 514: insulating layer, 515: insulating layer, 516a: conductor, 516b: conductor, 520: oxide semiconductor layer, 521: oxide semiconductor layer, 522: oxide semiconductor layer, 523: oxide semiconductor layer, 530: conductive layer, 531: conductive layer, 532: oxide semiconductor layer, 541: conductive layer, 542: conductive layer, 551: layer, 552: layer, 600: substrate, 601: insulating layer, 602: insulating layer, 603: insulating layer, 604: insulating layer, 605: insulating layer, 610: Si layer, 611: impurity region, 612: impurity region, 613: impurity region, 614: impurity region, 615: channel formation region, 616: gate insulating layer, 618: insulating layer, 619: insulating layer, 620: conductive layer, 630: oxide semiconductor layer, 631: oxide semiconductor layer, 633: oxide semiconductor layer, 635: conductive layer, 636: conductive layer, 637: conductive layer, 638: conductive layer, 639: gate insulating layer, 650: conductive layer, 651: conductive layer, 653: conductive layer, 656: conductive layer, 661: conductive layer, 662: conductive layer, 663: conductor, 666: conductor, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, and 5806: joint.

This application is based on Japanese Patent Application serial no. 2014-205643 filed with Japan Patent Office on Oct. 6, 2014, the entire contents of which are hereby incorporated by reference.

The invention claimed is:

1. A semiconductor device comprising:
a first circuit;
a second circuit;
a third circuit;
a first wiring;
a second wiring;
a third wiring;
a third transistor;
a fourth transistor;
a fifth transistor; and
a second capacitor,
wherein the first circuit is configured to store a first data,
wherein the second circuit is configured to store a second data,
wherein the third circuit is configured to store a third data, wherein each of the first circuit, the second circuit and the third circuit comprises a first transistor, a second transistor, and a first capacitor, wherein one of a source and a drain of the first transistor is electrically connected to a gate of the second transistor and the first capacitor, wherein the first wiring is electrically connected to the other of the source and the drain of each of the first transistors of the first circuit and the second circuit, wherein the second wiring is electrically connected to a gate of the first transistors of the each of first circuit and third circuit, wherein the first transistor of each of the first circuit, the second circuit and the third circuit includes an oxide semiconductor in a channel formation region, wherein one of a source and a drain of the third transistor is electrically connected to the third wiring, wherein the other of the source and the drain of the third transistor is electrically connected to a fourth wiring, wherein one of a source and a drain of the fourth transistor is electrically connected to the third wiring, wherein the other of the source and the drain of the fourth transistor is electrically connected to a fifth wiring, wherein one of a source and a drain of the fifth transistor is electrically connected to a gate of third transistor and a second capacitor, wherein the other of the source and the drain of the fifth transistor is electrically connected to the fourth wiring, wherein the third wiring is electrically connected to a back-gate of each of the first transistors of the first circuit, the second circuit and the third circuit, and wherein an erase signal is input to the third wiring.

2. The semiconductor device according to claim 1, wherein the first wiring is electrically connected to a terminal, and wherein the first wiring is supplied with a signal for performing a data writing on the first circuit and the second circuit from the terminal.

3. The semiconductor device according to claim 1, wherein a data writing is performed by supplying a potential to the first wiring in a period in which a potential of the other of the source and the drain of the first transistor of each of the first circuit and the second circuit is at a high level or a low level.

4. The semiconductor device according to claim 1, wherein the first wiring and each of gate electrodes of the first transistors overlap each other.

5. An electronic device comprising:
the semiconductor device according to claim 1; and
a display portion, a microphone, a speaker, or an operation key.

6. A semiconductor device comprising:
circuits arranged in a matrix comprising first row, second row, first column and second column; and
a first wiring;
a third transistor;
a fourth transistor;
a fifth transistor; and
a second capacitor, wherein each of the circuits is configured to store a data, wherein each of the circuits comprises a first transistor, a second transistor, and a capacitor, wherein one of a source and a drain of the first transistor is electrically connected to a gate of the second transistor and the capacitor, wherein the first transistor of each of the circuits includes an oxide semiconductor in a channel formation region, wherein one of a source and a drain of the third transistor is electrically connected to the first wiring, wherein the other of the source and the drain of the third transistor is electrically connected to a second wiring, wherein one of a source and a drain of the fourth transistor is electrically connected to the first wiring, wherein the other of the source and the drain of the fourth transistor is electrically connected to a third wiring, wherein one of a source and a drain of the fifth transistor is electrically connected to a gate of third transistor and a second capacitor, wherein the other of the source and the drain of the fifth transistor is electrically connected to the second wiring, wherein the first wiring is electrically connected to a back-gate of each of the first transistors of the circuits, and wherein an erase signal is input to the first wiring.

7. The semiconductor device according to claim 6, wherein the wiring is electrically connected to a terminal, and wherein the wiring is supplied with a signal for erasing the data stored in the circuits from the terminal.

8. The semiconductor device according to claim 6, wherein the data are erased by supplying a potential to the wiring in a period in which a potential of the other of the source and the drain of the first transistor of each of the circuits is at a high level or a low level.

9. The semiconductor device according to claim 6, wherein the first wiring and each of gate electrodes of the first transistors overlap each other.

10. An electronic device comprising:
the semiconductor device according to claim 6; and
a display portion, a microphone, a speaker, or an operation key.

11. The semiconductor device according to claim 1, wherein the first circuit, the second circuit and the third circuit are memory cells of an auxiliary memory device.

12. The semiconductor device according to claim 6, wherein the circuits are memory cells of an auxiliary memory device.

13. The semiconductor device according to claim 1, wherein the first circuit, the second circuit and the third circuit are pixel circuits of a display device.

14. The semiconductor device according to claim 6, wherein the circuits are pixel circuits of a display device.

15. The semiconductor device according to claim 1, further comprising:
a sixth transistor,
wherein one of a source and a drain of the sixth transistor is electrically connected to the gate of third transistor, and
wherein the other of the source and the drain of the sixth transistor is electrically connected to the fifth wiring.

16. The semiconductor device according to claim 6, further comprising:
a sixth transistor,
wherein one of a source and a drain of the sixth transistor is electrically connected to the gate of third transistor, and
wherein the other of the source and the drain of the sixth transistor is electrically connected to the third wiring.

* * * * *